(12) United States Patent
Masuoka et al.

(10) Patent No.: US 8,563,379 B2
(45) Date of Patent: Oct. 22, 2013

(54) SEMICONDUCTOR DEVICE AND PRODUCTION METHOD THEREOF

(71) Applicant: Unisantis Electronics Singapore Pte. Ltd., Singapore (SG)

(72) Inventors: Fujio Masuoka, Tokyo (JP); Shintaro Arai, Tokyo (JP); Hiroki Nakamura, Tokyo (JP); Tomohiko Kudo, Tokyo (JP); R. Ramana Murthy, Singapore (SG); Nansheng Shen, Singapore (SG); Kavitha Devi Buddharaju, Singapore (SG); Navab Singh, Singapore (SG)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 0 days.

(21) Appl. No.: 13/709,839

(22) Filed: Dec. 10, 2012

(65) Prior Publication Data

US 2013/0095625 A1     Apr. 18, 2013

Related U.S. Application Data

(62) Division of application No. 12/858,840, filed on Aug. 18, 2010, now Pat. No. 8,466,512.

(60) Provisional application No. 61/274,733, filed on Aug. 19, 2009.

(30) Foreign Application Priority Data

Aug. 18, 2009 (JP) .................................. 2009-189262

(51) Int. Cl.
*H01L 21/336* (2006.01)

(52) U.S. Cl.
USPC ........... 438/268; 438/595; 438/597; 438/622; 257/E21.413

(58) Field of Classification Search
USPC .................................. 438/268; 257/E21.413
See application file for complete search history.

(56) References Cited

U.S. PATENT DOCUMENTS

| 5,258,635 A | 11/1993 | Nitayama et al. |
| 5,504,359 A | 4/1996 | Rodder |

(Continued)

FOREIGN PATENT DOCUMENTS

| DE | 19746901 A1 | 5/1999 |
| JP | 02-071556 A | 3/1990 |

(Continued)

OTHER PUBLICATIONS

European Search Report for European Application No. 10008582.8, dated Nov. 9, 2010, 7 pages.

(Continued)

*Primary Examiner* — Angel Roman
(74) *Attorney, Agent, or Firm* — Brinks Hofer Gilson & Lione

(57) ABSTRACT

A method for producing a semiconductor device includes preparing a structure having a substrate, a planar semiconductor layer and a columnar semiconductor layer, forming a second drain/source region in the upper part of the columnar semiconductor layer, forming a contact stopper film and a contact interlayer film, and forming a contact layer on the second drain/source region. The step for forming the contact layer includes forming a pattern and etching the contact interlayer film to the contact stopper film using the pattern to form a contact hole for the contact layer and removing the contact stopper film remaining at the bottom of the contact hole by etching. The projection of the bottom surface of the contact hole onto the substrate is within the circumference of the projected profile of the contact stopper film formed on the top and side surface of the columnar semiconductor layer onto the substrate.

7 Claims, 54 Drawing Sheets

(56) References Cited

U.S. PATENT DOCUMENTS

| | | |
|---|---|---|
| 6,638,823 B2 | 10/2003 | Cho et al. |
| 2002/0105089 A1 | 8/2002 | Tanaka |
| 2004/0232480 A1 | 11/2004 | Ohta et al. |
| 2004/0235290 A1 | 11/2004 | Fukuzumi |
| 2005/0142771 A1 | 6/2005 | Kim |
| 2005/0250316 A1 | 11/2005 | Choi et al. |
| 2008/0296677 A1 | 12/2008 | Takaishi |
| 2009/0065856 A1 | 3/2009 | Oyu et al. |
| 2009/0085088 A1 | 4/2009 | Takaishi |

FOREIGN PATENT DOCUMENTS

| | | |
|---|---|---|
| JP | 02-188966 A | 7/1990 |
| JP | 03-145761 A | 6/1991 |
| JP | 2003-179160 A | 6/2003 |
| JP | 2005-197704 A | 7/2005 |
| JP | 2006-294995 A | 10/2006 |
| JP | 2008-141040 A | 6/2008 |
| JP | 2009-182318 | 8/2009 |
| KR | 20050066729 A | 6/2005 |
| WO | WO 2009/066997 A2 | 5/2009 |
| WO | WO 2009/096464 A1 | 8/2009 |

OTHER PUBLICATIONS

Office Action from Korean Application No. 10-2010-0079574, dated Jul. 28, 2011, 17 pages (with English translation).
Office Action from Chinese Application No. 201010257257.7, dated Oct. 31, 2012, 3 pages.
Office Action for Japanese Patent Application Serial No. 2009-189262 dated Mar. 14, 2013, 3 pages.
Notice of Allowance for U.S. Appl. No. 12/858,840, dated Mar. 14, 2013, 5 pages.

(a)

(b)

(a)

(b)

(a)

(b)

SEMICONDUCTOR DEVICE AND PRODUCTION METHOD THEREOF

CROSS-REFERENCE TO RELATED APPLICATION

This application is a divisional patent application of U.S. Ser. No. 12/858,840, filed Aug. 18, 2010, which claims the benefit of Japanese Patent Application No. 2009-189262 filed on Aug. 18, 2009 and U.S. Provisional Application No. 61/274,733 filed on Aug. 19, 2009, and the entire disclosure of each is incorporated by reference herein.

This application relates generally to a semiconductor device and production method thereof.

BACKGROUND OF THE INVENTION

Semiconductor integrated circuits, particularly integrated circuits using MOS transistors, have increasingly been highly integrated. MOS transistors in integrated circuits have been downsized to nano sizes as the integration level is increased. As MOS transistors become smaller, problems occur such as difficulty in controlling the leak current and difficulty in reducing the area occupied by the circuits while assuring a necessary current quantity. In order to resolve these problems, surrounding gate transistors (SGT) have been proposed in which the source, gate, and drain are provided on a substrate in the vertical direction and the gate surrounds a columnar semiconductor layer (for example, see Unexamined Japanese Patent Application KOKAI Publication No. H2-71556)

In an SGT, a channel region is formed in the side surface of a columnar semiconductor layer to surround the columnar semiconductor layer. Therefore, it is possible to attain a large width of the gate in a small occupied area. In order for an SGT having this structure to operate, it is necessary for a large ON current to flow in a small occupied area. However, because it is difficult to apply a voltage on the source and drain in accordance with the desired current when the source and drain have high resistance, the desired current cannot flow. Therefore, a method of producing an SGT in which the source and drain are designed to have low resistance is necessary. Furthermore, it is also necessary to reduce the resistance of contacts in order for a large ON current to flow in the small occupied area.

In the SGT, the columnar semiconductor layer needs to have a small diameter in order to diminish leak current accompanying downsizing.

When the columnar semiconductor layer has a small diameter, the diameter of the columnar semiconductor layer is smaller than that of the contact layer formed on the columnar semiconductor layer. In this case, if over-etching occurs during forming contact holes by etching in the step of forming a contact layer on the columnar semiconductor layer, short circuits between the contact layer on the columnar semiconductor layer and the gate electrode formed around the columnar semiconductor layer may easily occur.

SUMMARY OF THE INVENTION

The purpose of the present application is to provide a structure of a contact layer preventing short circuits between the contact layer on a columnar semiconductor layer and the gate electrode formed around the columnar semiconductor layer and obtaining low and stable contact resistance, and a production method thereof.

In order to achieve the above purpose, a method for producing a semiconductor device according to a first aspect of the present application comprises:

a step of preparing a structure provided with a substrate, a planar semiconductor layer formed above the substrate and a columnar semiconductor layer formed on the planar semiconductor layer;

a step of forming a first source or drain region in a lower part of the columnar semiconductor layer and in the planar semiconductor layer;

a step of forming a gate insulating film around the columnar semiconductor layer;

a step of forming a gate electrode on the gate insulating film so as to surround the columnar semiconductor layer;

a second drain or source region formation step of forming a second drain or source region in an upper part of the columnar semiconductor layer;

a contact stopper film formation step of forming a contact stopper film on a resultant structure of the second drain or source region formation step;

a step of forming a contact interlayer film on the contact stopper film so as to embed a resultant structure of the contact stopper film formation step; and a contact layer formation step of forming a first contact layer on the second drain or source region, wherein the contact layer formation step comprises: a pattern formation step of forming a first pattern on the contact interlayer film, the first pattern corresponding to a region where the first contact layer is to be formed; a contact hole formation step of etching the contact interlayer film to the contact stopper film using the first pattern so as to form a first contact hole for the first contact layer; and a contact stopper film removal step of removing the contact stopper film remaining at a bottom of the first contact hole by etching, and a projection of a bottom surface of the first contact hole onto the substrate is within a circumference of a projected profile of the contact stopper film onto the substrate, the contact stopper film formed on a top surface and an upper sidewall of the columnar semiconductor layer.

The contact layer formation step further may comprise a second contact layer formation step of forming a second contact layer on the first source or drain region;

the second contact layer formation step comprises: a step of forming a second pattern on the contact interlayer film, the second pattern corresponding to a region where the second contact layer is to be formed; a step of etching the contact interlayer film to the contact stopper film using the second pattern to form a second contact hole for the second contact layer; and a step removing the contact stopper film remaining at a bottom of the second contact hole by etching, the second contact hole is formed so that a side surface of the second contact hole is nearly perpendicular to the substrate, and the first contact hole is formed so that an average inclination of a side surface of the first contact hole is larger than an average inclination of a side surface of the second contact hole.

The contact layer formation step may further comprise a second contact layer formation step of forming a second contact layer on the first source or drain region and a third contact layer formation step of forming a third contact layer on a gate wire extending from the gate electrode, the second contact layer formation step comprises: a step of forming a second pattern on the contact interlayer film, the second pattern corresponding to a region where the second contact layer is to be formed; a step of etching the contact interlayer film to the contact stopper film using the second pattern to form a second contact hole for the second contact layer; and a step of removing the contact stopper film remaining at a bottom of the second contact hole by etching, the third contact layer formation step comprises: a step of forming a third pattern on the contact interlayer film, the third pattern corresponding to a region where the third contact layer is to be formed; a step of etching the contact interlayer film to the contact stopper film using the third pattern to form a third contact hole for the third contact layer; and a step of removing the contact stopper film remaining at a bottom of the third contact hole by etching, the second contact hole is formed so that a side surface of the second contact hole is nearly perpendicular to the substrate, the third contact hole is formed so that a side surface of the third contact hole is nearly perpendicular to the substrate, and the first contact hole is formed so that an average inclination of a side surface of the first contact hole is larger than an average inclination of a side surface of the second contact hole.

The contact layer formation step may further comprise: a second contact layer formation step of forming a second contact layer on the first source or drain region; and a third contact layer formation step of forming a third contact layer on a gate wire extending from the gate electrode, the second contact layer formation step comprises: a step of forming a second pattern on the contact interlayer film, the second pattern corresponding to a region where the second contact layer is to be formed; a step of etching the contact interlayer film to the contact stopper film using the second pattern to form a second contact hole for the second contact layer; and a step of removing the contact stopper film remaining at a bottom of the second contact hole by etching, the third contact layer formation step comprises: a step of forming a third pattern on the contact interlayer film, the third pattern corresponding to a region where the third contact layer is to be formed; a step of etching the contact interlayer film to the contact stopper film using the third pattern to form a third contact hole for the third contact layer; and a step of removing the contact stopper film remaining at a bottom of the third contact hole by etching, the second contact hole is formed so that a side surface of the second contact hole is nearly perpendicular to the substrate, the first contact hole is formed so that an average inclination of a side surface of the first contact hole is larger than an average inclination of a side surface of the second contact hole, and the third contact hole is formed so that an average inclination of a side surface of the third contact hole is larger than an average inclination of a side surface of the second contact hole.

The contact layer formation step may further comprise a second contact layer formation step of forming a second contact layer on the first source or drain region, the second contact layer formation step comprises: a step of applying a second resist on the contact interlayer film and patterning the second resist using lithography to form a second pattern, the second pattern corresponding to a region where the second contact layer is to be 15 formed; and a step of etching the contact interlayer film to the contact stopper film using the second pattern to form a second contact hole for the second contact layer, in the contact layer formation step, a third contact layer is further formed on a gate wire extending from the gate electrode, in the pattern formation step, the first patter is formed so as to correspond to the region where the first contact layer is to be formed and the region where the third contact layer is to be formed by applying a first resist on the contact interlayer film and patterning the first resist using lithography, in the contact hole formation step, the first contact hole and a third contact hole for the third contact layer are formed by etching the contact interlayer film to the contact stopper film using the first pattern, the contact stopper film removal step is performed after the first contact hole, the second contact hole and the third contact hole have been formed, in the contact stopper film removal step, the contact stopper film remaining at bottoms of the first contact hole, the second contact hole and the third contact hole are removed by etching, the second contact hole is formed so that a side surface of the second contact hole is nearly perpendicular to the substrate, the first contact hole is formed so that an average inclination of a side surface of the first contact hole is larger than an average inclination of a side surface of the second contact hole, and the third contact hole is formed so that an average inclination of a side surface of the third contact hole is larger than an average inclination of a side surface of the second contact hole.

The contact layer formation step may further comprise a second and third contact layers formation step of forming a second contact layer on the first source or drain region and forming a third contact layer on a gate wire extending from the gate electrode, the second and third contact layers formation step comprises: a step of applying a second resist on the contact interlayer film and patterning the second resist using lithography to form a second pattern, the second pattern corresponding to a region where the second contact layer is to 15 be formed and a region where the third contact layer is to be formed; and a step of etching the contact interlayer film to the contact stopper film using the second pattern to form a second contact hole for the second contact layer and a third contact hole for the third contact layer, in the pattern formation step, the first patter is formed so as to correspond to the region where the first contact layer is to be formed by applying a first resist on the contact interlayer film and patterning the first resist using lithography, the contact stopper film removal step is performed after the first contact hole, the second contact hole and the third contact hole have been formed, in the contact stopper film removal step, the contact stopper film remaining at bottoms of the first contact hole, the second contact hole and the third contact hole are removed by etching, the second contact hole is formed so that a side surface of the second contact hole is nearly perpendicular to the substrate, the third contact hole is formed so that a side surface of the third contact hole is nearly perpendicular to the substrate, the first contact hole is formed so that an average inclination of a side surface of the first contact hole is larger than an average inclination of a side surface of the second contact hole, and the first contact hole is formed so that the average inclination of the side surface of the first contact hole is larger than an average inclination of a side surface of the third contact hole.

The method may further comprise an oxide film formation step of forming an oxide film in a form of a sidewall on an upper sidewall of the columnar semiconductor layer, wherein in the contact stopper film formation step, the contact stopper film is formed on a resultant structure of the oxide film formation step, and the contact stopper film is a silicon nitride film.

The semiconductor device according to a second aspect of the present application comprises:

a substrate;

a planar semiconductor layer formed on the substrate;

a columnar semiconductor layer formed on the planar semiconductor layer;

a first source or drain region formed at a bottom of the columnar semiconductor layer;

a second drain or source region formed in an upper part of the columnar semiconductor layer;

a gate insulating film formed around the columnar semiconductor layer;

a gate electrode formed on the gate insulating film so as to surround the columnar semiconductor layer;

a first contact layer formed on the second drain or source region;

a second contact layer formed on the first source or drain region; and a third contact layer formed on a gate wire extending from the gate electrode, wherein a side surface of the second contact layer is nearly perpendicular to the substrate, and an average inclination of a side surface of the first contact layer is larger than an average inclination of the side surface of the second contact layer.

The average inclination of the side surface of the third contact layer may be larger than the average inclination of the side surface of the second contact layer.

The side surface of the third contact layer may be nearly perpendicular to the substrate, and the average inclination of the side surface of the first contact layer may be larger than the average inclination of the side surface of the third contact layer.

The semiconductor device according to a third aspect of the present application comprises:

a substrate;

a columnar semiconductor layer formed above the substrate;

a first source or drain region formed at a bottom of the columnar semiconductor layer;

a second drain or source region formed in an upper part of the columnar semiconductor layer;

a gate insulating film formed around the columnar semiconductor layer;

a gate electrode formed on the gate insulating film so as to surround the columnar semiconductor layer;

a first contact layer formed on the second drain or source region;

a second contact layer formed on the first source or drain region;

a third contact layer formed on a gate wire extending from the gate electrode; and a first insulating film sidewall formed on an upper sidewall of the columnar semiconductor layer;

wherein a projection of a bottom surface of the first contact layer onto the substrate is within a circumference of a projected profile of the first insulating film sidewall onto the substrate.

The semiconductor device may further comprise a contact stopper film formed on the first insulating film sidewall, wherein:

the first insulating film sidewall is a silicon oxide film, and the contact stopper film is a silicon nitride film.

Here, the expression "above" the substrate means on the substrate or above the substrate via some layers formed on the substrate.

According to the present invention, it is possible in a vertical transistor to prevent short circuits between a contact layer on a columnar semiconductor layer and a gate electrode formed around the columnar semiconductor layer. Furthermore, according to the present invention, it is possible to obtain low and stable contact resistance.

BRIEF DESCRIPTION OF THE DRAWINGS

A more complete understanding of this application can be obtained when the following detailed description is considered in conjunction with the following drawings, in which.

DETAILED DESCRIPTION OF THE PREFERRED EMBODIMENTS

Figure 43:
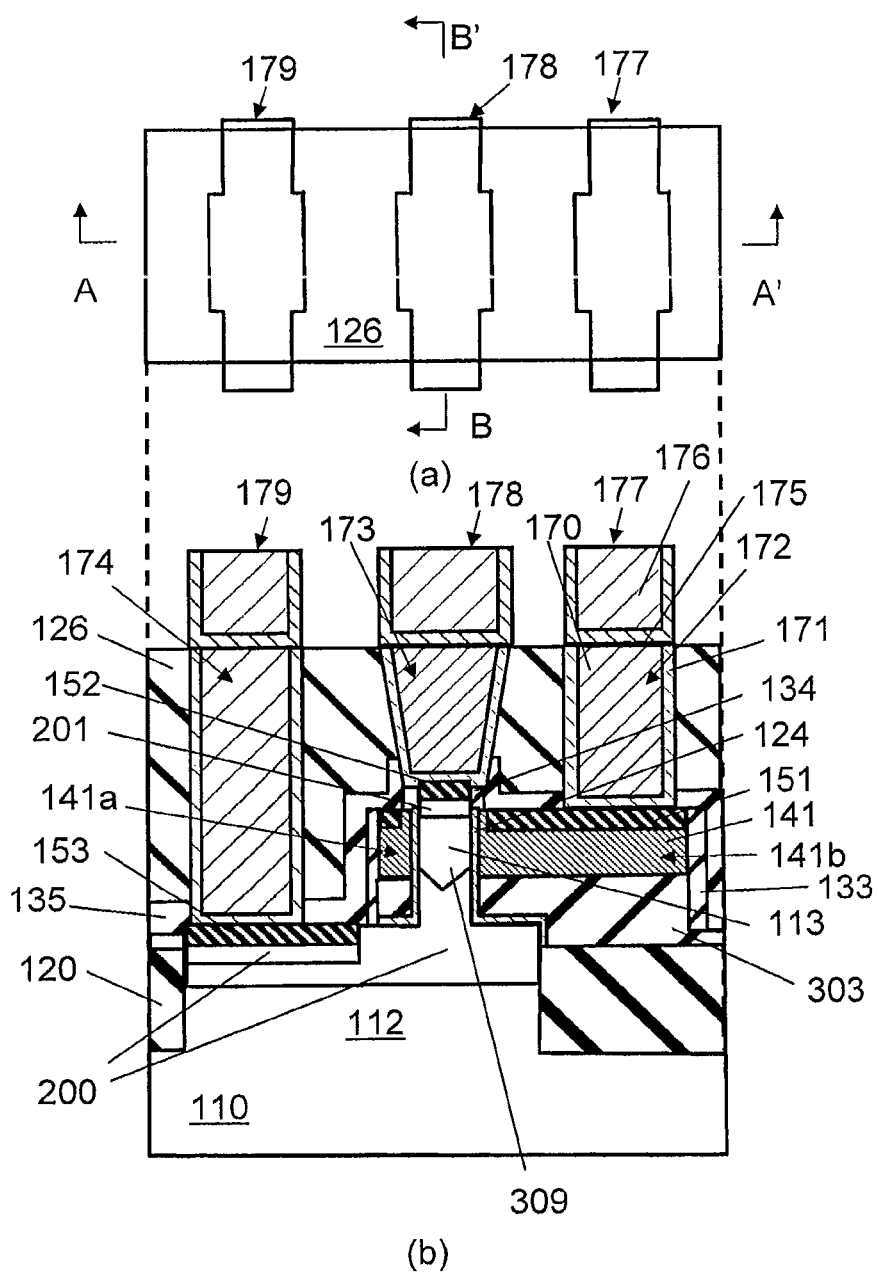
FIG. 43 is a drawing explaining an exemplary production process of the semiconductor device according to a first embodiment, with (a) showing a planar view and (b) showing a cross-sectional view at the line A-A' in (a)
Figure 44:
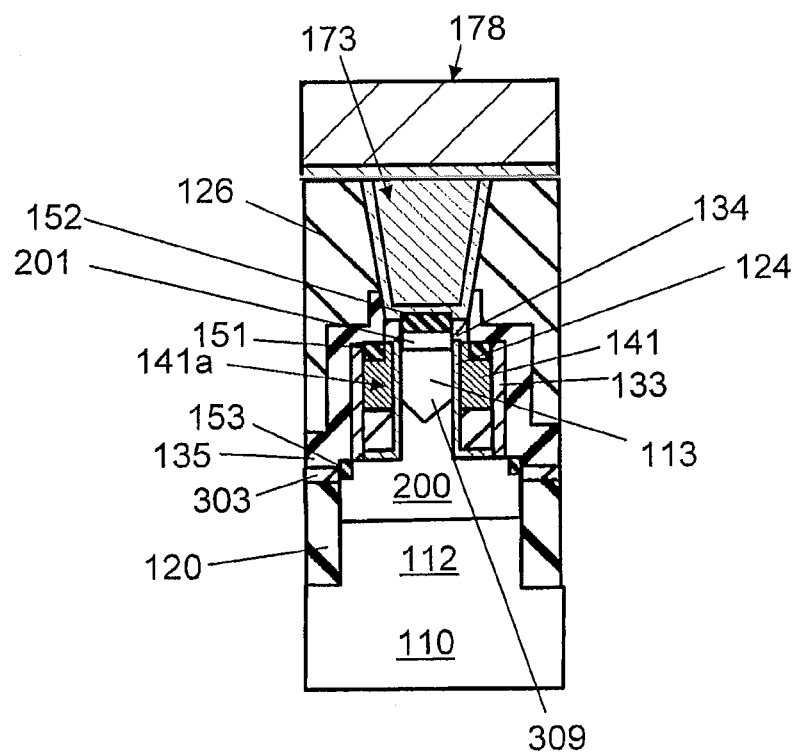
FIG. 44 is a drawing explaining an exemplary production process of the semiconductor device according to a first embodiment, and shows a cross-sectional view at the line B-B' in the planar view of FIG. 43.

FIG. 43 is a drawing showing an NMOS SGT of a semiconductor device according to a first embodiment of, with part (a) showing a planar view and part (b) showing a cross-sectional view along the cut line A-A' in part (a). FIG. 44 is a cross-sectional view along the cut line B-B' in the planar view (a). An NMOS SGT of a semiconductor device according to the first embodiment is described hereafter with reference to FIGS. 43 and 44.

A planar silicon layer 112 that is the planar semiconductor layer is formed on a silicon substrate 110 that is the substrate. A columnar silicon layer 113 that is the columnar semiconductor layer is formed on the planar silicon layer 112. A source diffusion layer 200 is formed in the lower part of the columnar silicon layer 113 and in the planar silicon layer 112. A drain diffusion layer 201 is formed in the upper part of the columnar silicon layer 113. A body 309 is formed between the source diffusion layer 200 and the drain diffusion layer 201. A gate insulating film 124 is formed around the columnar silicon layer 113. Furthermore, a gate electrode 141a is formed on the gate insulating film 124 so as to surround the columnar silicon layer 113. A gate wire 141b extends from the gate electrode 141a. The gate electrode 141a comprises a part of an amorphous silicon film 141 surrounding the columnar silicon layer 113 and a part of a metal-silicon compound layer 151. In addition, the gate wire 141b comprises another part of the amorphous silicon film 141 and another part of the metal-silicon compound layer 151.

A first insulating film 303 is formed between the gate electrode 141a and the source diffusion layer 200. The first insulating film 303 is an oxide film thicker than the gate insulating film 124. By forming the first insulating film 303, which is an oxide film thicker than the gate insulating film 124, between the gate electrode 141a and gate wire 141b extending from the gate electrode 141a and the source diffusion layer 200, parasitic capacitance between the gate electrode 141a and gate wire 141b and the source diffusion layer 200 can be reduced.

A first insulating film sidewall (an oxide film) 134 is formed. The first insulating film sidewall 134 is an insulating film in the form of a sidewall on the upper sidewall of the columnar silicon layer 113 and on the upper surface of the gate electrode 141a. Furthermore, a second insulating film sidewall 133 is formed. The second insulating film sidewall 133 is an insulating film in the form of a sidewall on the sidewalls of the gate electrode 141a and gate wire 141b. When the first insulating film sidewall 134 is composed of an oxide film, the condition for etching a contact stopper film 135 is preferably set to yield a high selectivity ratio between the contact stopper film 135 composed of a nitride film and the first insulating film sidewall 134 composed of an oxide film in the below-described process of forming a contact hole for a first contact layer 173 on the upper part of the columnar silicon layer 113. Accordingly, over-etching of the first insulating film sidewall 134 during the formation of the contact hole can be prevented.

A metal-silicon compound layer 153 is formed in the top part of the source diffusion layer 200. A metal-silicon compound layer 152 is formed in the top part of the drain diffusion layer 201.

A second contact layer 174 is formed on the metal-silicon compound layer 153 provided in the top part of the source diffusion layer 200. A first contact layer 173 is formed on the metal-silicon compound layer 152 provided in top part of the drain diffusion layer 201. A third contact layer 172 is formed on the top surface of the gate wire 141b extending from the gate electrode 141a. The shape of the first contact layer 173 formed on the columnar silicon layer 113 will be described later.

The source diffusion layer 200 is connected to a ground potential (GND potential) and the drain diffusion layer 201 is connected to a Vcc potential. By applying a potential in the range of between 0 and Vcc to the gate electrode 141a, the SGT of this embodiment operate as a transistor.

Here, the diffusion layer formed in the upper part of the columnar silicon layer 113 may serve as a source diffusion layer and the diffusion layer formed in the lower part of the columnar silicon layer 113 may serve as a drain diffusion layer.

An exemplary method for producing the SGT which is a semiconductor device according to the first embodiment of the present application is described hereafter with reference to FIGS. 1 to 43. In the figures, the same components are referred to by the same reference numbers. FIGS. 1 to 43 show an exemplary method for producing the SGT according to the present invention. In each figure, part (a) is a plane view and part (b) is a cross-sectional view along a cut line A-A'.

Figure 1:
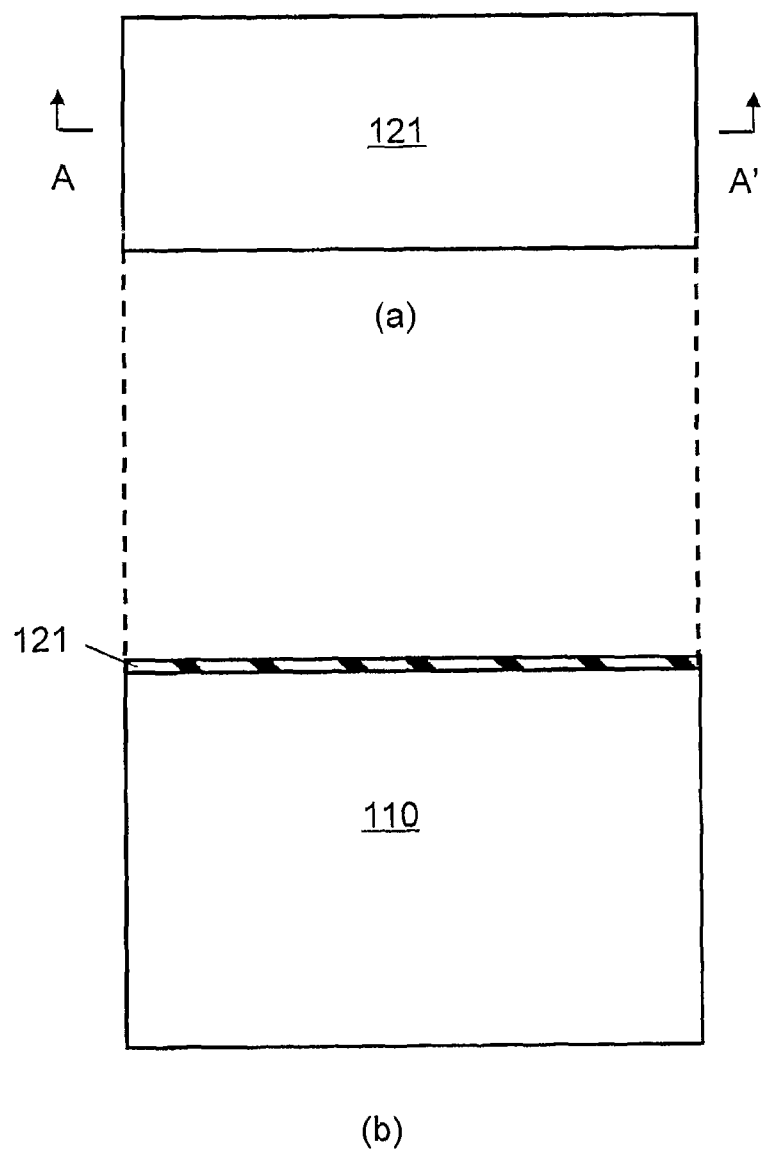
FIG. 1 is a drawing explaining an exemplary production process of the semiconductor device according to a first embodiment, with (a) showing a planar view and (b) showing a cross-sectional view at the line A-A' in (a)

Referring to FIG. 1, a pad oxide film 121 is formed on a silicon substrate 110.

Figure 2:
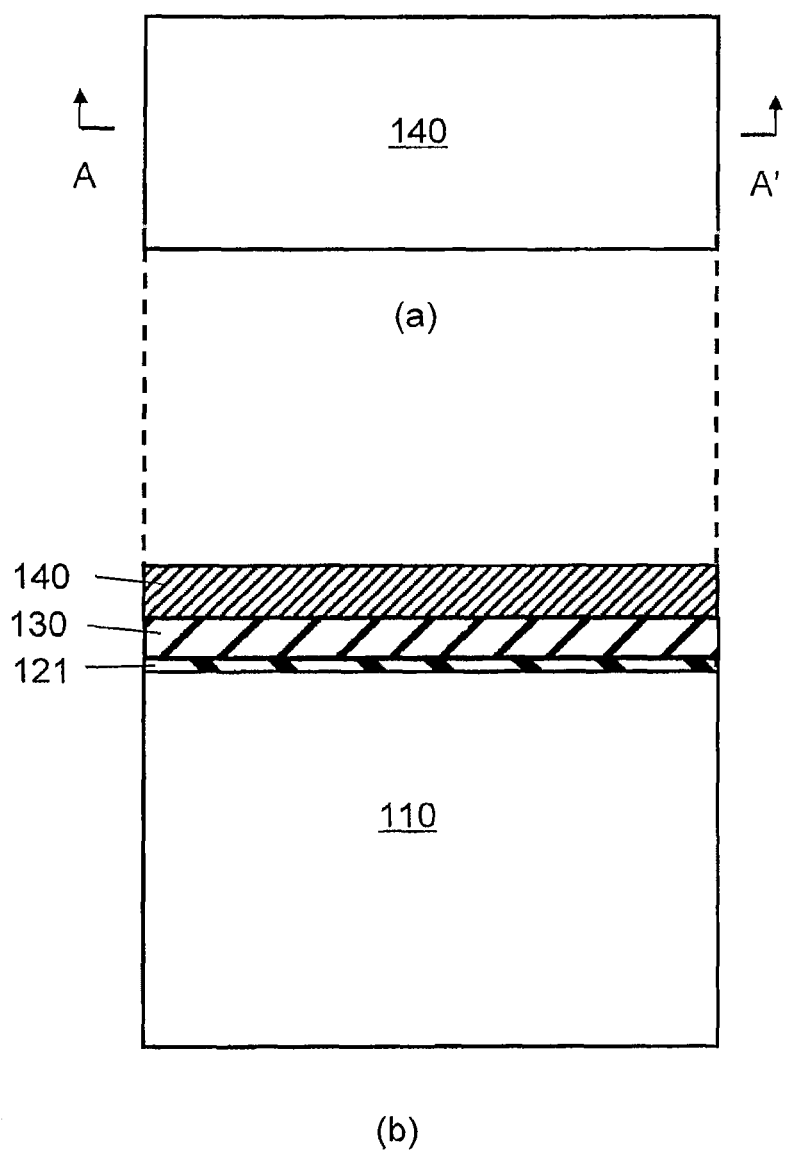
FIG. 2 is a drawing explaining an exemplary production process of the semiconductor device according to a first embodiment, with (a) showing a planar view and (b) showing a cross-sectional view at the line A-A' in (a)

Referring to FIG. 2, a first nitride film 130 is formed on the pad oxide film 121 and a first amorphous silicon film 140 is formed on the first nitride film 130. The first amorphous silicon film may also be a film composed of polysilicon, for example.

Figure 3:
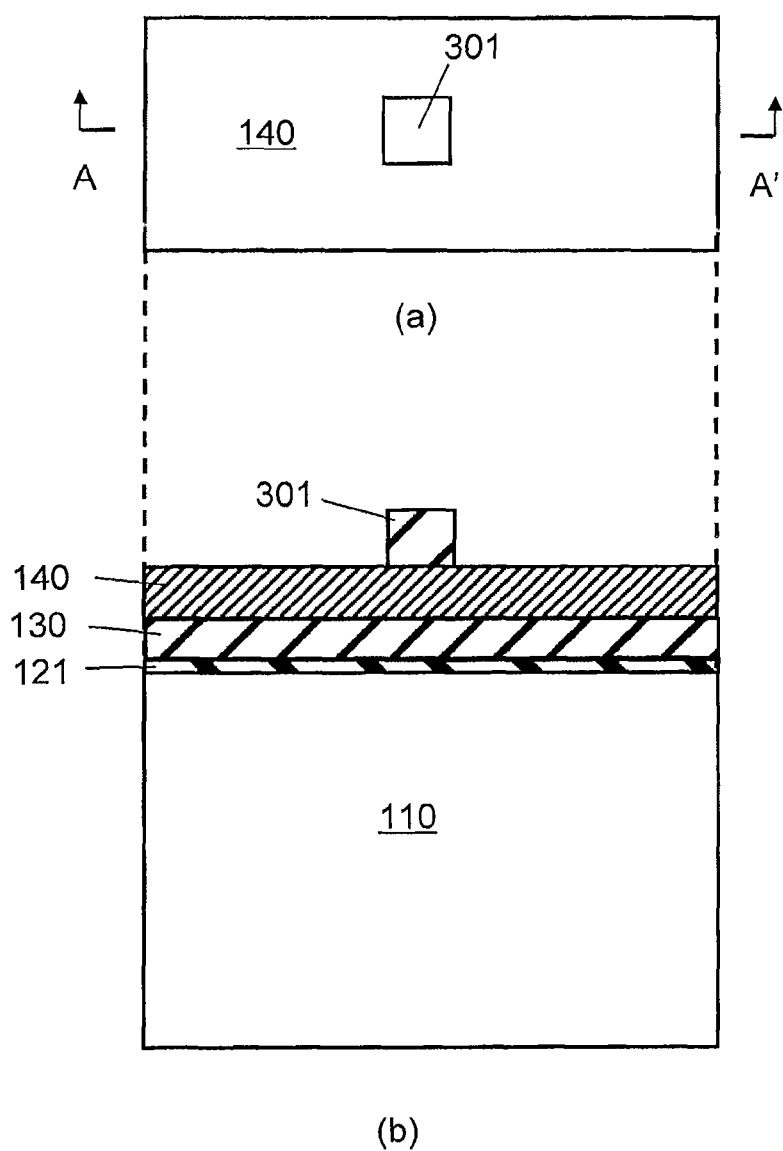
FIG. 3 is a drawing explaining an exemplary production process of the semiconductor device according to a first embodiment, with (a) showing a planar view and (b) showing a cross-sectional view at the line A-A' in (a)

Referring to FIG. 3, a resist is applied to the first amorphous silicon film 140 and patterned using lithography techniques to form a resist pattern 301 corresponding to the area where the columnar silicon layer 113 is to be formed in a later step.

Figure 4:
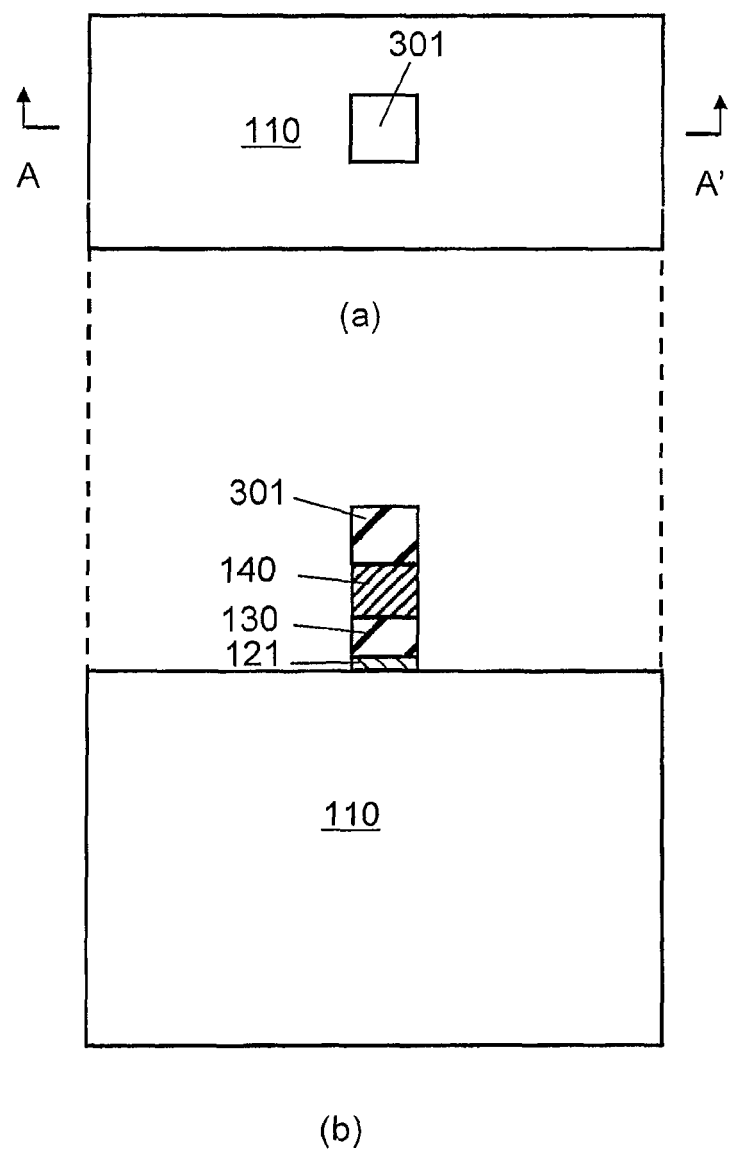
FIG. 4 is a drawing explaining an exemplary production process of the semiconductor device according to a first embodiment, with (a) showing a planar view and (b) showing a cross-sectional view at the line A-A' in (a)

Referring to FIG. 4, the first amorphous silicon film 140 and the first nitride film 130 are etched with the first resist pattern 301 to form a first hard mask. Then, the pad oxide film 121 is etched using the first hard mask.

Figure 5:
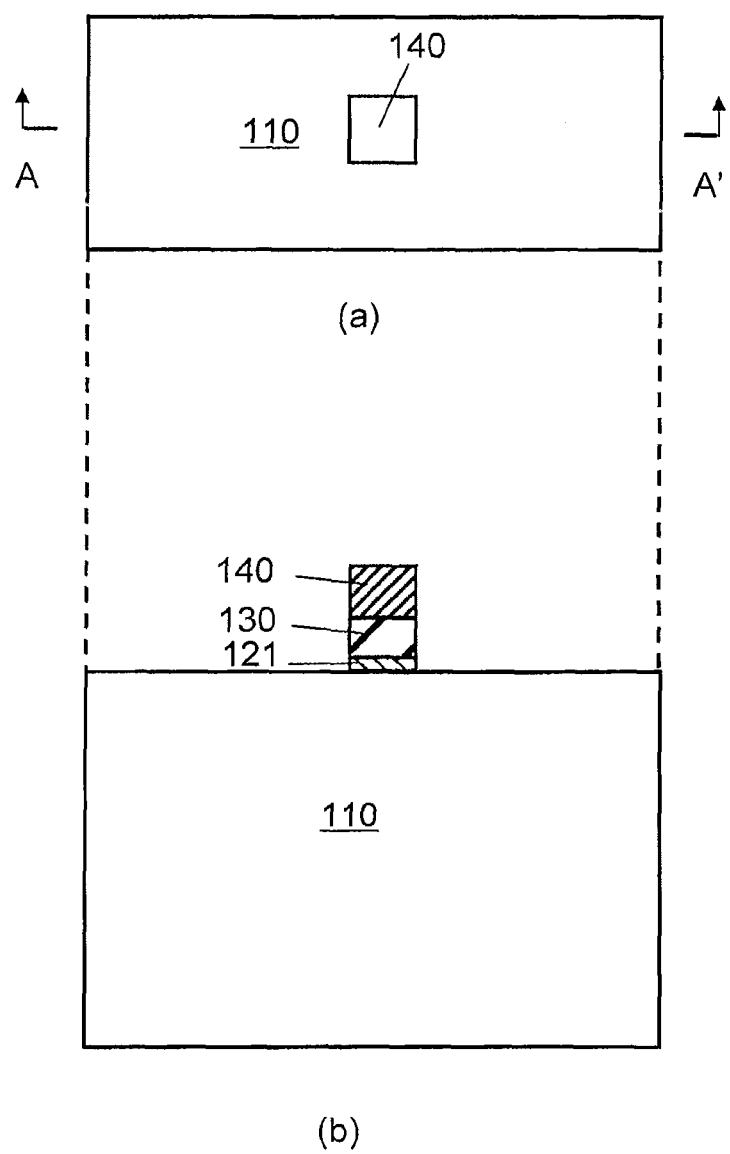
FIG. 5 is a drawing explaining an exemplary production process of the semiconductor device according to a first embodiment, with (a) showing a planar view and (b) showing a cross-sectional view at the line A-A' in (a)

Referring to FIG. 5, the first resist pattern 301 is removed.

Figure 6:
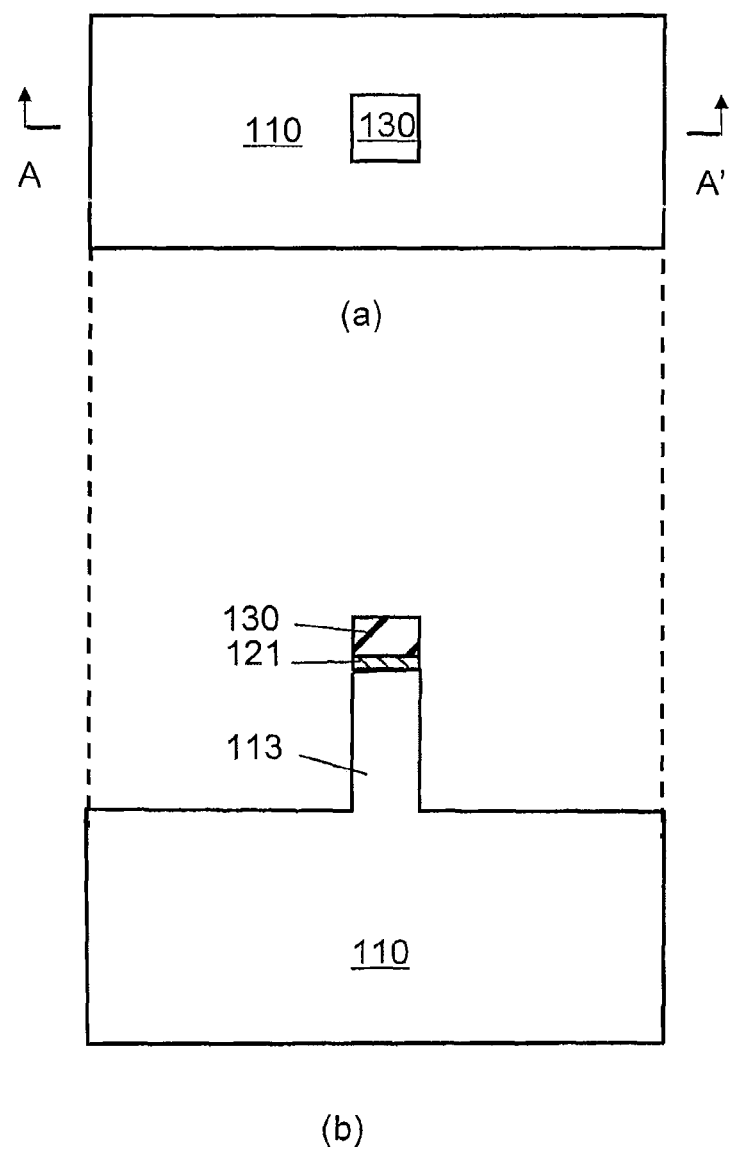
FIG. 6 is a drawing explaining an exemplary production process of the semiconductor device according to a first embodiment, with (a) showing a planar view and (b) showing a cross-sectional view at the line A-A' in (a)

Referring to FIG. 6, a columnar silicon layer 113 is formed by dry-etching the silicon substrate 110 using the first hard mask as a mask. The first hard mask is composed of the first nitride film 130 and the first amorphous silicon film 140. During the dry-etching step, the first amorphous silicon film 140 is also etched. After the first amorphous silicon film 140 is completely etched, the plasma emission intensity detectable in a dry-etching device is changed. Therefore, the etching end point can be detected by detecting the change in the plasma emission intensity. Accordingly, the height of the columnar silicon layer 113 can be controlled in a stable manner not dependent on the etching rate.

In order to apply the above end point detection method to this process, the thickness of the amorphous silicon film 140 prior to the formation of the columnar silicon layer 113 through dry-etching must be smaller than the height of the columnar silicon layer 113.

Figure 7:
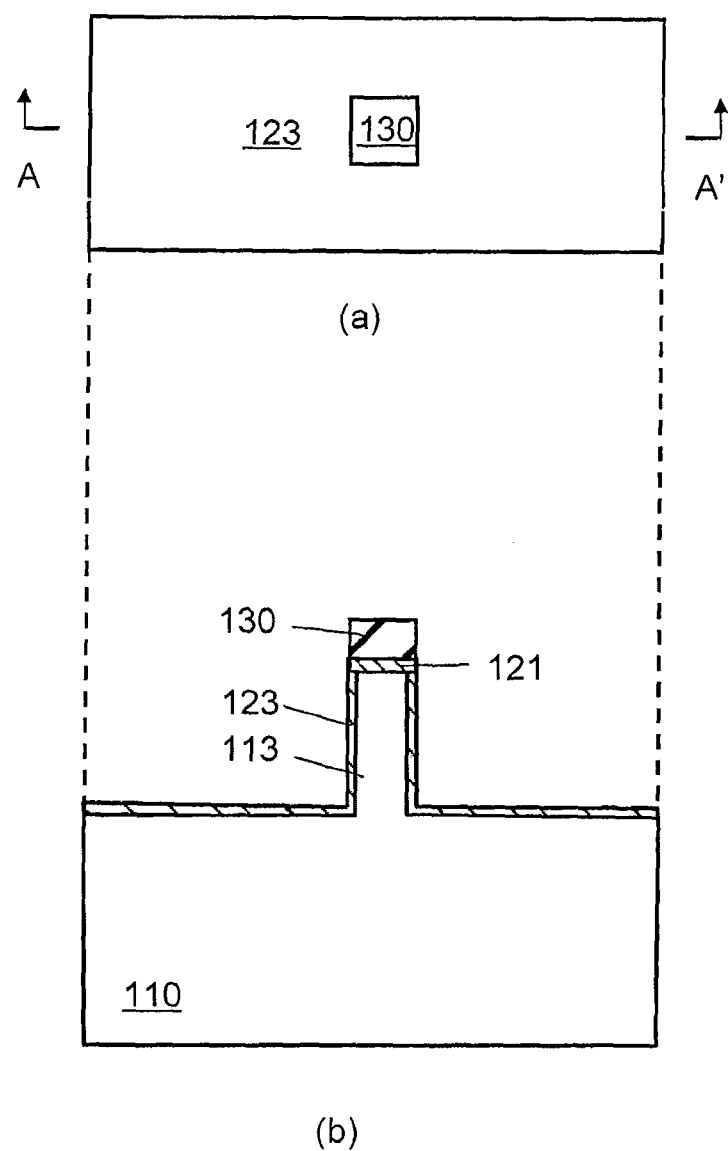
FIG. 7 is a drawing explaining an exemplary production process of the semiconductor device according to a first embodiment, with (a) showing a planar view and (b) showing a cross-sectional view at the line A-A' in (a)

Referring to FIG. 7, the surfaces of the columnar silicon layer 113 and silicon substrate 110 are sacrificially oxidized to form a sacrificial oxide film 123 for smoothing the side surface of the columnar silicon layer 113 that will form a channel and removing the silicon surface in which carbon and like is implanted during the dry-etching step.

Figure 8:
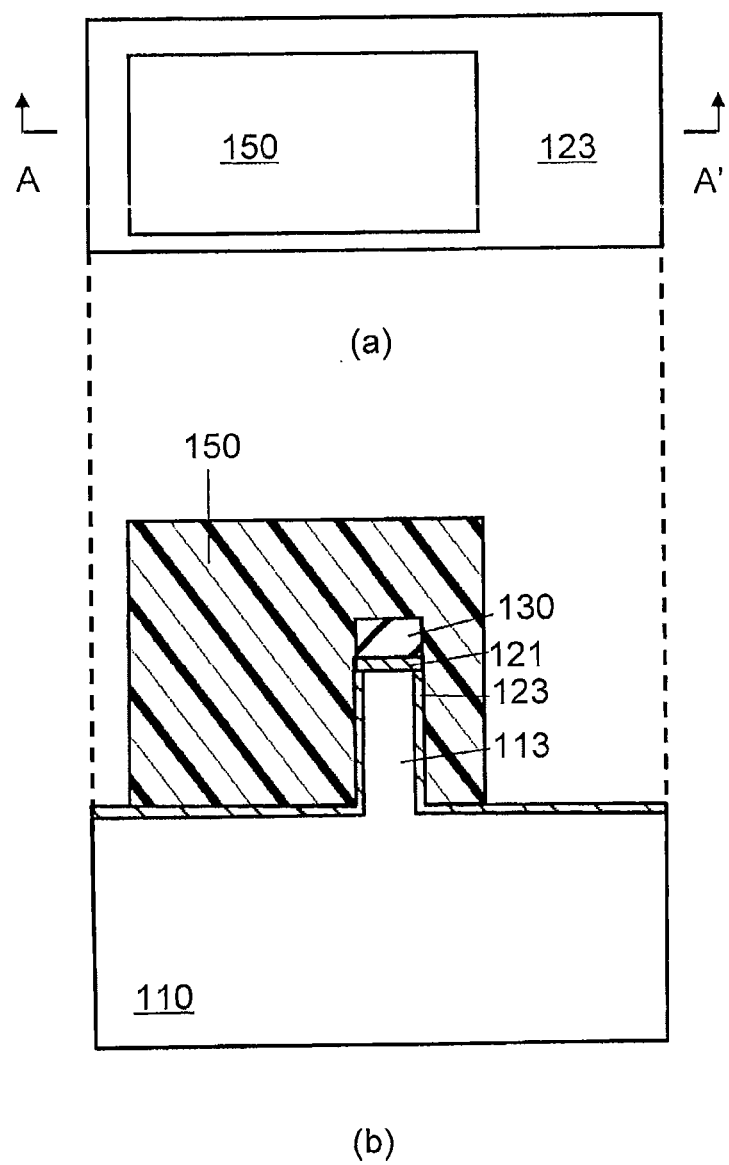
FIG. 8 is a drawing explaining an exemplary production process of the semiconductor device according to a first embodiment, with (a) showing a planar view and (b) showing a cross-sectional view at the line A-A' in (a)

Referring to FIG. 8, a resist is applied to the resultant structure of the above step, and patterned by lithography techniques to form a resist pattern 150 corresponding to the area where a planar silicon layer 112 is to be formed. Here, the sacrificial oxide film 123 formed in the 15 surface of the columnar silicon layer 113 and silicon substrate 110 protects the silicon surface from contaminants such as byproducts of the subsequent dry-etching step.

Figure 9:
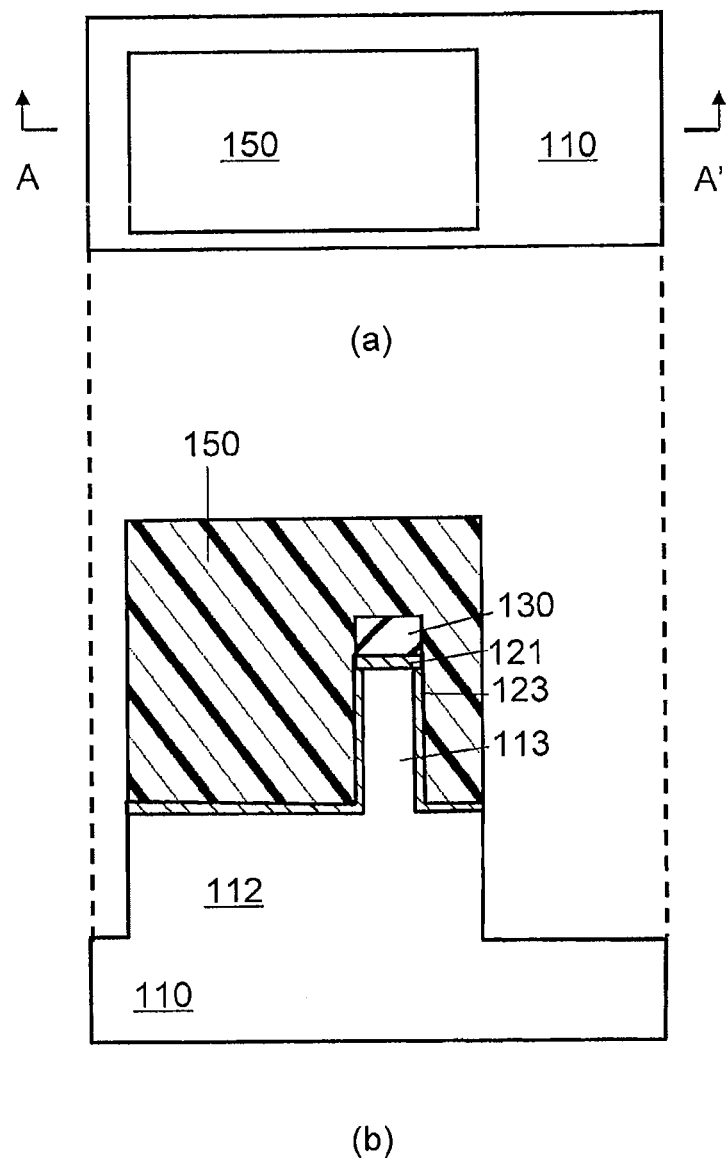
FIG. 9 is a drawing explaining an exemplary production process of the semiconductor device according to a first embodiment, with (a) showing a planar view and (b) showing a cross-sectional view at the line A-A' in (a)

Referring to FIG. 9, the silicon substrate 110 is dry-etched with the resist pattern 150 to form a planar silicon layer 112.

Figure 10:
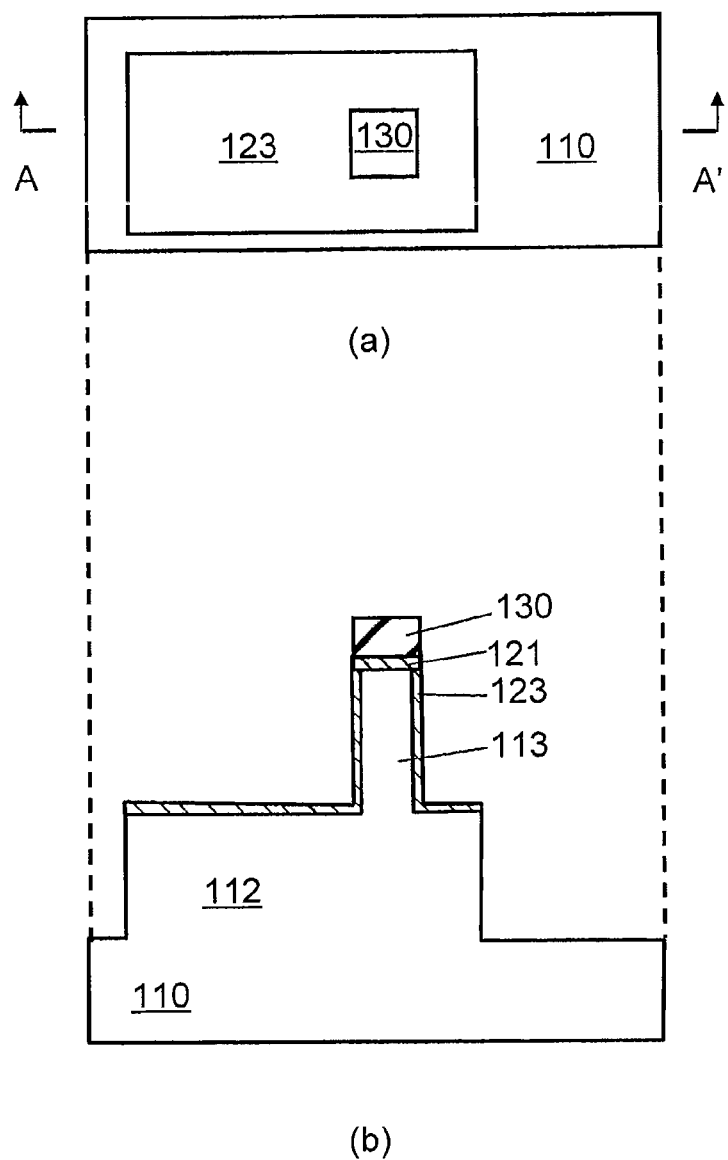
FIG. 10 is a drawing explaining an exemplary production process of the semiconductor device according to a first embodiment, with (a) showing a planar view and (b) showing a cross-sectional view at the line A-A' in (a)

Referring to FIG. 10, the resist pattern 150 is removed.

Figure 11:
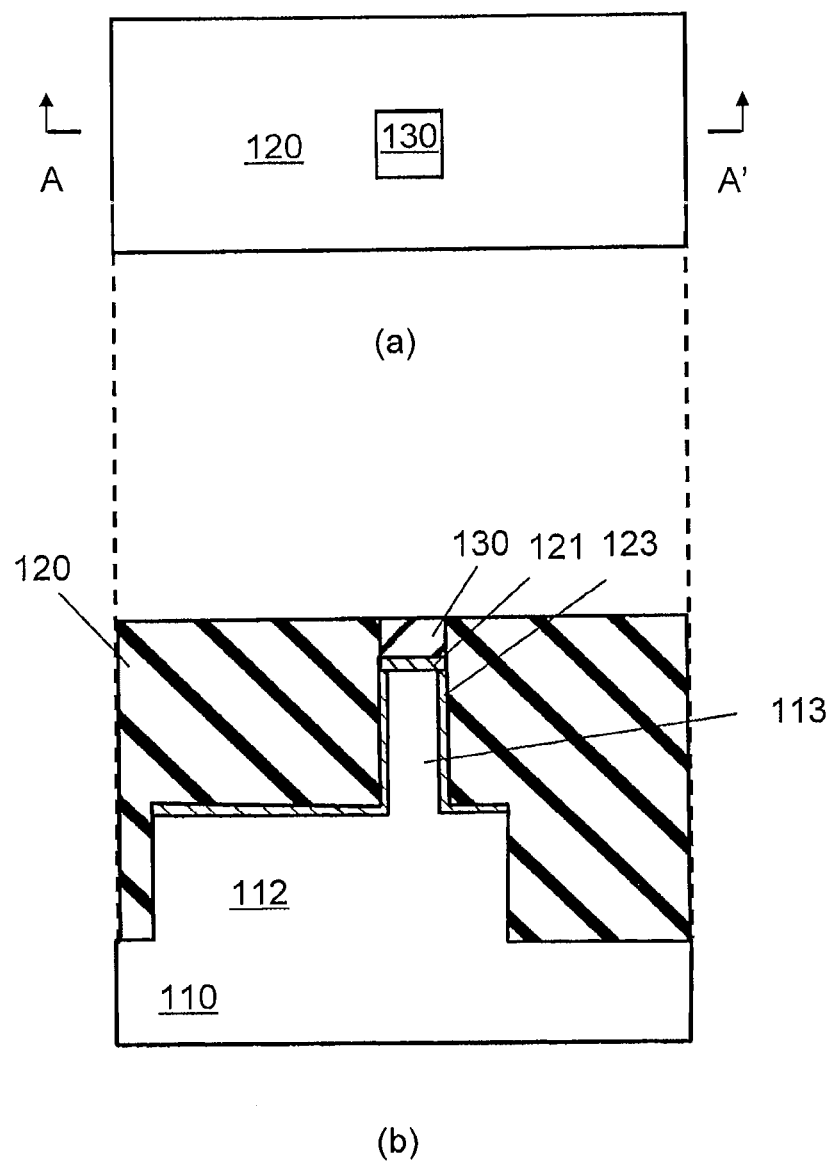
FIG. 11 is a drawing explaining an exemplary production process of the semiconductor device according to a first embodiment, with (a) showing a planar view and (b) showing a cross-sectional view at the line A-A' in (a)

Referring to FIG. 11, a filler oxide film 120 is deposited so as to cover the resultant structure of the above steps, and planarized.

Figure 12:
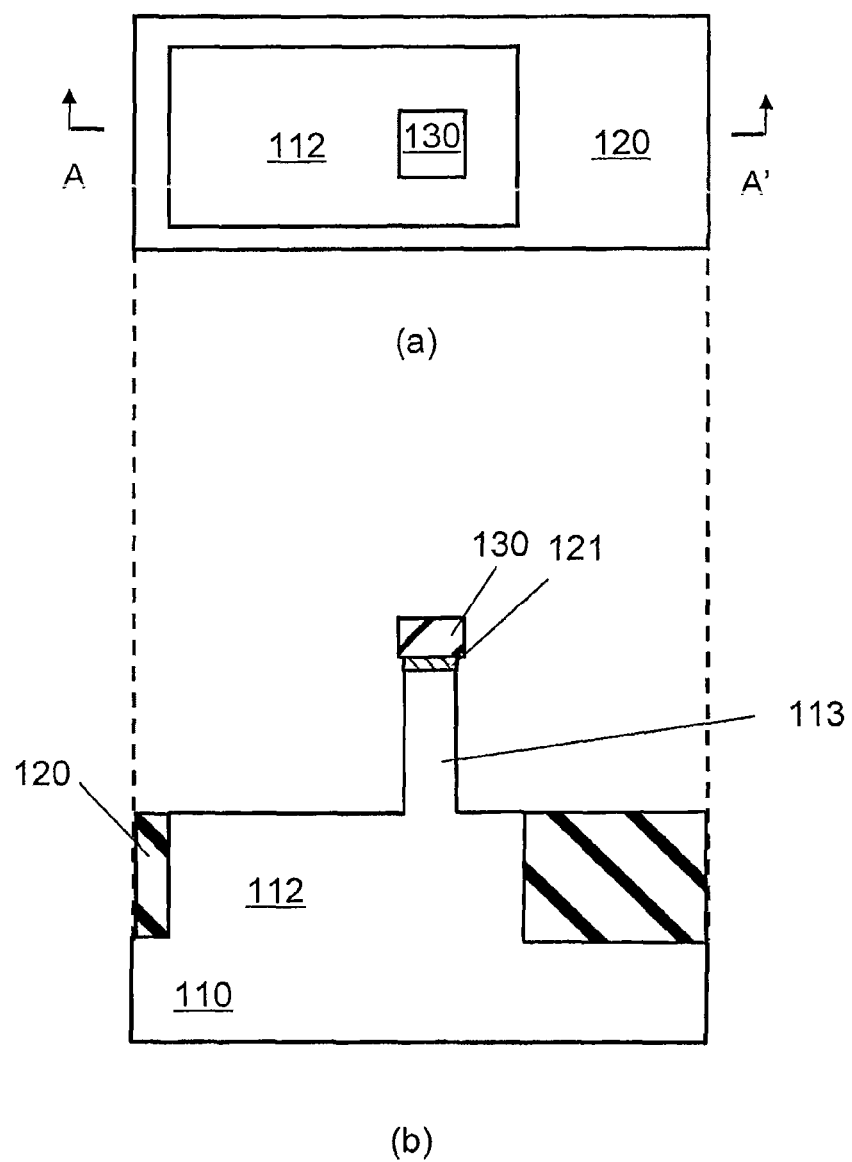
FIG. 12 is a drawing explaining an exemplary production process of the semiconductor device according to a first embodiment, with (a) showing a planar view and (b) showing a cross-sectional view at the line A-A' in (a)

Referring to FIG. 12, the planarized filler oxide film 120 is etched to expose the surface of the planar silicon layer 112.

Figure 13:
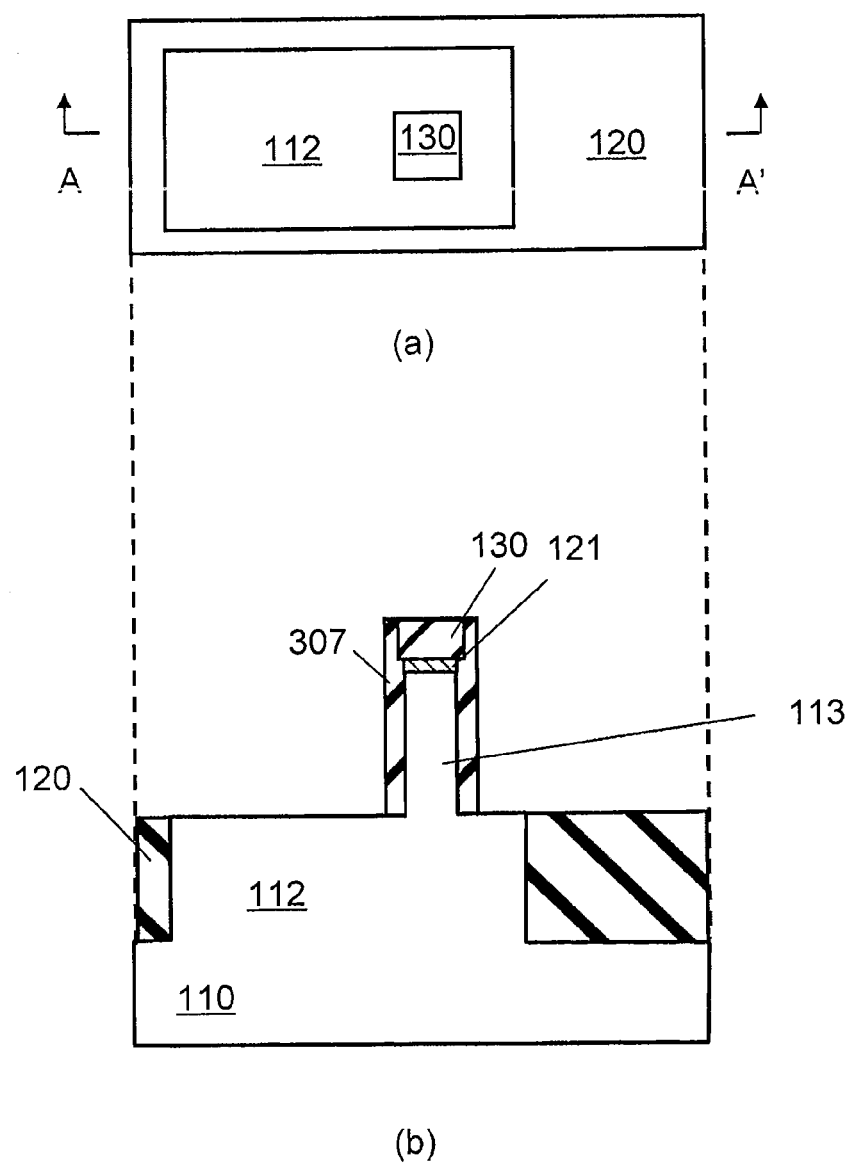
FIG. 13 is a drawing explaining an exemplary production process of the semiconductor device according to a first embodiment, with (a) showing a planar view and (b) showing a cross-sectional view at the line A-A' in (a)

Referring to FIG. 13, an offset spacer 307 is formed on the side surface of the columnar silicon layer 113. The offset spacer 307 is composed of electrically conductive material such as silicon oxide. The offset spacer 307 prevents dopants from being implanted into the columnar silicon layer 113 through the sidewall of the columnar silicon layer 113 during the implantation of dopants in the next step.

Figure 14:
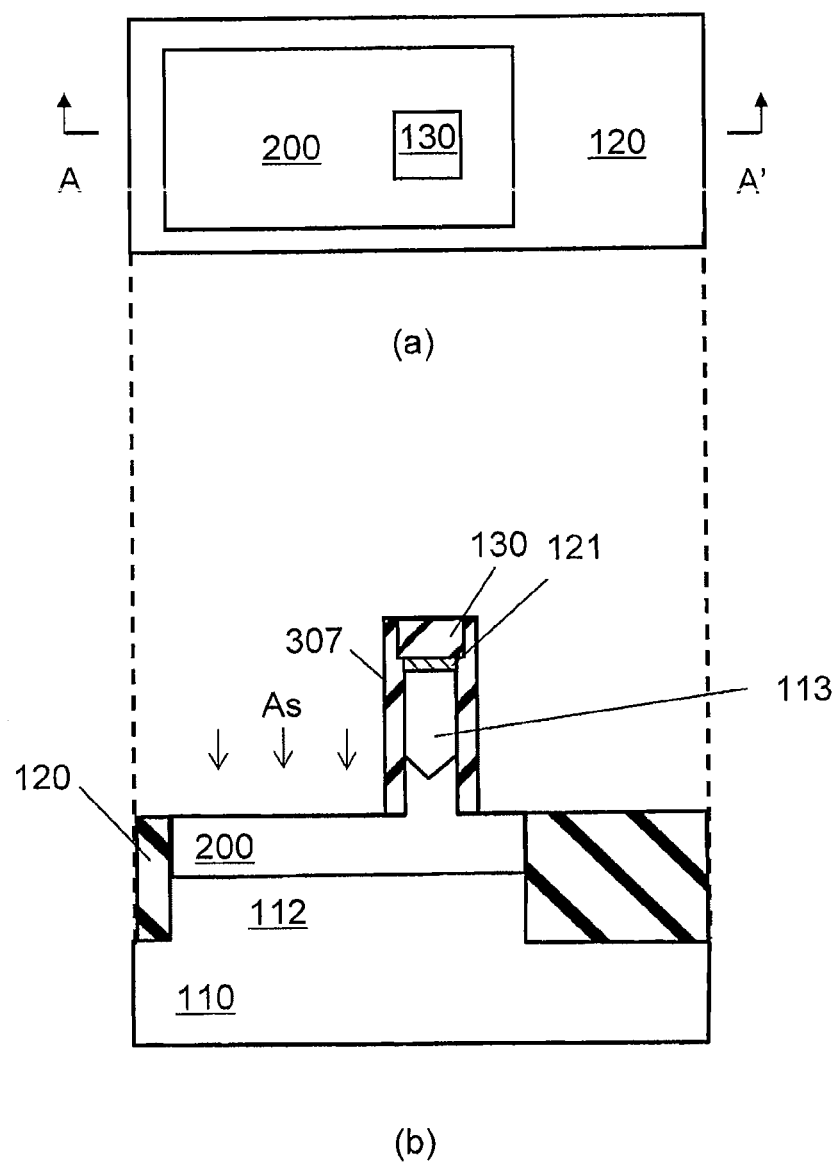
FIG. 14 is a drawing explaining an exemplary production process of the semiconductor device according to a first embodiment, with (a) showing a planar view and (b) showing a cross-sectional view at the line A-A' in (a)

Referring to FIG. 14, a dopant such as arsenic or phosphorus is implanted in the planar silicon layer 112 to form a source diffusion layer 200 in the lower part of the columnar silicon layer 113 and in the planar silicon layer 112.

In the above step, the first nitride film 130 formed on the columnar silicon layer 113 prevents dopants from being implanted into the upper part of the columnar silicon layer 113. As described above, the implantation of dopants into the source diffusion layer 200 formed in the planar silicon layer 112 and the implantation of dopants into the drain diffusion layer 201 formed in the upper part of the columnar silicon layer 113 are separately performed. This allows the conditions of the implantation to be easily optimized separately. Therefore, it is possible to prevent short channel effect and leak current effectively.

Figure 15:
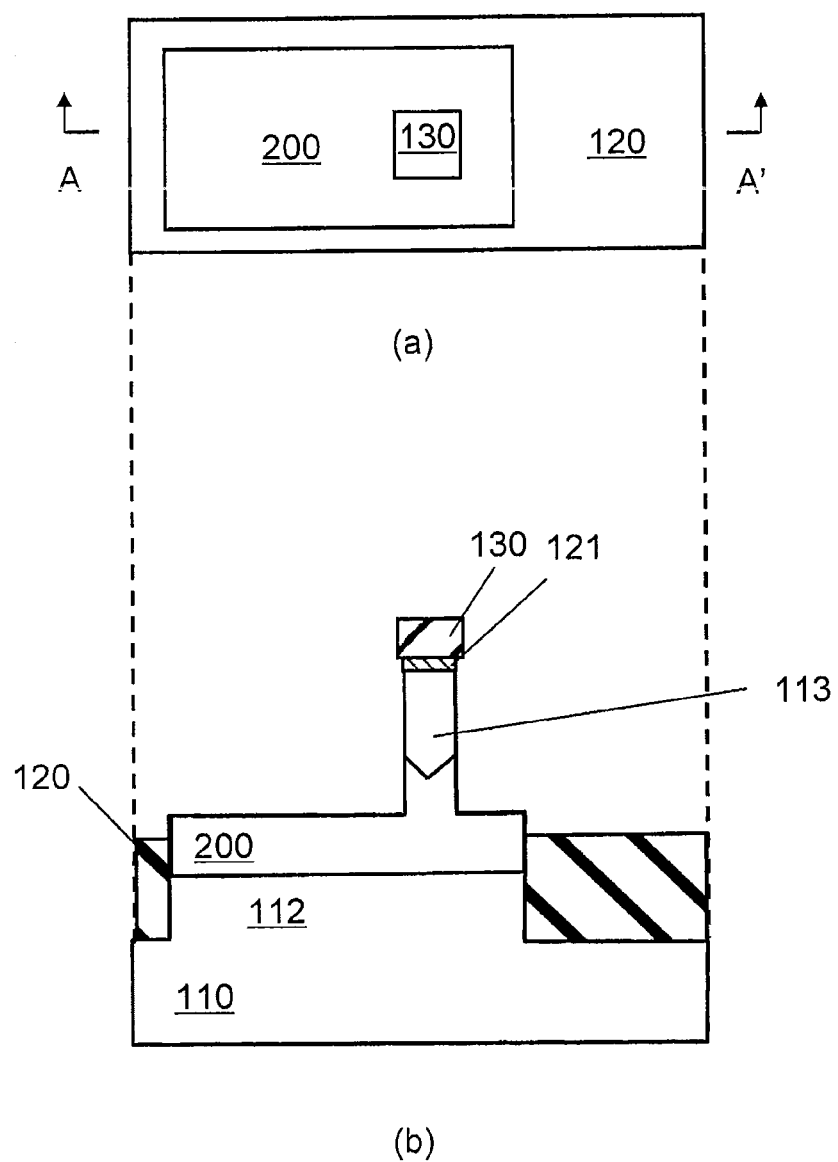
FIG. 15 is a drawing explaining an exemplary production process of the semiconductor device according to a first embodiment, with (a) showing a planar view and (b) showing a cross-sectional view at the line A-A' in (a)

Referring to FIG. 15, the offset spacer 307 is etched to be removed.

Figure 16:
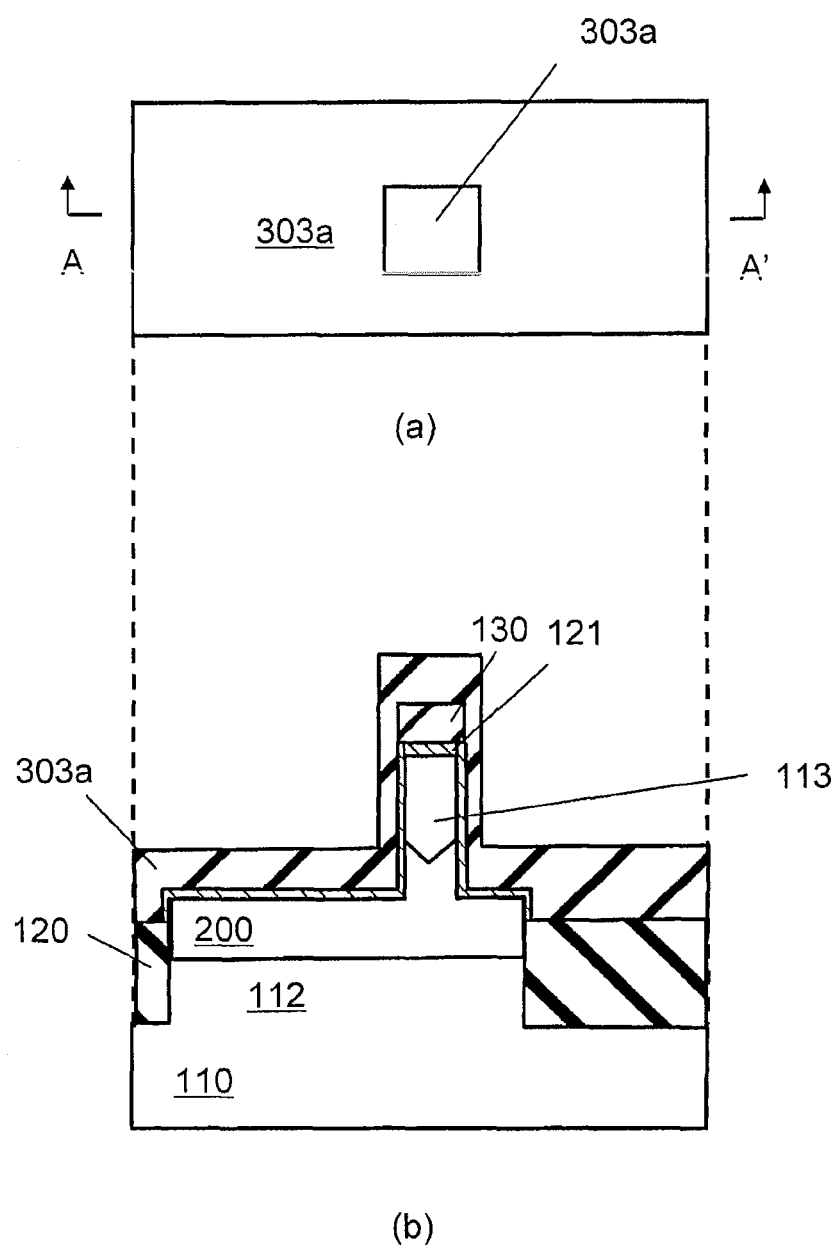
FIG. 16 is a drawing explaining an exemplary production process of the semiconductor device according to a first embodiment, with (a) showing a planar view and (b) showing a cross-sectional view at the line A-A' in (a)

Referring to FIG. 16, an insulating film 303a such as an oxide film is formed. The insulating film 303a is formed thickly on the lower part of the columnar silicon layer 113, on the source diffusion layer 200, and on the top of the columnar silicon layer 113 and the insulating film 303a is formed thinly on the sidewall of the columnar silicon layer 113.

Figure 17:
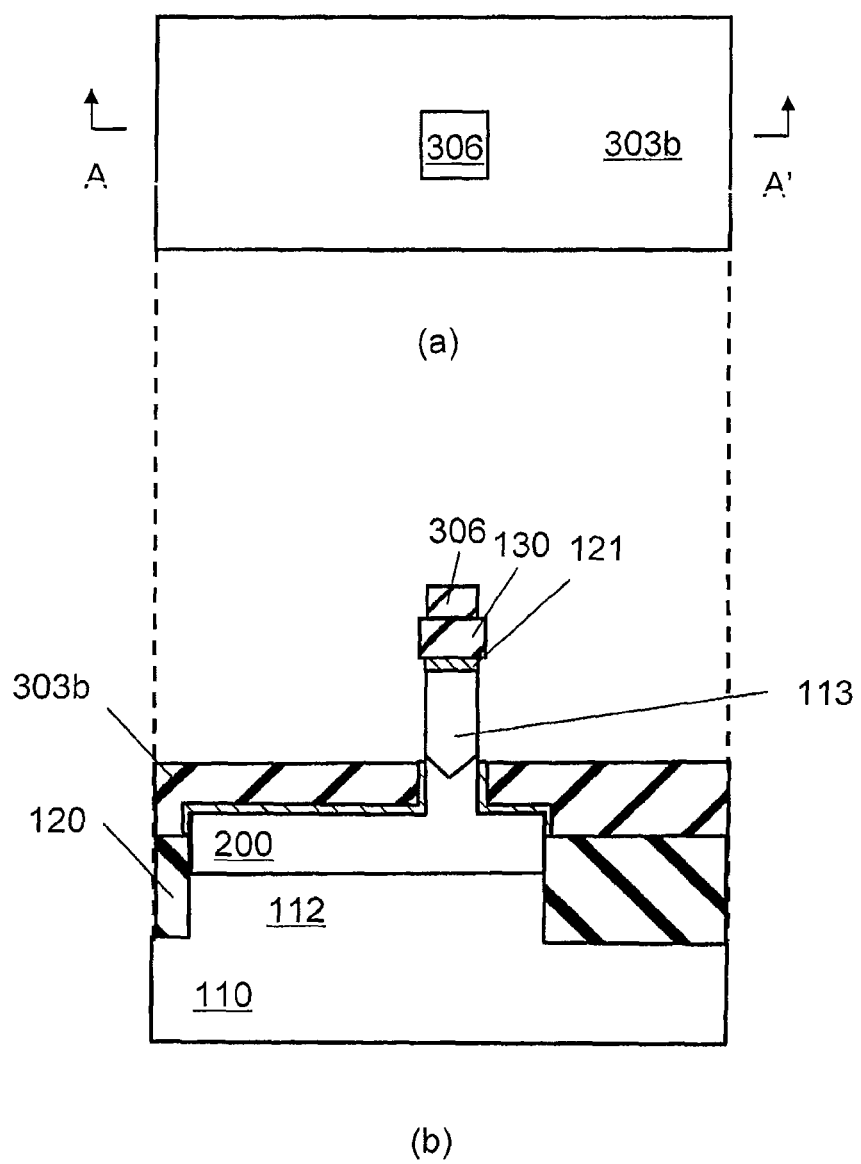
FIG. 17 is a drawing explaining an exemplary production process of the semiconductor device according to a first embodiment, with (a) showing a planar view and (b) showing a cross-sectional view at the line A-A' in (a)

Referring to FIG. 17, the insulating film 303a on the sidewall of the columnar silicon layer 113 is etched. Preferably, the etching is performed isotropically. As described above, the insulating film 303a is formed thickly at the bottom of the columnar silicon layer 113, above the source diffusion layer 200 and above the top of the columnar silicon layer 113 and is formed thinly around the sidewall of the columnar silicon layer 113. Consequently, even after etching the insulating film 303a around the sidewall of the columnar silicon layer 113, part of the insulating film 303a remains at the bottom of the columnar silicon layer 113, above the source diffusion layer 200 and above the top of the columnar silicon layer 113 so as to form an insulating film 303b at the bottom of the columnar silicon layer 113 and above the source diffusion layer 200 and form an insulating film 306 above the top of the columnar silicon layer 113. The insulating film 303b is arranged between the gate electrode 141a and gate wire 141b, which are to be formed later, and the source diffusion layer 200 and becomes a first insulating film 303 thicker than the gate insulating film 124. The first insulating film 303 serves to reduce parasitic capacitance between the gate electrode 141a and gate wire 141b and the source diffusion layer 200.

The first insulating film 303 that is formed so as to be arranged between the gate electrode 141a and gate wire 141b and the planar silicon layer 112 in a later step may also be formed by forming an insulating film to embed the columnar silicon layer 113, flattening and etching back it.

Figure 18:
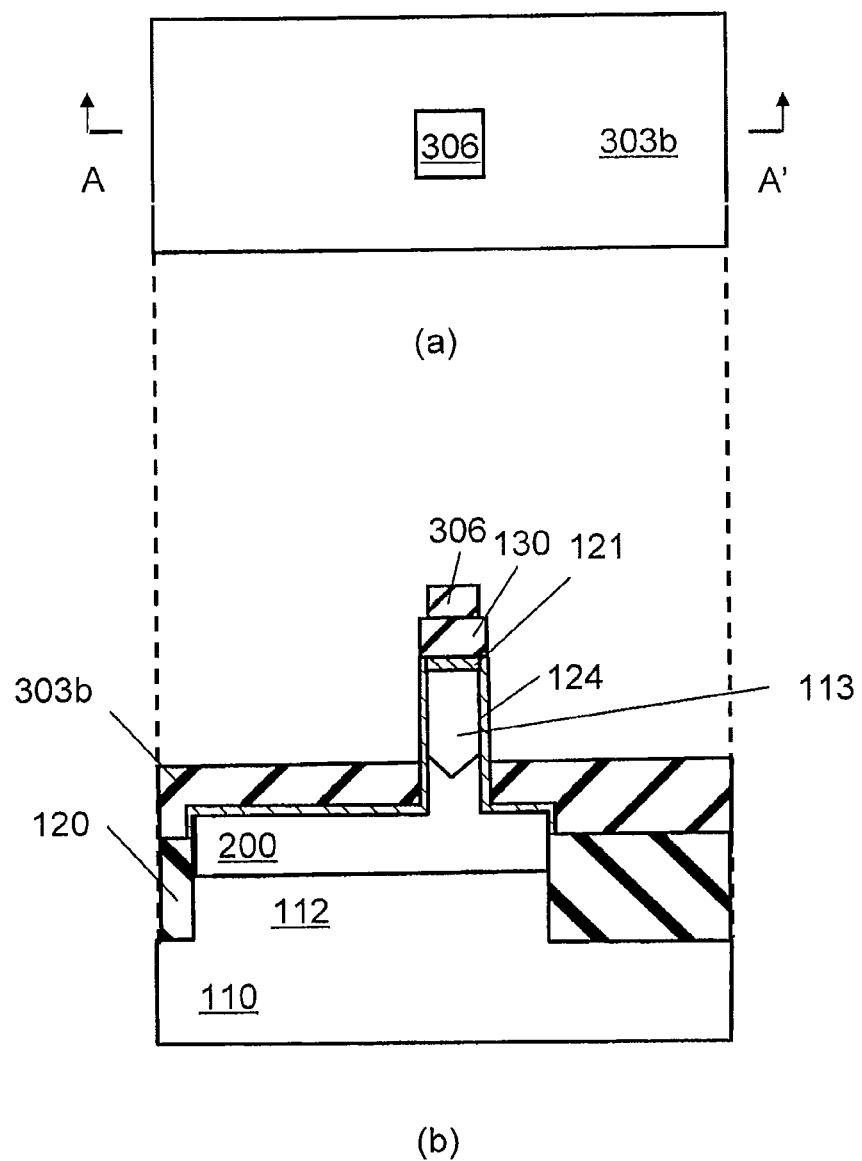
FIG. 18 is a drawing explaining an exemplary production process of the semiconductor device according to a first embodiment, with (a) showing a planar view and (b) showing a cross-sectional view at the line A-A' in (a)

Referring to FIG. 18, a gate insulating film 124 such as an oxide film and silicon oxynitride film is formed on the side surface of the columnar silicon layer 113.

Figure 19:
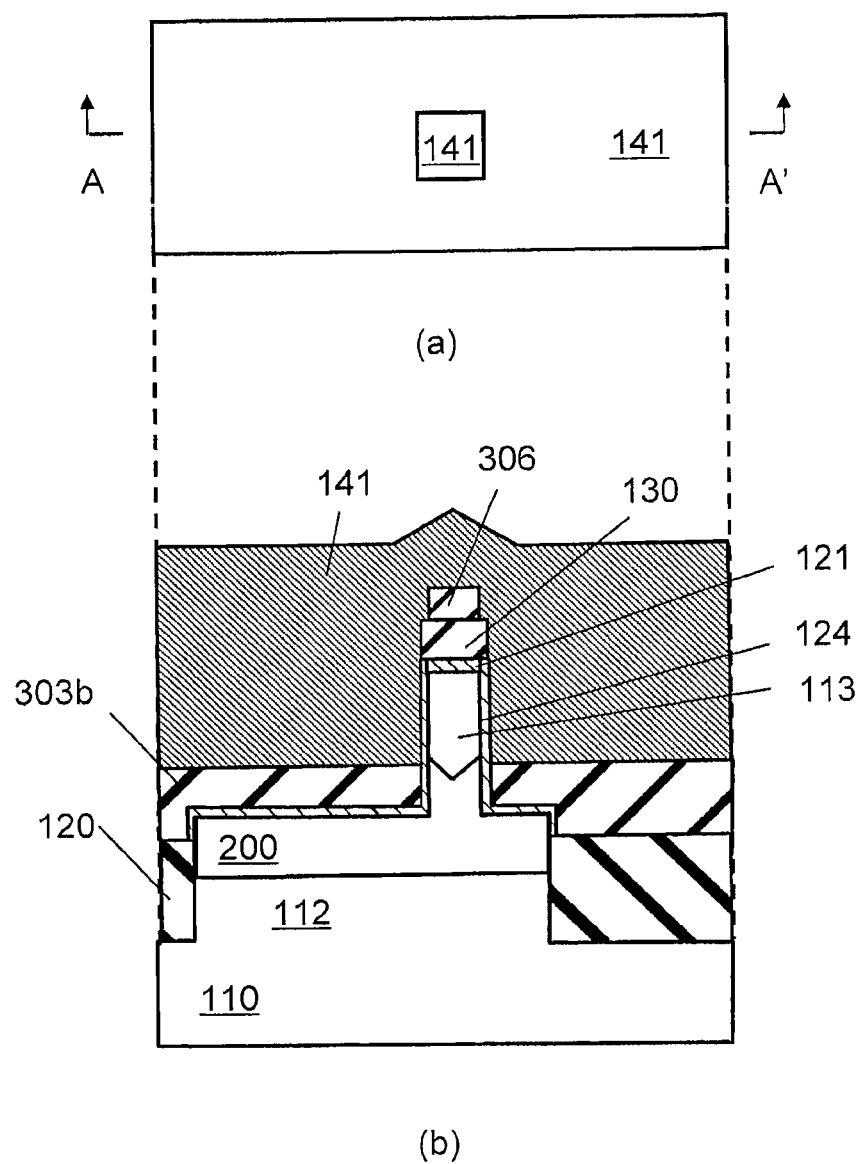
FIG. 19 is a drawing explaining an exemplary production process of the semiconductor device according to a first embodiment, with (a) showing a planar view and (b) showing a cross-sectional view at the line A-A' in (a)

Referring to FIG. 19, a second amorphous silicon film 141 that is a gate conductive film is formed to embed the columnar silicon layer 113. The second amorphous silicon film 141 may also be a film composed of polysilicon.

Figure 20:
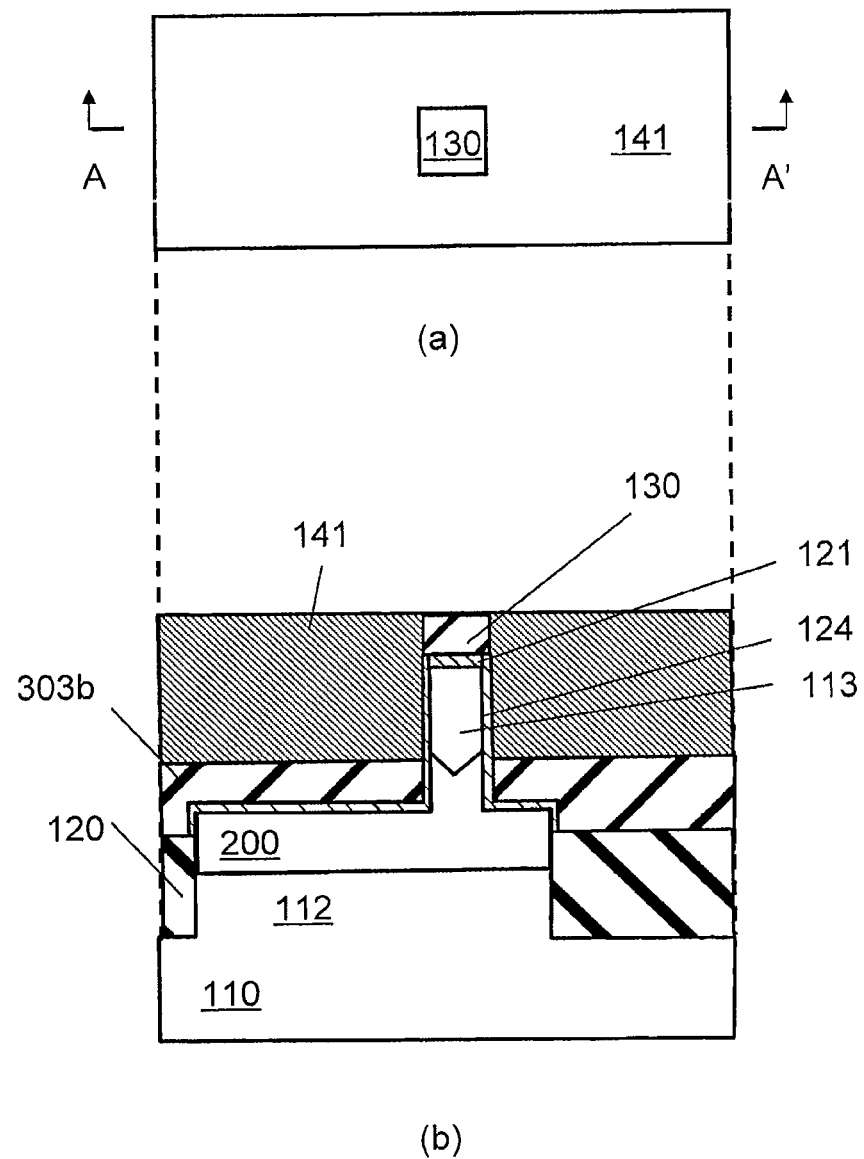
FIG. 20 is a drawing explaining an exemplary production process of the semiconductor device according to a first embodiment, with (a) showing a planar view and (b) showing a cross-sectional view at the line A-A' in (a)
Figure 21:
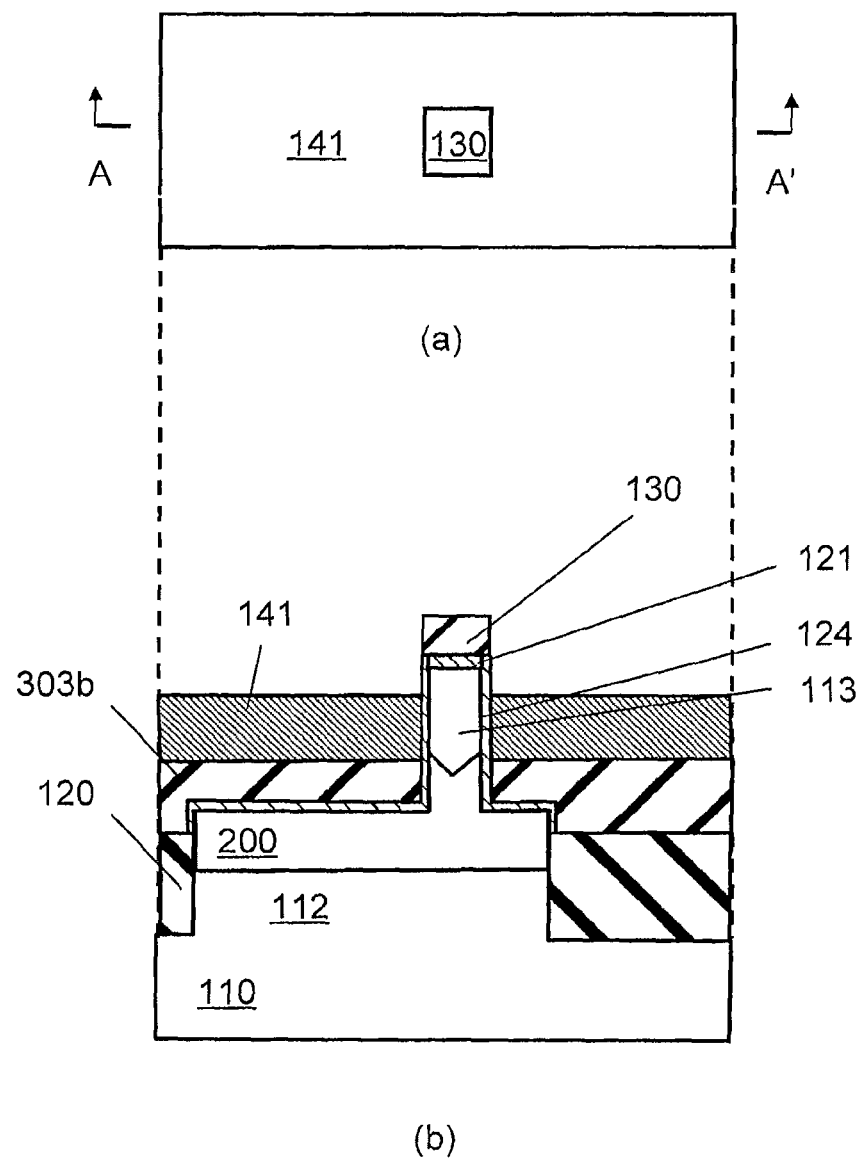
FIG. 21 is a drawing explaining an exemplary production process of the semiconductor device according to a first embodiment, with (a) showing a planar view and (b) showing a cross-sectional view at the line A-A' in (a)

Referring to FIG. 20, the second amorphous silicon film 141 is polished by chemical mechanical polishing (CMP) method to flatten the top surface thereof. Using the nitride film 130 that is the first hard mask as the stopper in the CMP, the amount of amorphous silicon polished by CMP can be controlled in a well reproducible manner Referring to FIG. 21, the second amorphous silicon film 141 that is the gate conductive film is etched back to determine the gate length.

Figure 22:
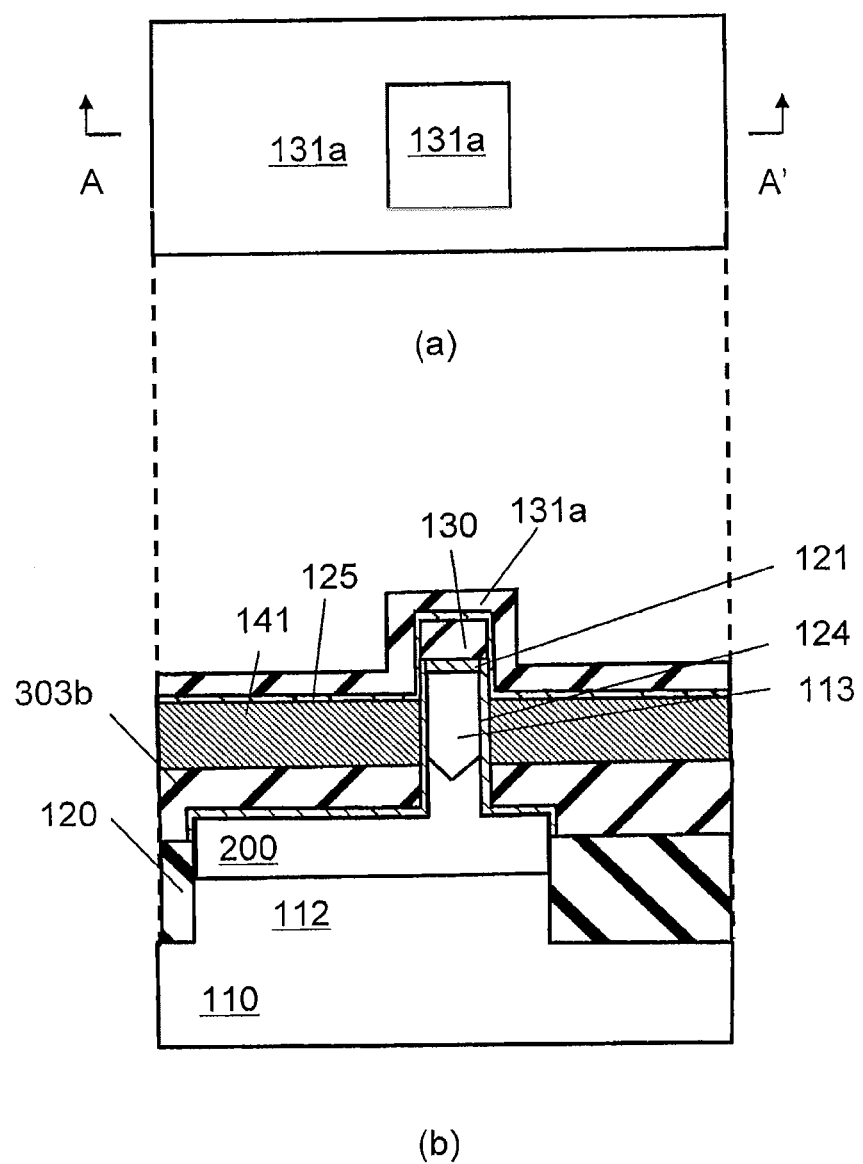
FIG. 22 is a drawing explaining an exemplary production process of the semiconductor device according to a first embodiment, with (a) showing a planar view and (b) showing a cross-sectional view at the line A-A' in (a)

Referring to FIG. 22, a first oxide film 125 is formed on the resultant structure of the above steps and a second nitride film 131a is formed on the first oxide film 125. The first oxide film 125 protects the top surface of the gate electrode 141a from wet or dry treatments performed in later steps, therefore it possible to prevent fluctuation in the gate length, variation in the gate length and damage to the gate insulating film 124 from the top surface of the gate electrode 141a.

Figure 23:
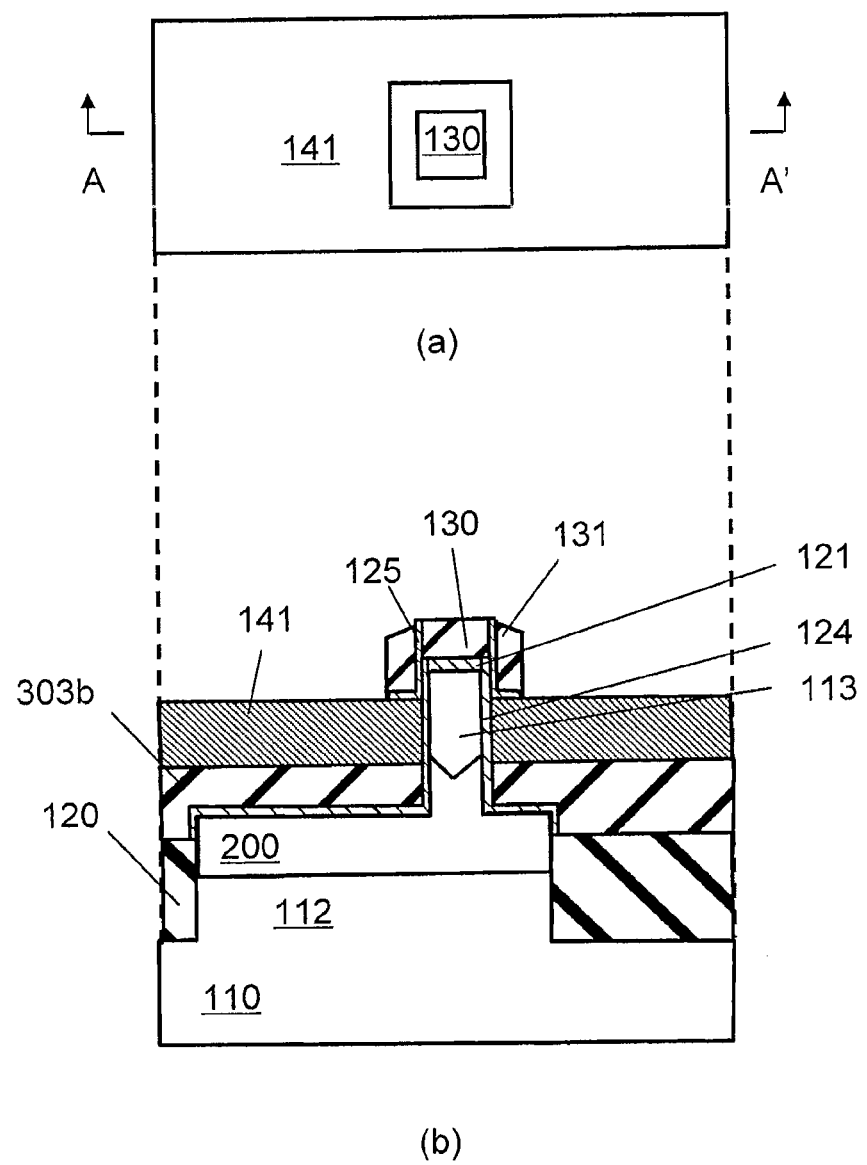
FIG. 23 is a drawing explaining an exemplary production process of the semiconductor device according to a first embodiment, with (a) showing a planar view and (b) showing a cross-sectional view at the line A-A' in (a)

Referring to FIG. 23, the second nitride film 131a is etched back to form a third insulating film sidewall 131. Here, the first oxide film 125 is also etched. The thickness of the third insulating film sidewall 131 corresponds to the thickness of the gate electrode 141a. Therefore, it possible to form a gate electrode having a desired thickness by adjusting the thickness of the second nitride film 131a and etch-back conditions thereof.

Figure 24:
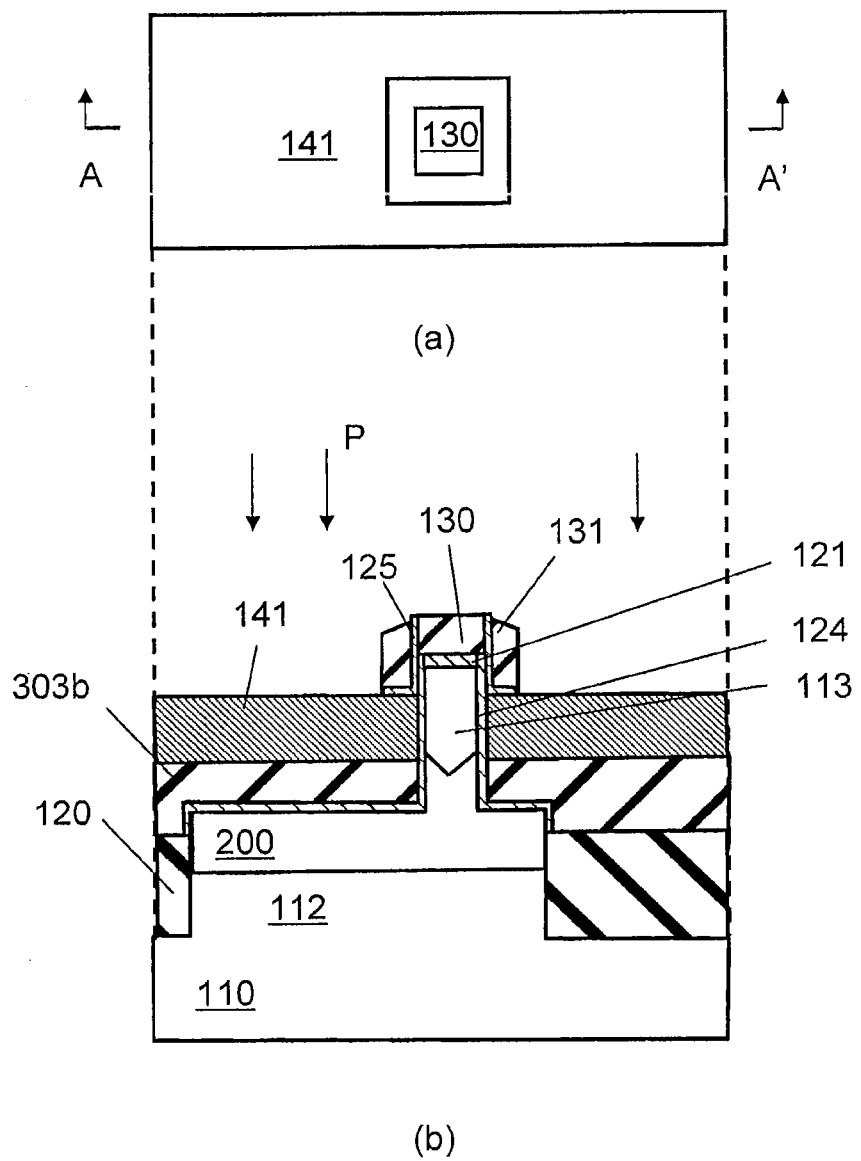
FIG. 24 is a drawing explaining an exemplary production process of the semiconductor device according to a first embodiment, with (a) showing a planar view and (b) showing a cross-sectional view at the line A-A' in (a)

Referring to FIG. 24, a dopant such as phosphorus (P) is implanted in the second amorphous silicon film (gate conductive film) 141, and then the implanted dopant is activated.

Figure 25:
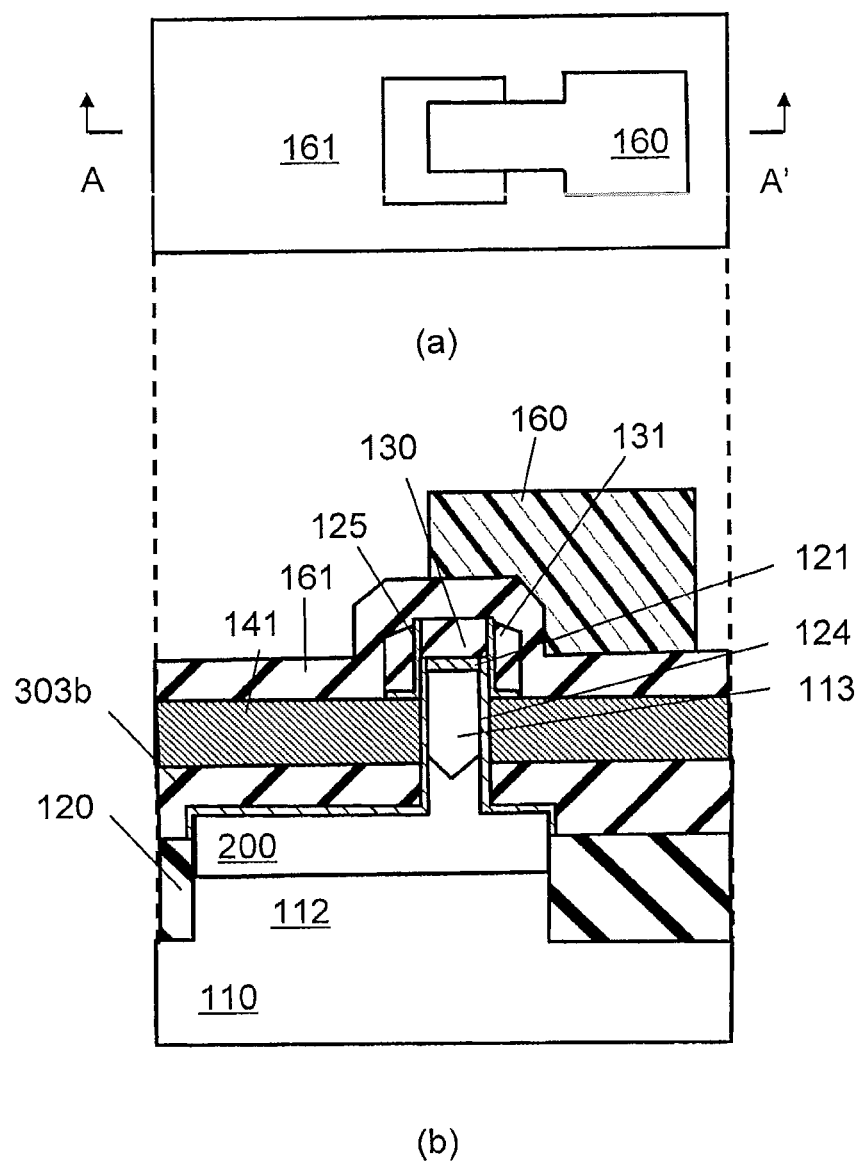
FIG. 25 is a drawing explaining an exemplary production process of the semiconductor device according to a first embodiment, with (a) showing a planar view and (b) showing a cross-sectional view at the line A-A' in (a)

Referring to FIG. 25, an antireflection coating (BARC) layer 161 is formed on the resultant structure of the above steps and a resist is applied, and a resist pattern 160 corresponding to the pattern of the gate wiring which is to be formed in a later step is formed by patterning this resist using lithography techniques.

Figure 26:
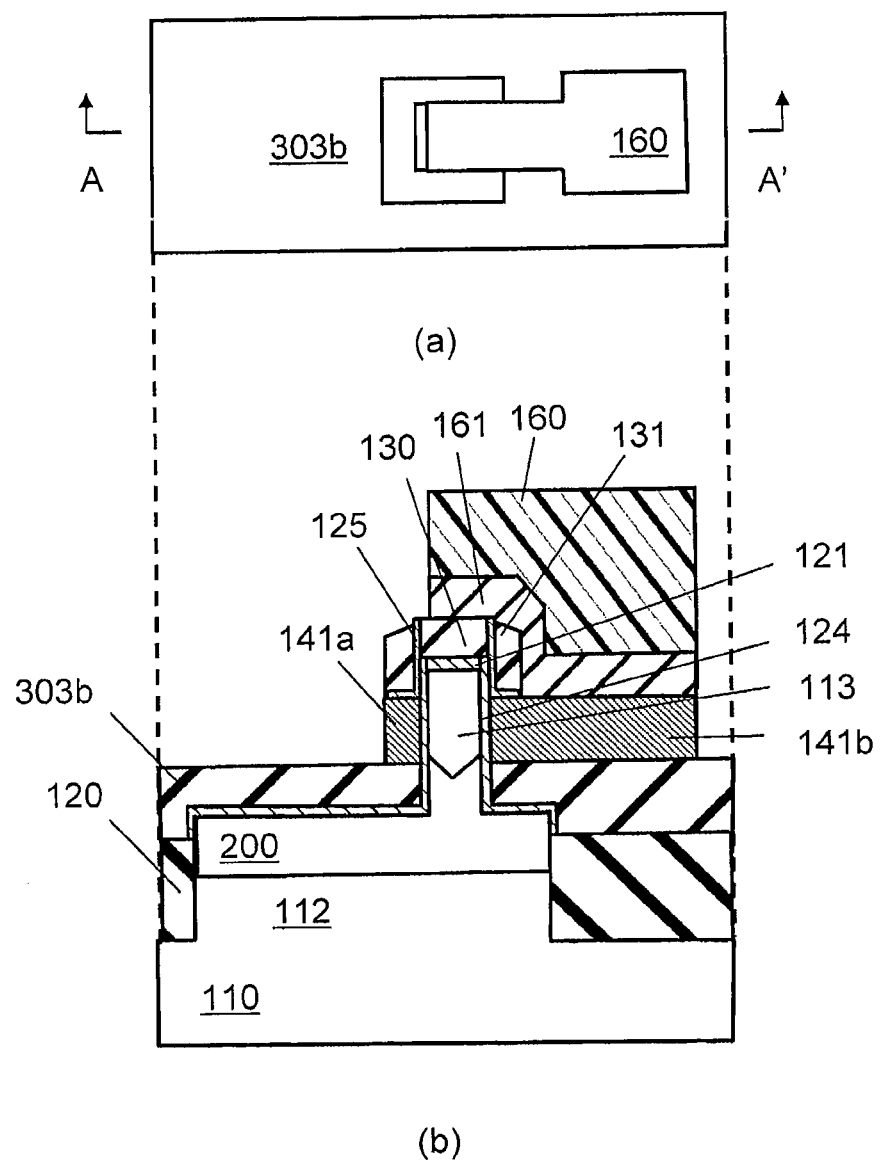
FIG. 26 is a drawing explaining an exemplary production process of the semiconductor device according to a first embodiment, with (a) showing a planar view and (b) showing a cross-sectional view at the line A-A' in (a)

Referring to FIG. 26, the BARC layer 161 and the second amorphous silicon film 141 are etched using the resist pattern 160 as a mask to form the gate electrode 141a and the gate wire 141b.

Figure 27:
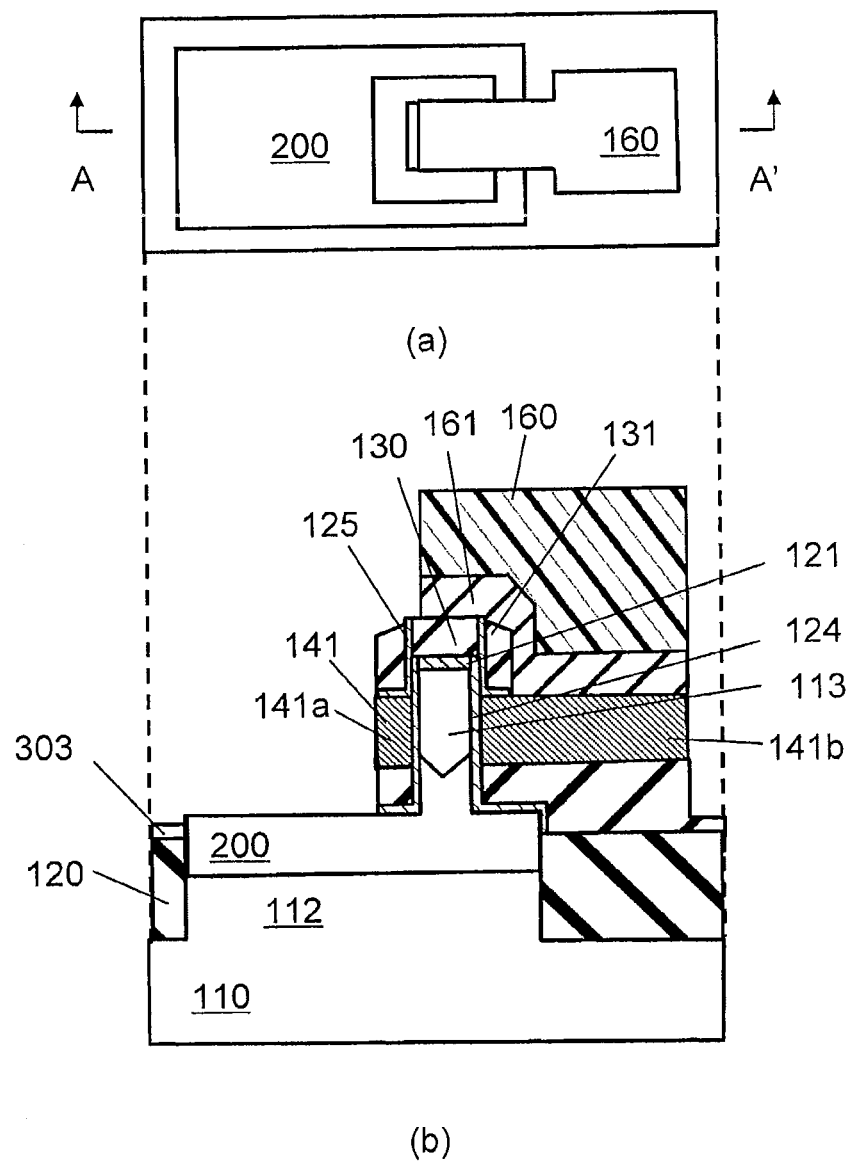
FIG. 27 is a drawing explaining an exemplary production process of the semiconductor device according to a first embodiment, with (a) showing a planar view and (b) showing a cross-sectional view at the line A-A' in (a)

Referring to FIG. 27, part of the insulating film 303b is removed by dry or wet etching to expose the surface of the source diffusion layer 200 and form the first insulating film 303.

Figure 28:
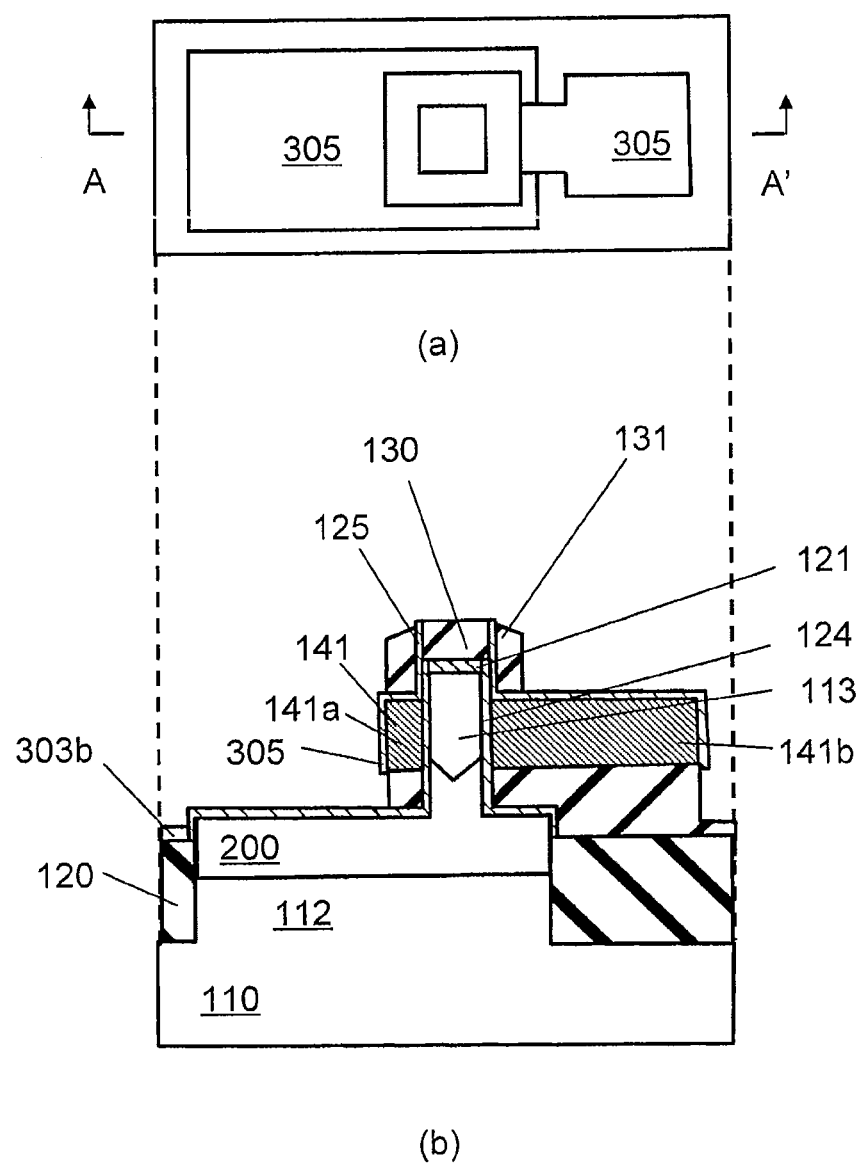
FIG. 28 is a drawing explaining an exemplary production process of the semiconductor device according to a first embodiment, with (a) showing a planar view and (b) showing a cross-sectional view at the line A-A' in (a)

Referring to FIG. 28, the resist pattern 160 and the BARC layer 161 are removed. Next, a fourth oxide film 305 is formed on the exposed surface of the gate electrode 141a and gate wire 141b. The fourth oxide film 305 can protect the gate electrode during a later step of removing the first nitride film 130 and the third insulating film sidewall 131.

Figure 29:
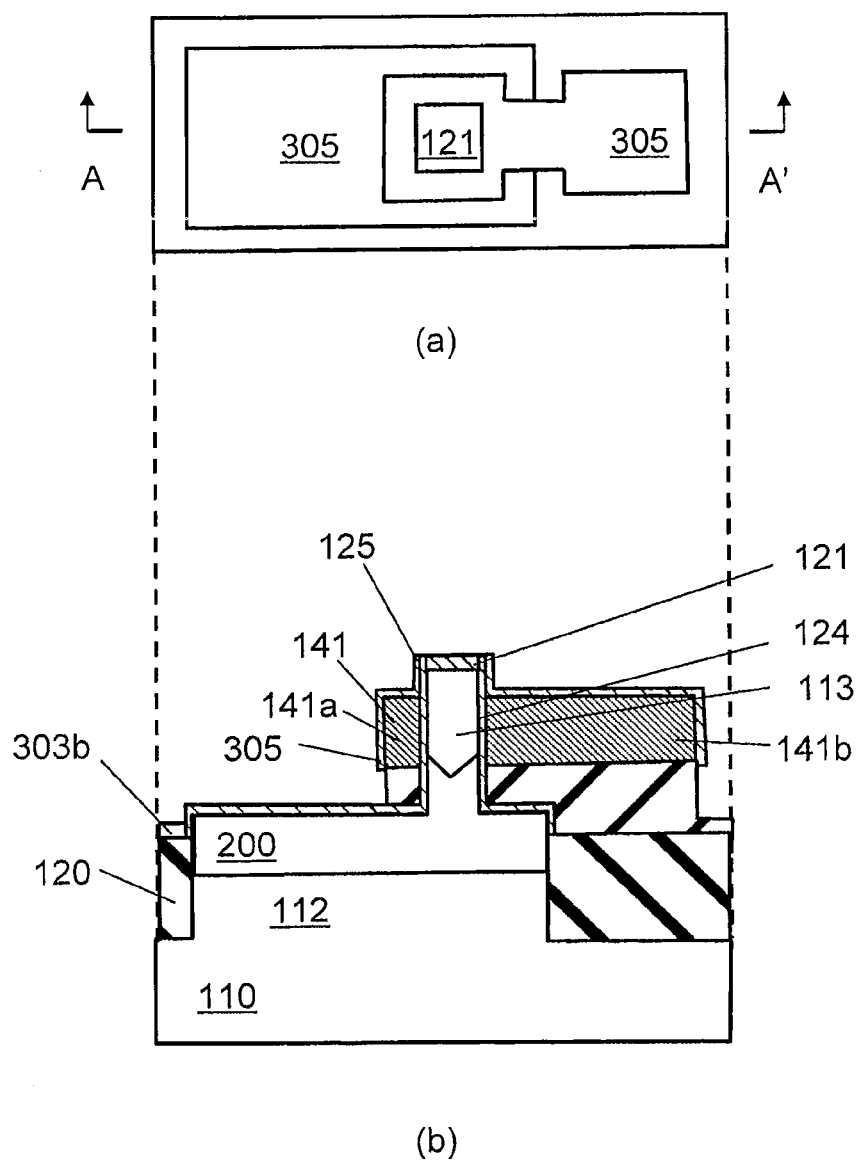
FIG. 29 is a drawing explaining an exemplary production process of the semiconductor device according to a first embodiment, with (a) showing a planar view and (b) showing a cross-sectional view at the line A-A' in (a)

Referring to FIG. 29, the first nitride film 130 and the third insulating film sidewall 131 on the columnar silicon layer 113 are removed by dry or wet etching.

Figure 30:
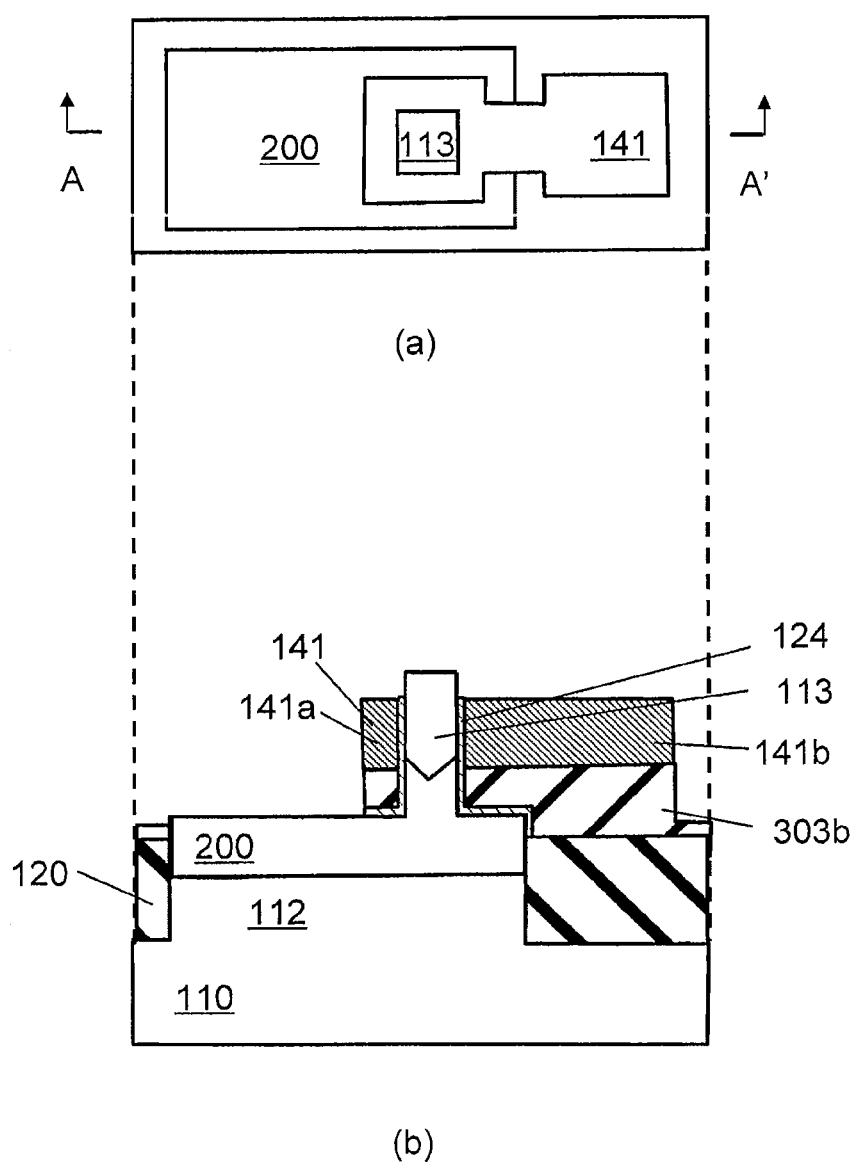
FIG. 30 is a drawing explaining an exemplary production process of the semiconductor device according to a first embodiment, with (a) showing a planar view and (b) showing a cross-sectional view at the line A-A' in (a)

Referring to FIG. 30, the pad oxide film 121, the first oxide film 125, and the fourth oxide film 305 are removed by dry or wet etching to expose the source diffusion layer 200.

Figure 31:
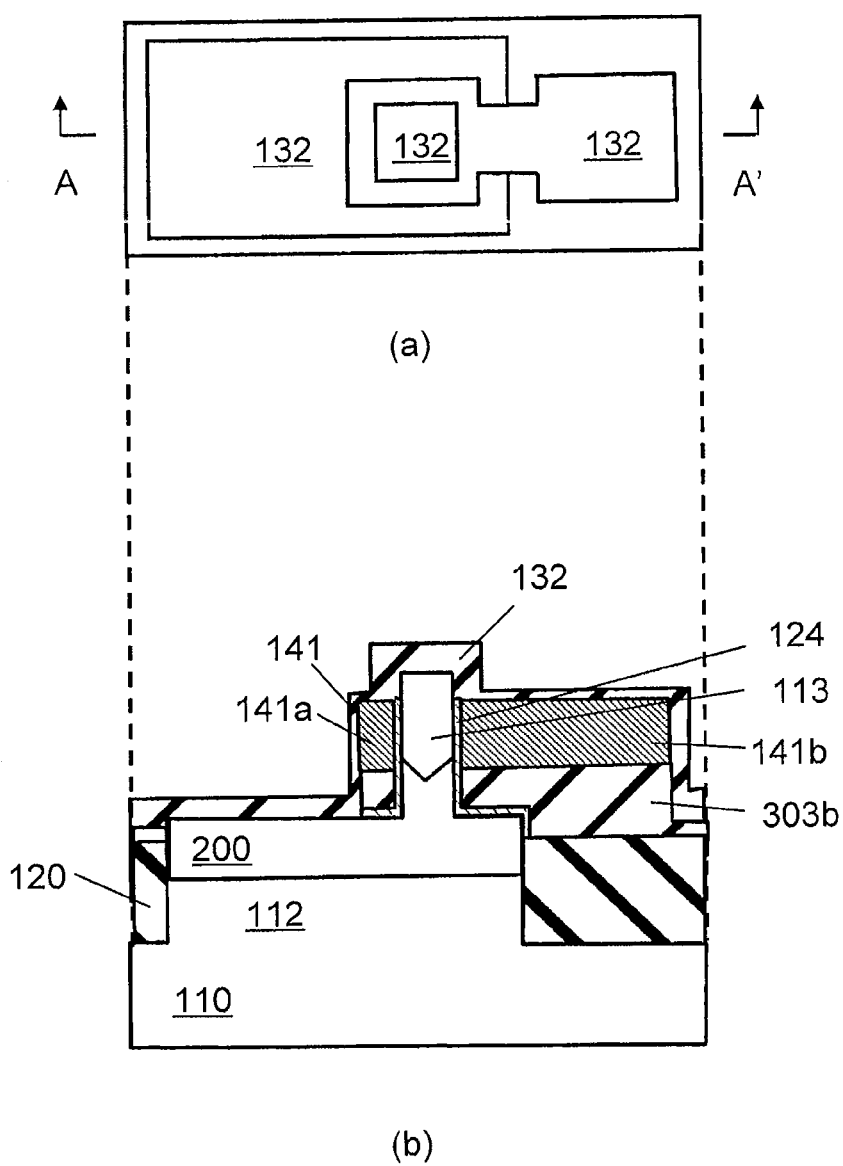
FIG. 31 is a drawing explaining an exemplary production process of the semiconductor device according to a first embodiment, with (a) showing a planar view and (b) showing a cross-sectional view at the line A-A' in (a)

Referring to FIG. 31, a third insulating film 132 is formed on the resultant structure of the above steps.

Figure 32:
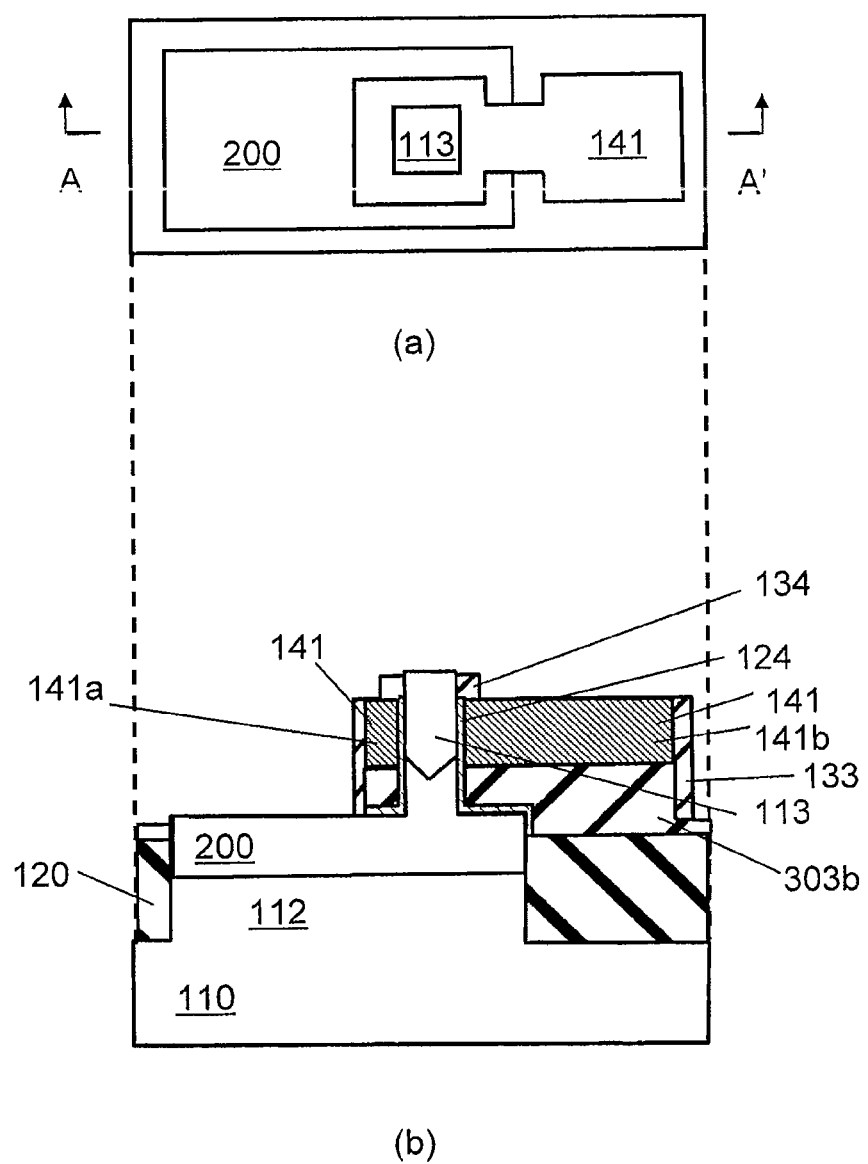
FIG. 32 is a drawing explaining an exemplary production process of the semiconductor device according to a first embodiment, with (a) showing a planar view and (b) showing a cross-sectional view at the line A-A' in (a)

Referring to FIG. 32, the third insulating film 132 is etched back to expose the top surface of the source diffusion layer 200 and the top surface of the columnar silicon layer 113. In this step, the third insulating film 132 remains in sidewall shape on the sidewall of the columnar silicon layer 113 and the sidewalls of the gate electrode 141a and gate wire 141b to form a first insulating film sidewall 134 and a second insulating film sidewall 133. The first insulating film sidewall 134 separates the gate electrode 141a and gate wire 141b from the drain diffusion layer 201 which is to be formed later in the upper part of the first columnar silicon layer 113. And, the second insulating film sidewall 133 separates the gate electrode 141a and gate wire 141b from the source diffusion layer 200. Therefore, short circuit between the gate electrode 141a and gate wire 141b and the source diffusion layer 200 due to metal-semiconductor compounds formed in subsequent steps can be prevented. And, short circuit between the gate electrode 141a and gate wire 141b and the drain diffusion layer 201 due to metal-silicon compounds formed in subsequent steps can be also prevented. The upper sidewall of the columnar silicon layer 113 is covered with the first insulating film sidewall 134, thereby it is possible to prevent the formation of metal-silicon compounds in the sidewall of the columnar silicon layer 113.

Figure 33:
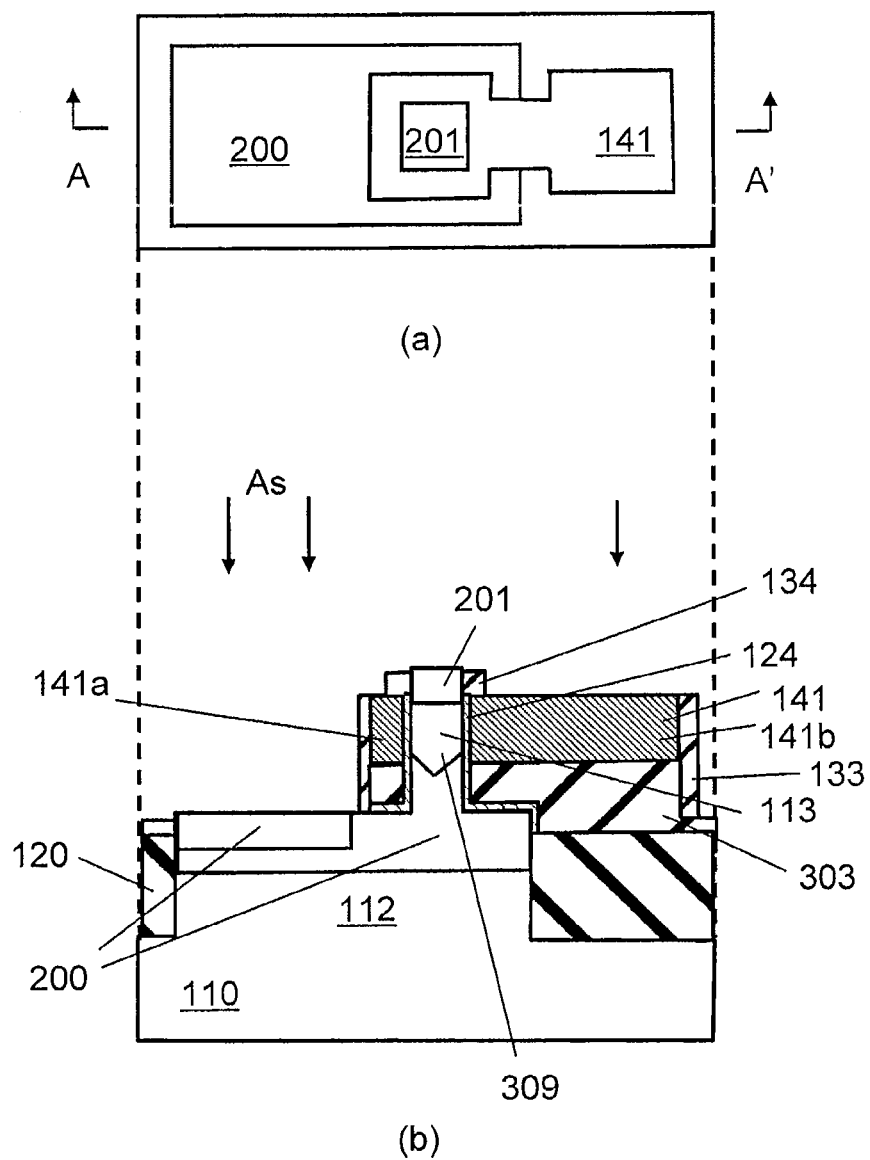
FIG. 33 is a drawing explaining an exemplary production process of the semiconductor device according to a first embodiment, with (a) showing a planar view and (b) showing a cross-sectional view at the line A-A' in (a)

Referring to FIG. 33, a dopant such as P or As is implanted into the upper part of the columnar silicon layer 113 by a common method of dopant implantation to form a drain diffusion layer 201. A body 309 is formed between the source diffusion layer 200 and the drain diffusion layer 201.

Figure 34:
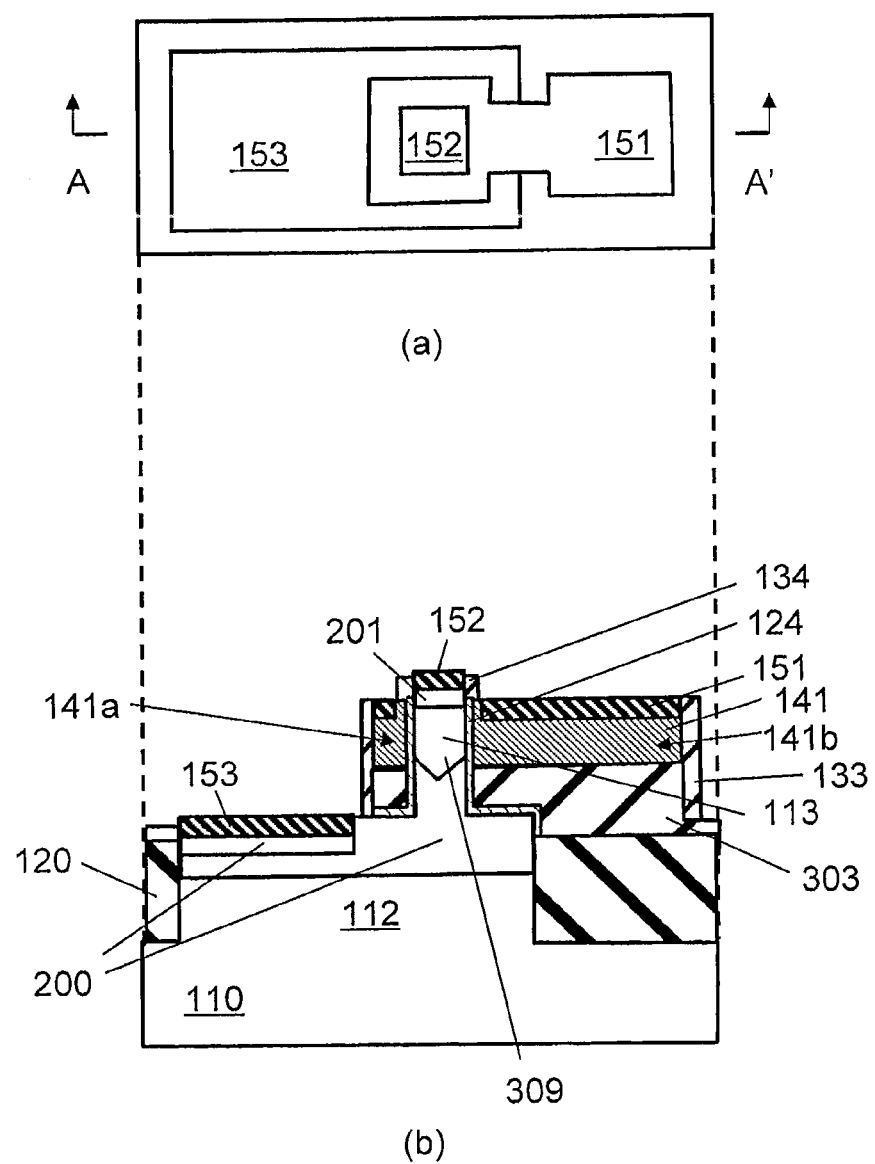
FIG. 34 is a drawing explaining an exemplary production process of the semiconductor device according to a first embodiment, with (a) showing a planar view and (b) showing a cross-sectional view at the line A-A' in (a)

Referring to FIG. 34, a first metal film is formed on the resultant structure of the above steps by sputtering metal such as Ni or Co. Then, the substrate is treated with heat to produce a metal-semiconductor compound on the surfaces of the source diffusion layer 200 and drain diffusion layer 201. Any un-reacted metal film is removed to form a metal-semiconductor compound layer 152 on the drain diffusion layer 201 and a metal-semiconductor compound layer 153 on the source diffusion layer 200. In this step, a metal-silicon compound layer 151 is also formed in the top parts of the gate electrode 141a and gate wire 141b surrounding the columnar silicon layer 113.

With a metal-silicon compound layer 151 being formed on the gate electrode 141a surrounding the columnar silicon layer 113, the parasitic resistance of the gate electrode 141a is reduced.

Figure 35:
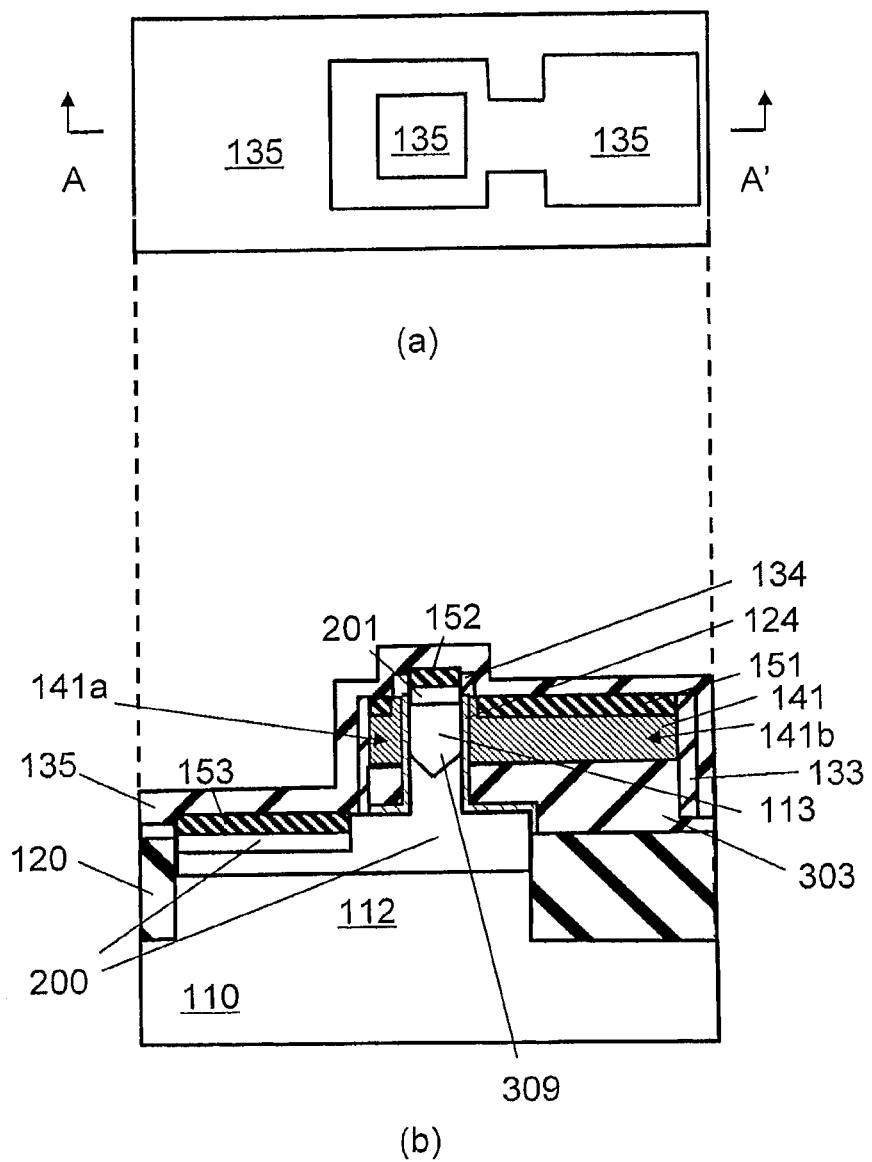
FIG. 35 is a drawing explaining an exemplary production process of the semiconductor device according to a first embodiment, with (a) showing a planar view and (b) showing a cross-sectional view at the line A-A' in (a)

Referring to FIG. 35, a contact stopper film 135 such as a nitride film is formed on the resultant structure of the above steps.

Figure 36:
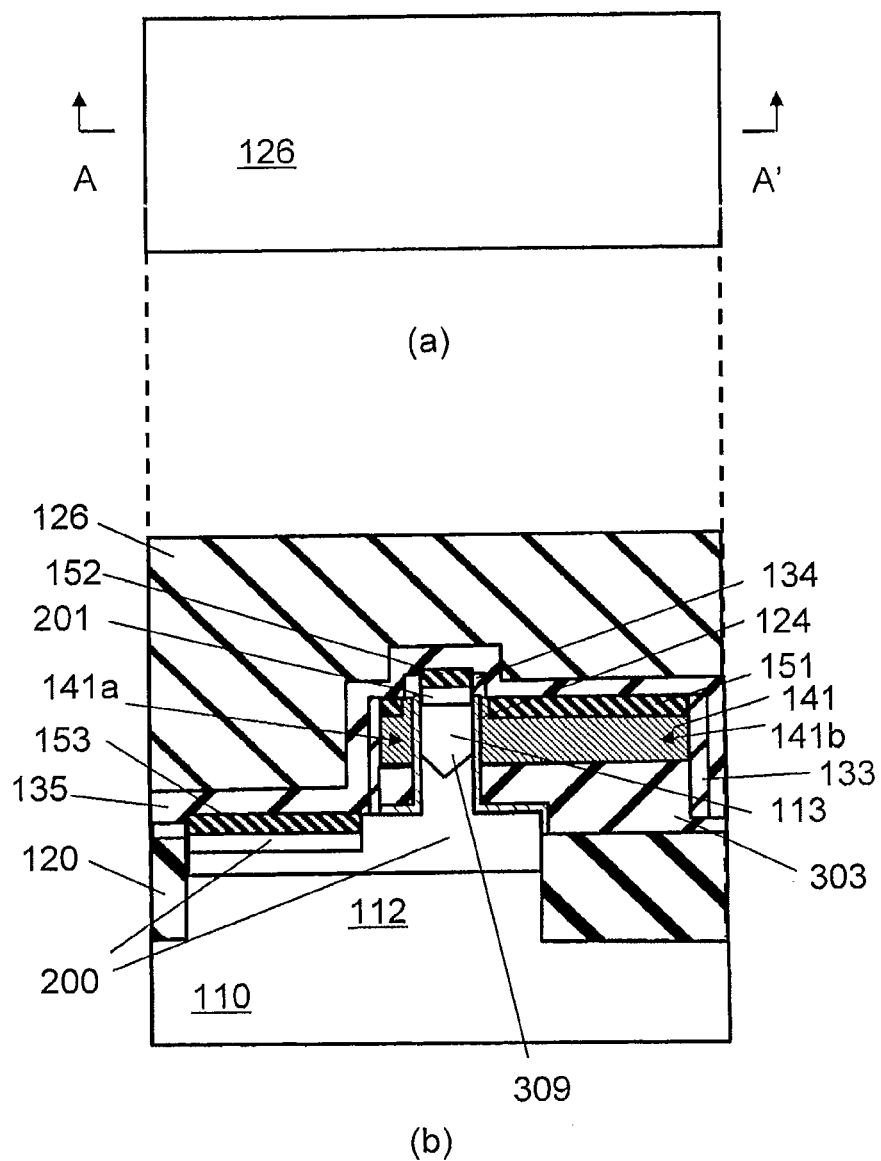
FIG. 36 is a drawing explaining an exemplary production process of the semiconductor device according to a first embodiment, with (a) showing a planar view and (b) showing a cross-sectional view at the line A-A' in (a)

Referring to FIG. 36, a contact interlayer film 126 such as an oxide film is formed so as to immerse the resultant structure of the above steps, and then is flattened by CMP.

Figure 37:
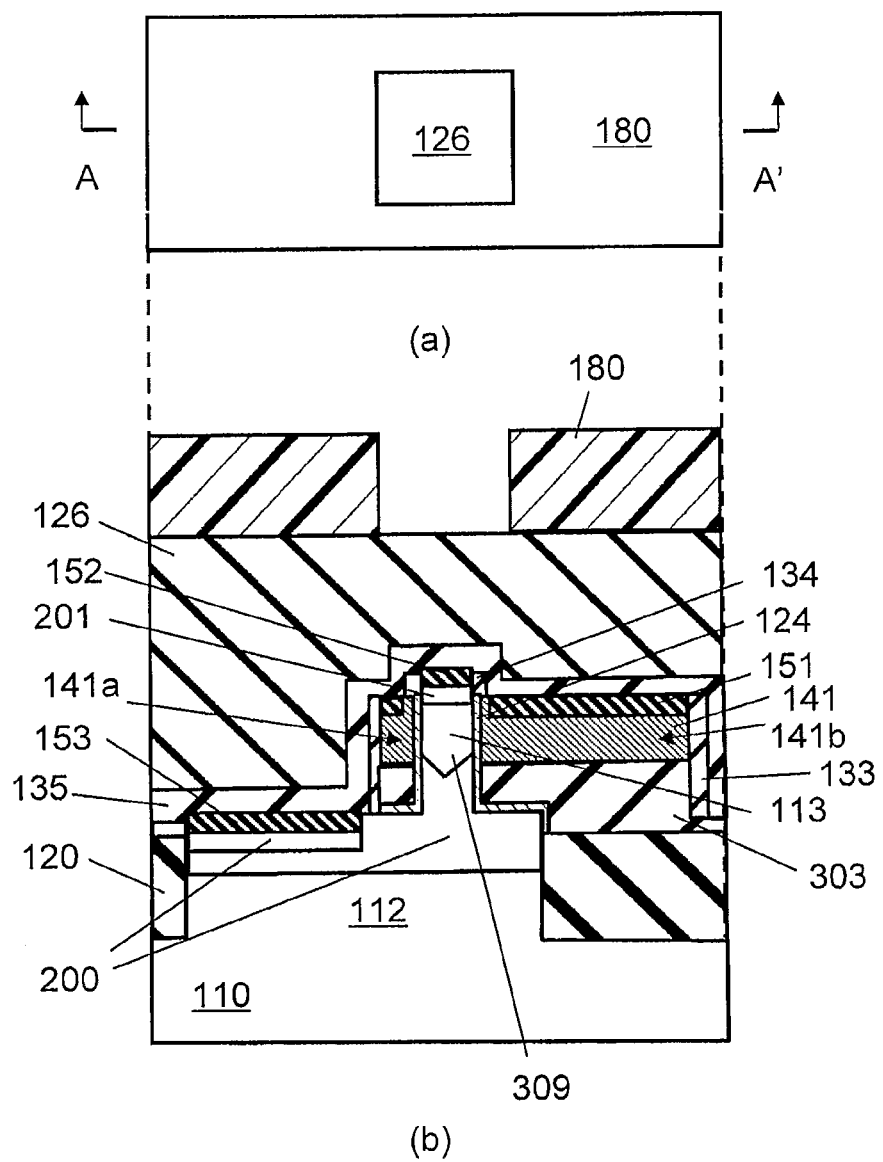
FIG. 37 is a drawing explaining an exemplary production process of the semiconductor device according to a first embodiment, with (a) showing a planar view and (b) showing a cross-sectional view at the line A-A' in (a)

Referring to FIG. 37, the first resist is applied to the top of the contact interlayer film 126. Then, the applied first resist is patterned using lithography to form a first pattern 180 corresponding to the area where a contact layer is to be formed on the top of the columnar silicon layer 113.

Figure 38:
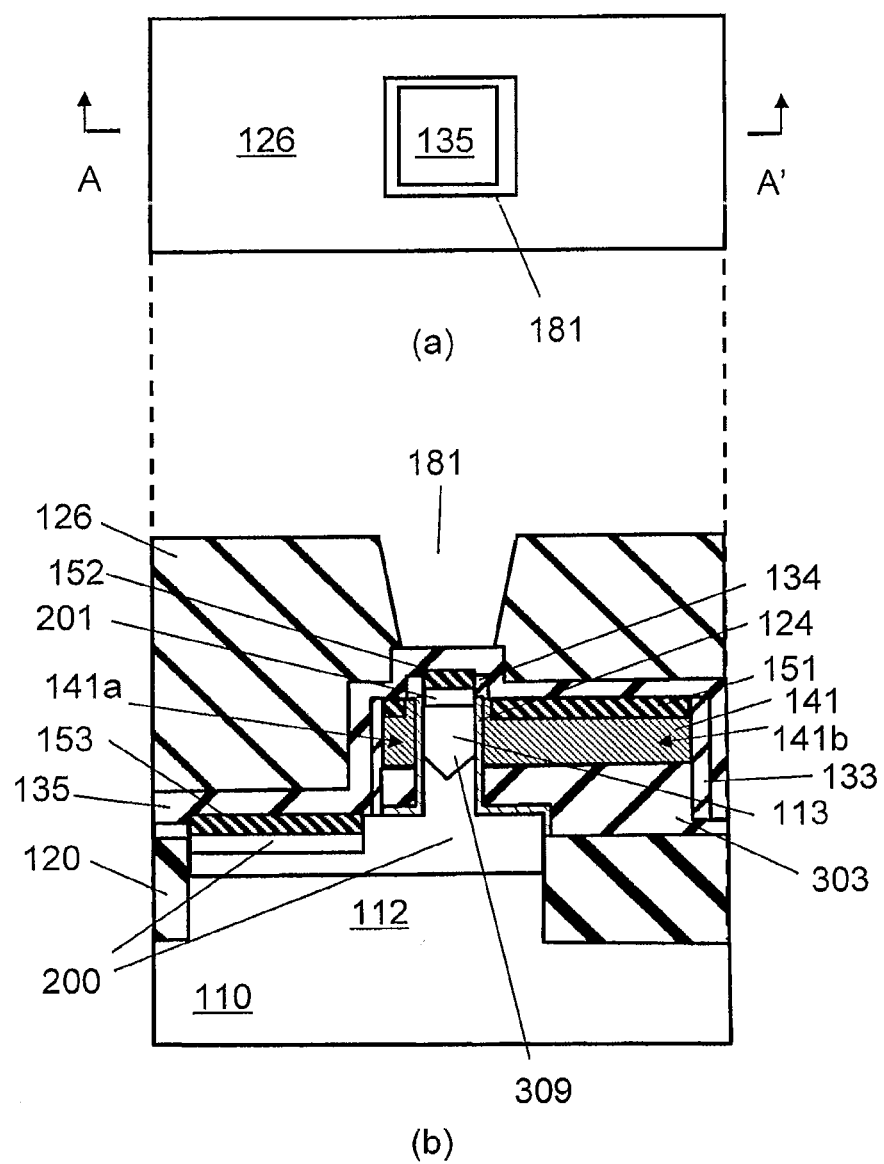
FIG. 38 is a drawing explaining an exemplary production process of the semiconductor device according to a first embodiment, with (a) showing a planar view and (b) showing a cross-sectional view at the line A-A' in (a)

Referring to FIG. 38, the contact interlayer film 126 is etched using the first pattern 180 to form a first contact hole 181 for a contact layer (first contact layer) on the columnar silicon layer 113. The shape of the first contact hole 181 will be described later. By using the etching condition with a high selectivity ratio between the contact interlayer film 126 that is an oxide film and the contact stopper film 135 that is a nitride film, it is possible to stop etching at the contact stopper film 135.

Figure 39:
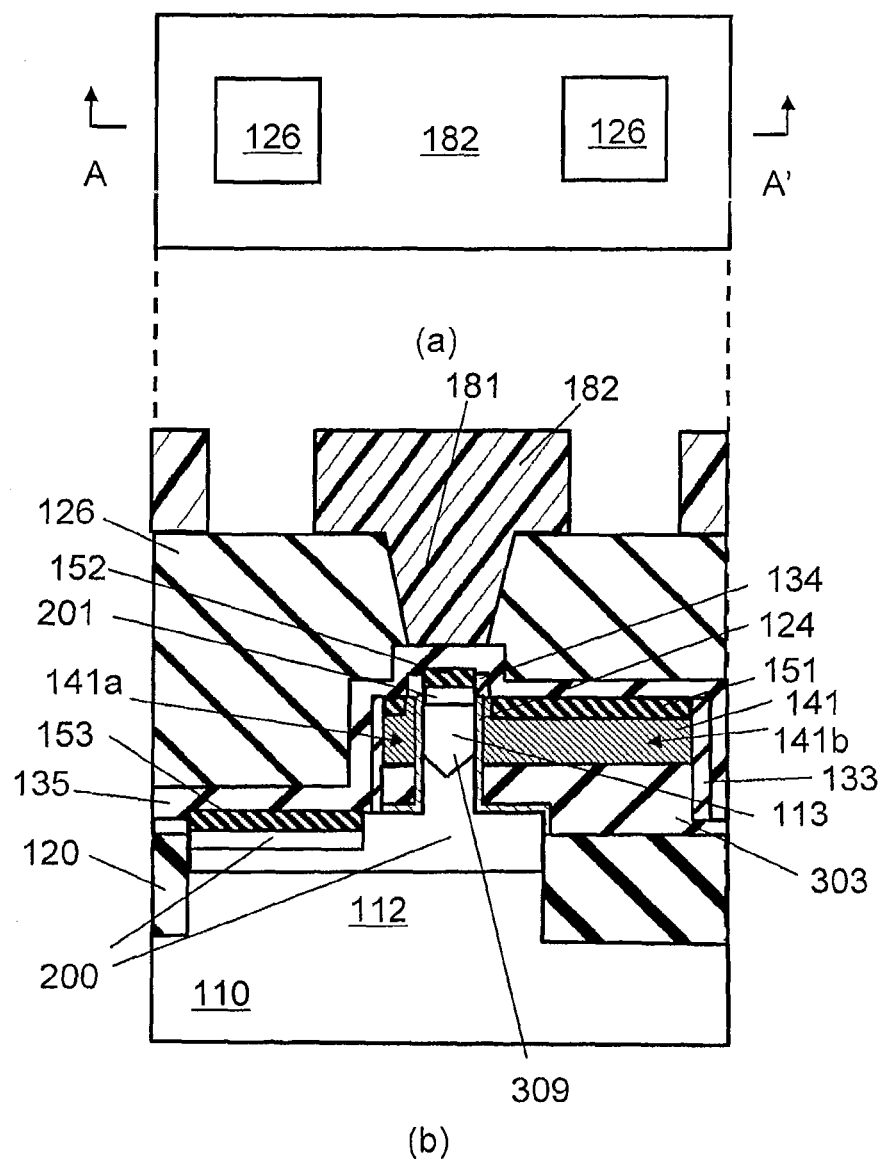
FIG. 39 is a drawing explaining an exemplary production process of the semiconductor device according to a first embodiment, with (a) showing a planar view and (b) showing a cross-sectional view at the line A-A' in (a)

Referring to FIG. 39, a second resist is applied to the resultant structure of the above steps. Then, the applied second resist is patterned using lithography to form a second pattern 182 corresponding to the area where the contact layer (second contact layer) is to be formed on the planar silicon layer and the area where the contact layer (third contact layer) is to be formed on the gate wire 141b.

Figure 40:
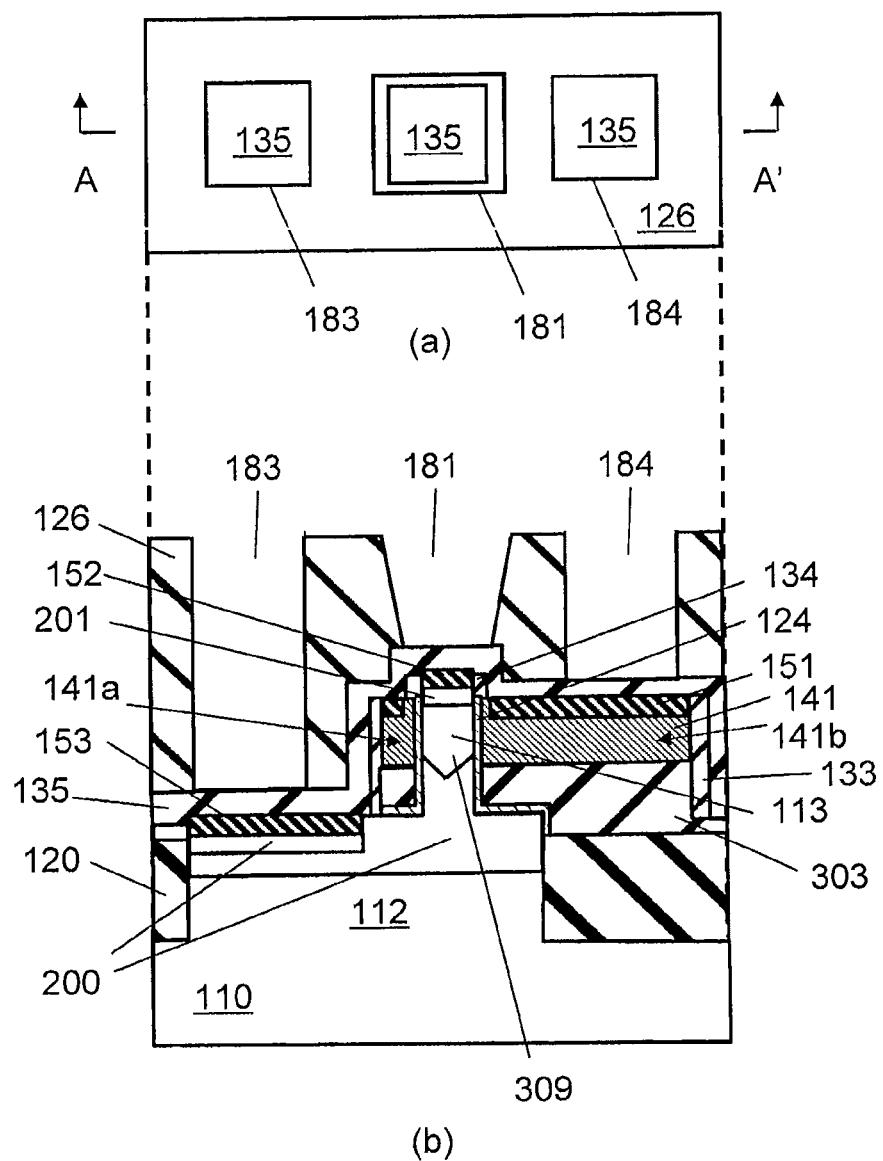
FIG. 40 is a drawing explaining an exemplary production process of the semiconductor device according to a first embodiment, with (a) showing a planar view and (b) showing a cross-sectional view at the line A-A' in (a)

Referring to FIG. 40, the contact interlayer film 126 is etched using the second pattern 182 to form a second contact hole 183 for a contact layer (second contact layer) on the source diffusion layer 200 of the planar silicon layer 112 and a third contact hole 184 for a contact layer (third contact layer) on the gate wire 141b. Here, if the contact holes 183 and 184 are so formed as to have sidewalls nearly perpendicular to the substrate 110, the deepest contact hole 183 can reliably be opened for the contact layer on the source diffusion layer 200 in the planar silicon layer 112, and the contact resistance of the contact layer formed can be stable. By using etching conditions with a high selectivity ratio between the contact interlayer film 126 and the contact stopper film 135, it is possible to stop etching at the contact stopper film 135.

Figure 41:
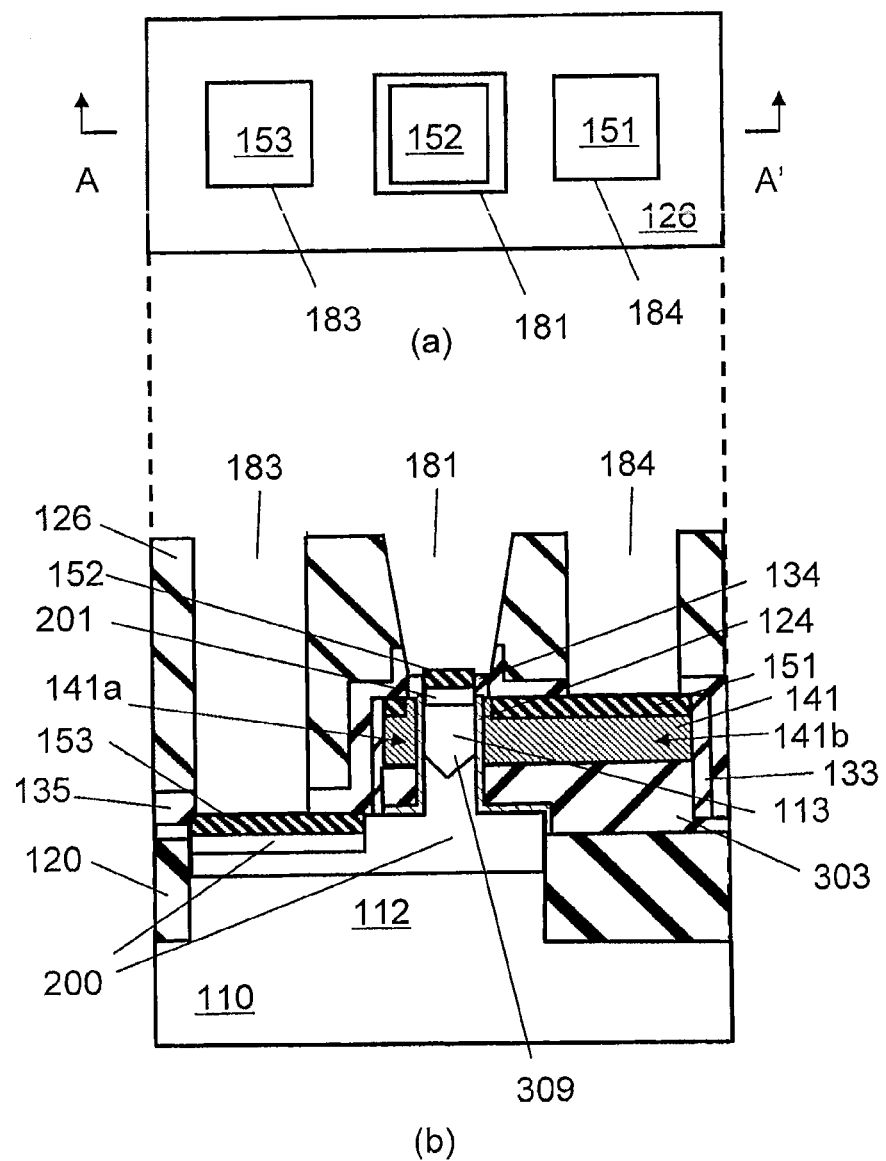
FIG. 41 is a drawing explaining an exemplary production process of the semiconductor device according to a first embodiment, with (a) showing a planar view and (b) showing a cross-sectional view at the line A-A' in (a)

Referring to FIG. 41, the contact stopper film 135 remaining at the bottoms of the first contact hole 181 on the columnar silicon layer 113, the second contact hole 183 on the source diffusion layer 200 of the planar silicon layer 112, and the third contact hole 184 on the gate wire 141b are removed by etching, respectively.

Figure 42:
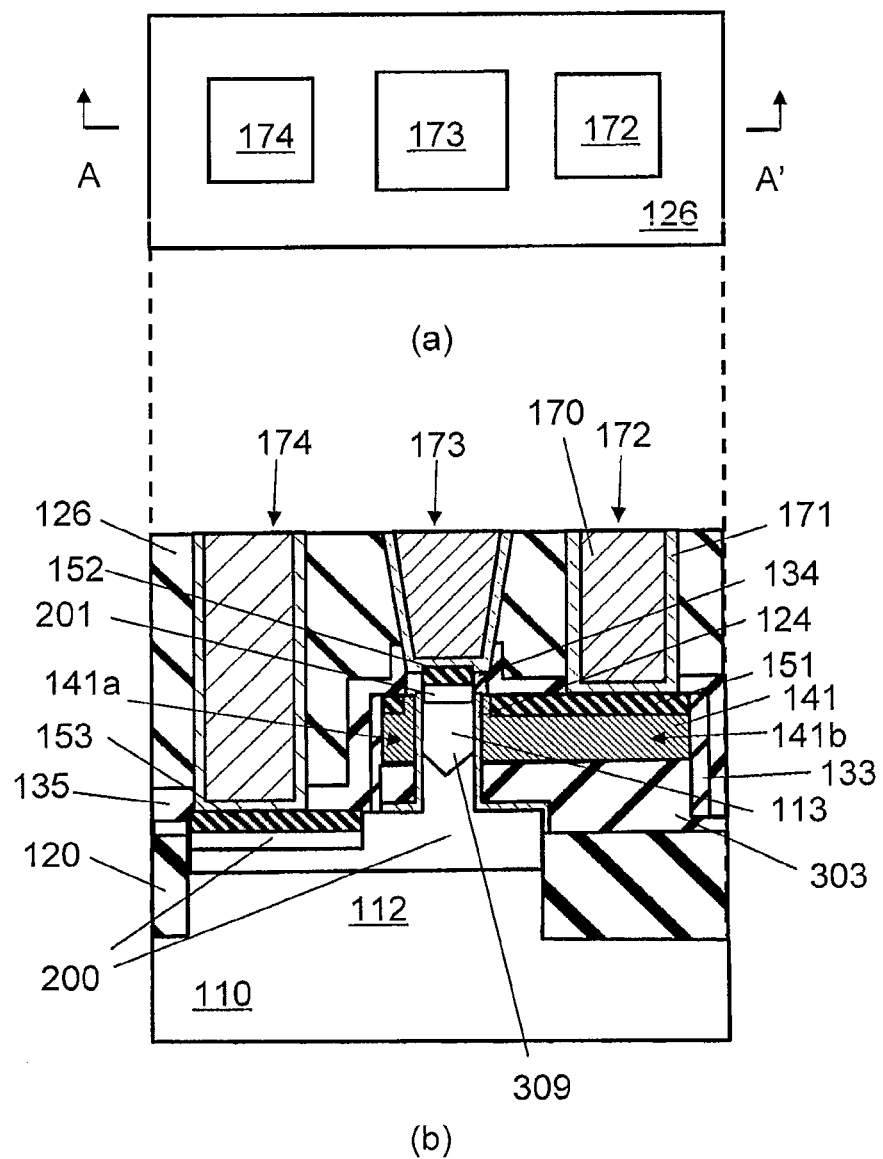
FIG. 42 is a drawing explaining an exemplary production process of the semiconductor device according to a first embodiment, with (a) showing a planar view and (b) showing a cross-sectional view at the line A-A' in (a)

Referring to FIG. 42, a barrier metal layer 171 such as tantalum (Ta) and tantalum nitride (TaN) is formed by applying a barrier metal in the contact holes 181, 183 and 184, and then a metal film 170 is formed by sputtering or plating a metal as copper (Cu). And, a third contact layer 172 is formed on the gate wire 141b, a first contact layer 173 is formed on the columnar silicon layer 113 and a second contact layer 174 is formed on the source diffusion layer 200 of the planar silicon layer 112 by CMP. The barrier metal can be titanium (Ti) or titanium nitride (TiN) or even tungsten (W). Alternatively, a copper-containing alloy can be used as the barrier metal.

Referring to FIGS. 43 and 44, a resist (not shown) is applied. And, the applied resist is patterned using lithography to form a pattern corresponding to the area where the first layer wires 177, 178, and 179 are to be formed. Then, a barrier metal layer 175 and a metal layer 176 are formed using this pattern. Through this step, the first layer wires 177, 178 and 179 are formed.

In the above production method, the third contact hole 184 on the gate wire 141b is formed in the same step as the second contact hole 183 on the planar silicon 112, but the contact hole 184 on the gate wire 141b may be formed in the same step as the contact hole 181 on the columnar silicon layer 112.

The relationship in shape between the contact layer 173 on the columnar silicon layer 113 and the upper part of the columnar silicon layer 113 in the present embodiment will be described in detail hereafter. In an SGT as used in the present embodiment, short channel effect can be prevented more effectively as the columnar silicon layer 113 is smaller. Accordingly, the columnar silicon layer 113 is patterned with a mostly minimum size by lithography. The columnar silicon layer 113 is then reduced in size in dimensional shrinkage during etching and sacrificial oxidation. Consequently, the final size of the columnar silicon layer 113 is smaller than the minimum patternable size. Accordingly, the bottom of the contact layer 173 on the columnar silicon layer 113 is often larger in size than the upper part of the columnar silicon layer 113.

Figure 45A:
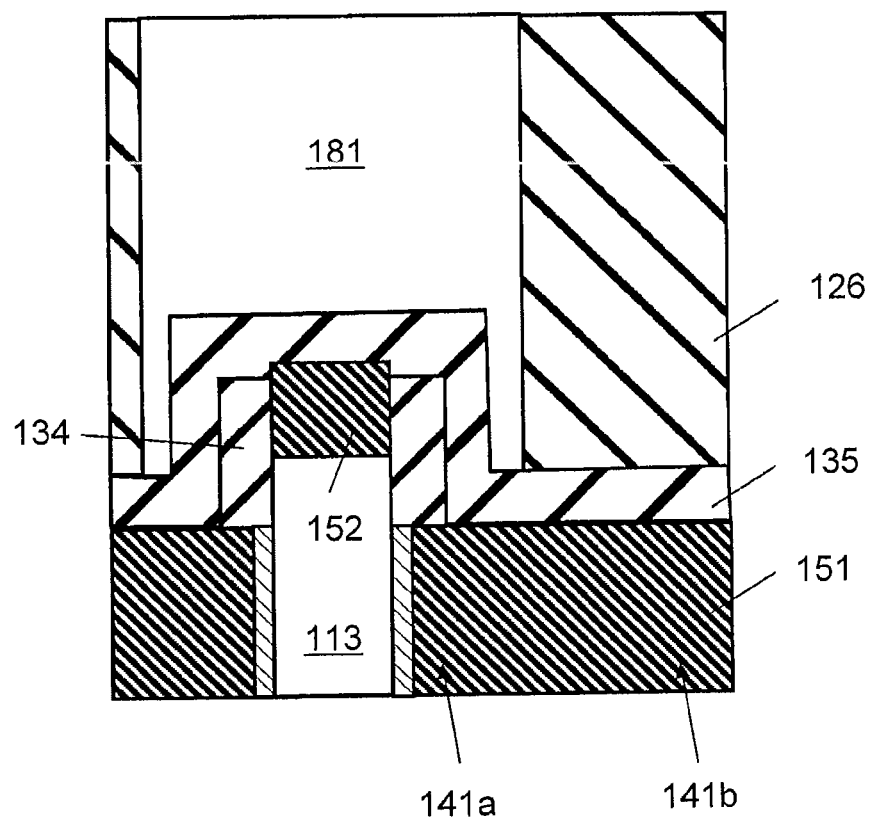
FIG. 45A is a cross-sectional view showing the upper part of the columnar silicon layer in a semiconductor device according to a comparison example.
Figure 45B:
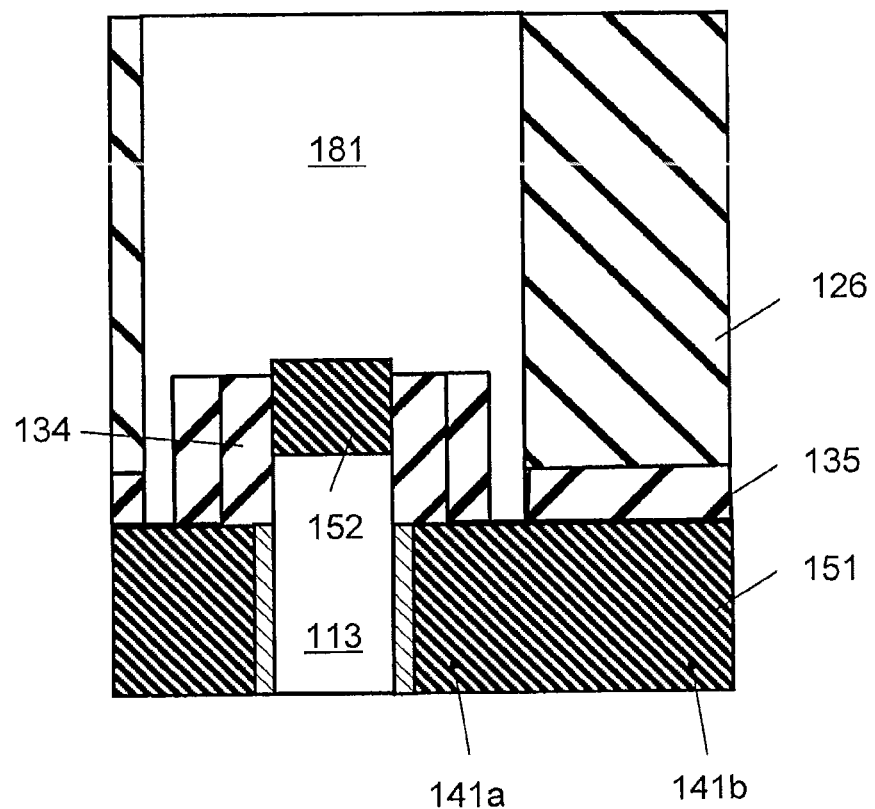
FIG. 45B is a cross-sectional view showing the upper part of the columnar silicon layer in a semiconductor device according to a comparison example.

FIGS. 45A and 45B show cross-sectional views around the upper part of the columnar silicon layer 113 after the contact interlayer film 126 is etched. FIGS. 45A and 45B show comparison examples of the semiconductor device according to the first embodiment and the production method thereof in order to explain the semiconductor device of the first embodiment and production method thereof.

As shown in FIG. 45A, the bottom of the first contact hole 181 is larger in size than the top surface of the contact stopper film 135 formed on the top part and side surface of the columnar silicon layer 113. In this comparison example, the first contact hole 181 on the columnar silicon layer 113 reaches the surface of the gate wire 141b after etching the contact stopper film 135 as shown in FIG. 45B. That leads to a short circuit between the first contact layer 173 and the gate wire 141b. Therefore, in order to prevent short circuit between the gate wire 141b and the first contact layer 173 on the columnar silicon layer 113, the bottom of the first contact layer 173 must be smaller in size than the top surface of the contact stopper film 135 formed on the top part and upper sidewall of the columnar silicon layer 113.

Figure 46A:
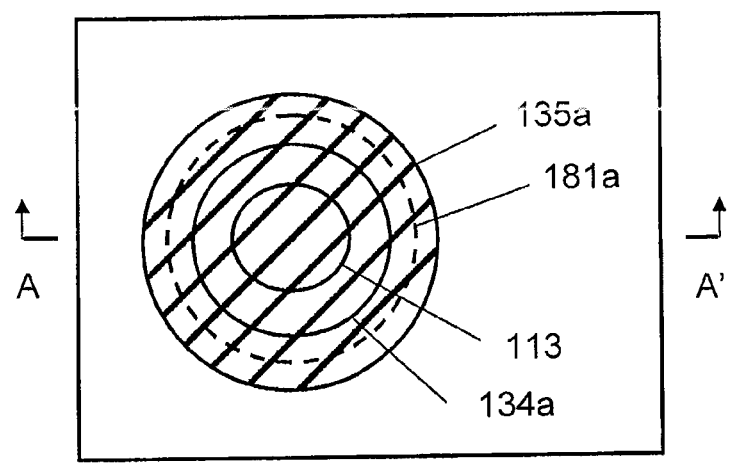
FIG. 46A is a plane view around the columnar silicon layer of a semiconductor device according to a first embodiment.

FIGS. 46A to 48C are enlarged views around the upper part of the columnar silicon layer 113 after the contact interlayer film 135 is etched. FIGS. 46A and 47A are plane schematic diagrams. FIGS. 46B and 46C are enlarged cross-sectional views around the upper part of the columnar silicon layer 113 along a cut line A-A' in FIG. 46A. FIGS. 47B, 47C and 48A to 48C are enlarged cross-sectional views around the upper part of the columnar silicon layer 113 along the cut line A-A' in FIG. 47A. FIGS. 46A and 47A are planar schematic diagrams, but hatching is applied in some parts in order to differentiate the areas.

Figure 46B:
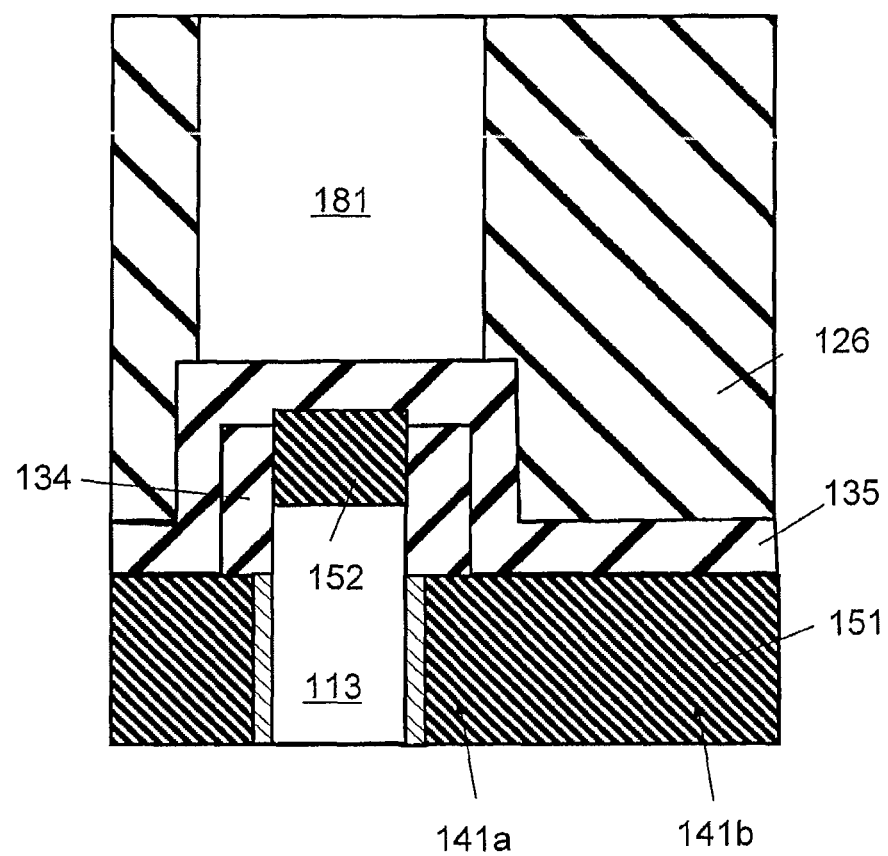
FIG. 46B is a cross-sectional view of the upper part of the columnar silicon layer of a semiconductor device according to a first embodiment.

FIGS. 46A and 46B are views around the upper part of the columnar silicon layer 113 when the bottom surface of the contact hole 181 is smaller in size than the top surface of the contact stopper film 135 formed on the top surface and upper sidewall of the columnar silicon layer 113. That is, the projection 181a of the bottom surface of the first contact hole 181 for the first contact layer 173 onto the substrate 110 is within the circumference 135a of the projected profile of the contact stopper film 135 on the substrate 110. The contact stopper film 135 is formed on the top surface and upper side surface of the columnar silicon layer 113. In this case, the film thickness of the contact stopper film 135 is thicker in the vertical direction from the surface of the gate electrode 141a to the bottom surface of the first contact hole 181 for the first contact layer 173 than that of the contact stopper film 135 from the top surface of the columnar silicon layer 113 to the bottom surface of the first contact hole 181. Therefore, short circuit does not easily occur between the gate electrode 141a and the first contact layer 173 even if almost 100% over-etching occurs. Accordingly, the first contact hole 181 is formed so that the projection of the first contact hole 181 onto the substrate 110 is within the circumference of the projected profile onto the substrate 110 of the contact stopper film 135 formed on the top surface and upper sidewall of the columnar semiconductor layer 113.

Figure 46C:
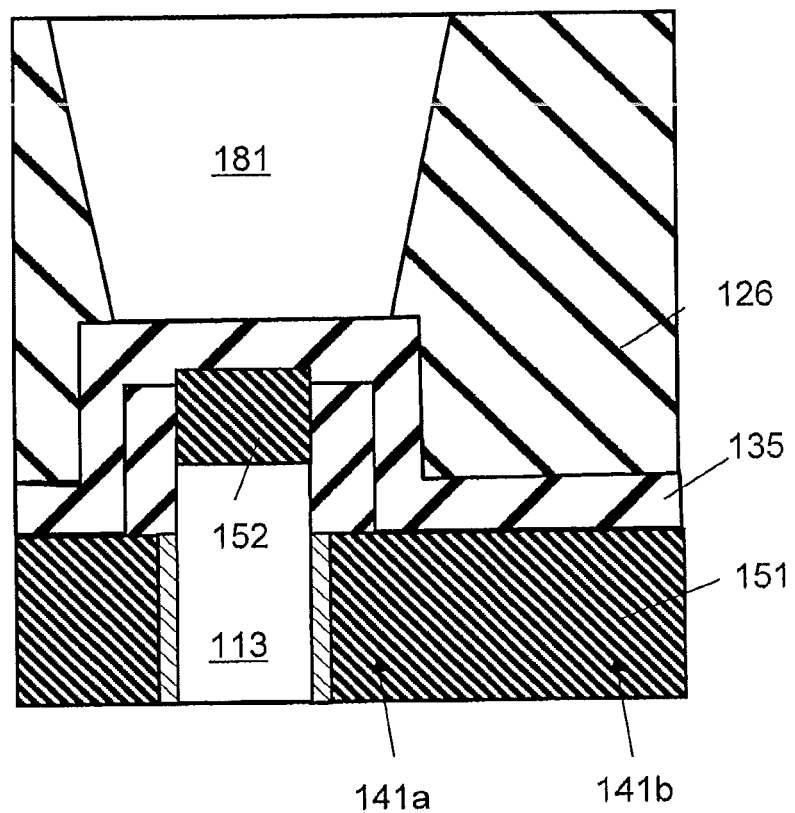
FIG. 46C is a cross-sectional view of the upper part of the columnar silicon layer of a variation of the semiconductor device according to a first embodiment.

A modification of this embodiment is shown in FIG. 46C. As shown in FIG. 46C, by forming the first contact hole 181 so that the bottom surface is smaller than the top surface, it is possible for the projection of the bottom surface of the first contact hole 181 onto the substrate 110 to be within the circumference of the projected profile onto the substrate 110 of the contact stopper film 135 formed on the top surface and upper sidewall of the columnar semiconductor layer 113.

According to this structure, it is possible to prevent short circuits between the first contact layer 173 on the columnar semiconductor layer 113 and the gate electrode 141a formed around the columnar semiconductor layer 113.

Figure 47A:
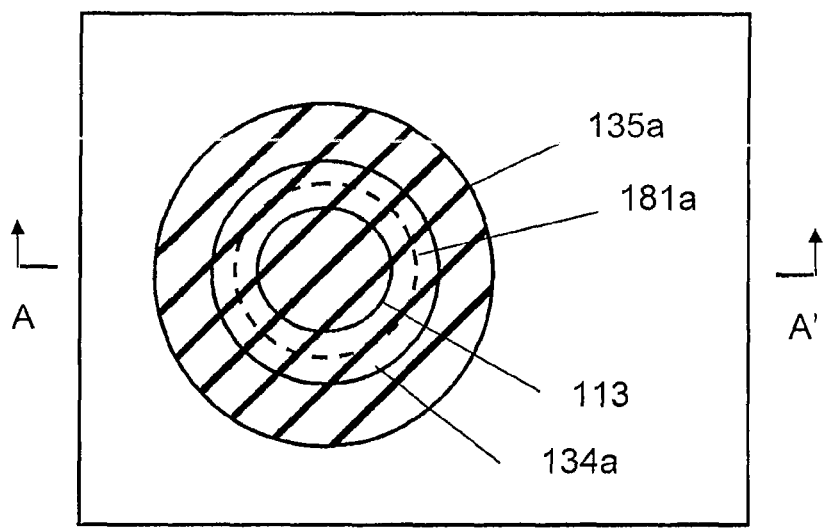
FIG. 47A is a plane view around the columnar silicon layer of a variation of the semiconductor device according to a first embodiment.
Figure 47B:
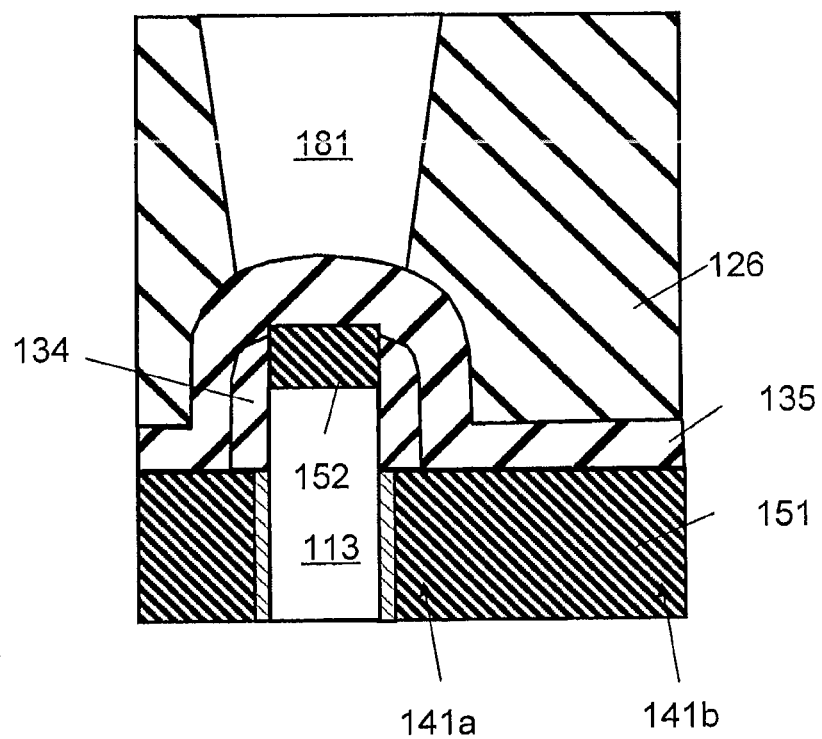
FIG. 47B is a cross-sectional view showing the shape of the upper part of the columnar silicon layer of a variation of the semiconductor device according to a first embodiment.

Another modification of the present embodiment is shown in FIG. 47B. The contact stopper film 135 formed on the top surface and upper sidewall of the columnar semiconductor layer 113 usually has a top surface rounded as shown in FIG. 47B, not right-angled. The etching selectivity ratio is low at the rounded top surface of the contact stopper film 135 when the contact stopper film 135 is composed of a nitride film and the contact interlayer film 126 is composed of an oxide film. Therefore, the contact stopper film 135 may further be etched at the rounded top surface when the contact interlayer film 126 is etched. For this reason, the bottom surface of the first contact hole 181 is made smaller in size than the top surface of the contact stopper film 135 formed on the top part and upper sidewall of the columnar silicon layer 113 and the first contact hole 181 is so formed as to have a bottom surface smaller than the top surface as shown in FIGS. 47A and 47B. As a result, the bottom surface of the contact hole 181 is formed on a relatively flat area of the top surface of the contact stopper film 135, so a high selectivity ratio is obtained between the contact interlayer film 126 and the contact stopper film 135 during the etching of the contact interlayer film 126. This leads to reducing the amount of the contact stopper film 135 etched. According to this structure, it is possible to prevent short circuit between the first contact layer 173 and the gate electrode 141a effectively. Such short circuit can be prevented more effectively as the average inclination of the side surface of the first contact hole 181 is increased. Particularly, when the bottom surface of the first contact hole 181 on the columnar silicon layer 113 is smaller in size than the first insulating film sidewall 134 formed on the upper sidewall of the columnar silicon layer 113, in other words when the projection 181a of the first contact hole 181 onto the substrate 110 is within the circumference 134a of the projected profile of the first insulating film sidewall 134 onto the substrate 110, the bottom surface of the first contact hole 181 is formed in an area where the contact stopper film 135 has a flat top surface. As a result, short circuit between the first contact layer 173 and the gate electrode 141a does not easily occur.

More precisely, even if an attempt is made to form a contact hole having a side surface perpendicular to the substrate 110, the contact hole may have a bottom surface slightly smaller than the top surface because of the property of etching, and thus the bottom surface becomes smaller as the contact hole is deeper. Therefore, it is sufficient that the average inclination of the side surface of the first contact hole 181 is larger than the average inclination of the side surface of the second contact hole 183 so formed as to have a side surface nearly perpendicular to the substrate.

Another Embodiment

Figure 48A:
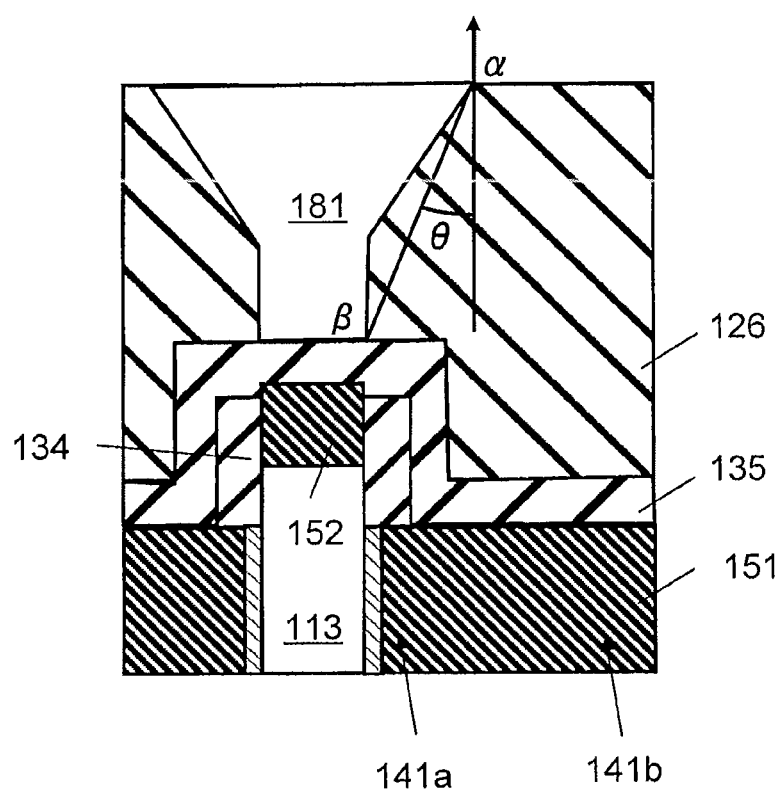
FIG. 48A is a cross-sectional view showing the shape of the upper part of the columnar silicon layer of a semiconductor device according to another embodiment of the present invention.
Figure 48B:
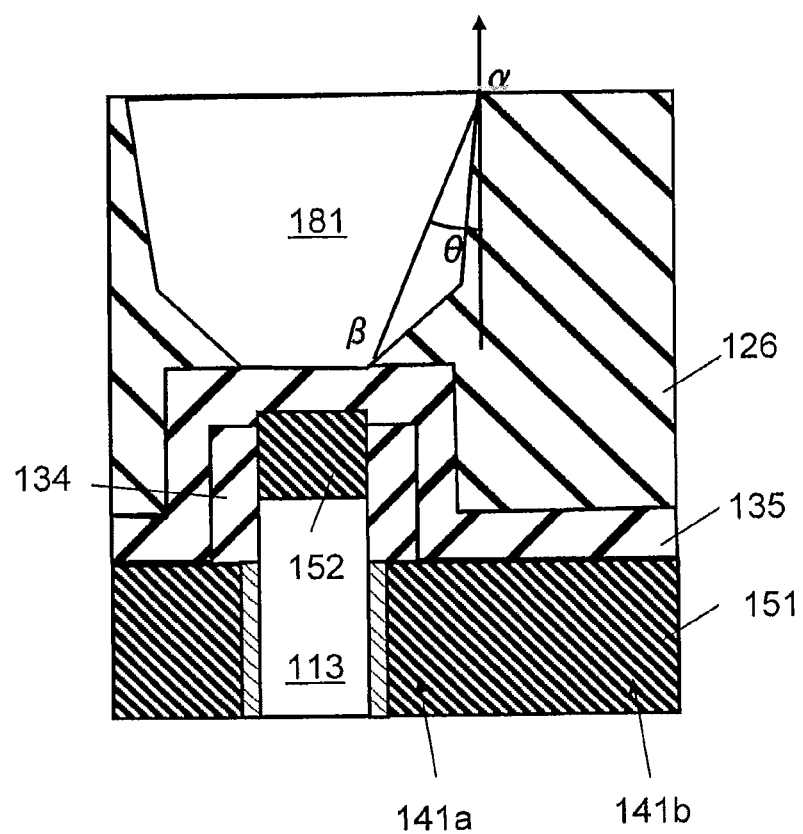
FIG. 48B is a cross-sectional view showing the shape of the upper part of the columnar silicon layer of a semiconductor device according to another embodiment.
Figure 48C:
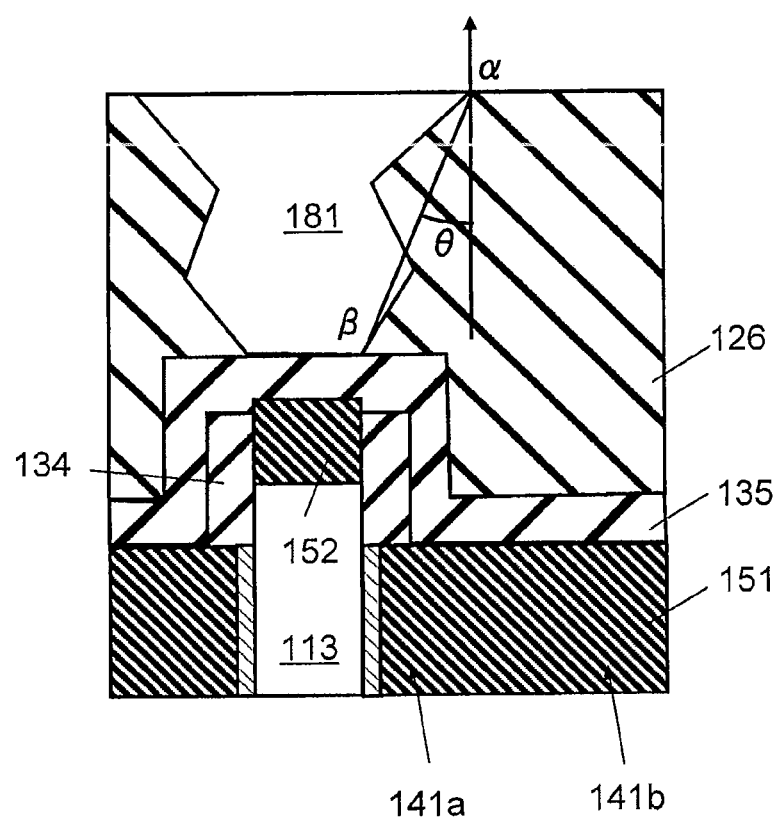
FIG. 48C is a cross-sectional view showing the shape of the upper part of the columnar silicon layer of a semiconductor device according to another embodiment.

FIGS. 48A to 48C illustrate the shape of the first contact hole 181 of a semiconductor device according to another embodiment of the present application. Referring to FIGS. 46A to 47B, an explanation is given for when the side surface of the first contact hole 181 is nearly perpendicular to the substrate 110 and for when the cross-section of the first contact hole 181 has a tapered shape, respectively. In this embodiment, the cross-section of the first contact hole 181 may also have the shape shown in FIGS. 48A to 48C. In these cases, when the angle θ made between the line α-β and the perpendicular line to the substrate 110 in FIGS. 48A, 48B and 48C is defined as the average inclination of the side surface of a contact hole, it is sufficient that the average inclination of the side surface of the first contact hole 181 is larger than the average inclination of the side surface of the second contact hole 183 so formed as to have a sidewall nearly perpendicular to the substrate 110.

Since the first contact hole 181 is shallower than the second contact hole 183 on the planar silicon layer 112, problems such as premature stopping of etching and varied resistance values do not easily occur. Consequently, by adjusting etching conductions, it is relatively easy to form the first contact hole 181 so that the average inclination of the side surface of the first contact hole 181 is larger than the average inclination of the side surface of the second contact hole 183 that is so formed as to have a side surface nearly perpendicular to the substrate 110.

In another modification, the same effect as the above can be obtained by forming the first contact hole 181 on the columnar silicon layer 113 to have a side surface perpendicular to the substrate 110 and have a small bottom surface, instead of forming the first contact hole 181 so that the average inclination of the side surface of the first contact hole 181 is larger than the average inclination of the side surface of the second contact hole 183 that is so formed that the side surface of the second contact hole 183 is nearly perpendicular to the substrate 110. As in the above embodiment, particularly when the bottom surface of the first contact hole 181 on the columnar silicon layer 113 is smaller in size than the circumference of the first insulating film sidewall 134 formed on the upper sidewall of the columnar silicon layer 113, in other words when the projection of the bottom surface of the first contact layer 173 onto the substrate 110 is within the circumference of the projected profile of the first insulating film sidewall 134 on the substrate 110, the bottom surface of the first contact hole 181 is formed in an area where the contact stopper film 135 has a flat top surface, so short circuit between the first contact layer 173 and the gate electrode 141a does not easily occur. Since the first contact hole 181 on the columnar silicon layer 113 is shallower than the second contact hole 183 on the source diffusion layer 200 of the planar silicon layer 112, it is easy to pattern the first contact hole 181 smaller than the other deeper contacts. Here, a smaller contact layer can be patterned by forming a contact interlayer film 126 as thin as possible.

As described above, the first contact layer 173 on the columnar silicon layer 113 is shallower than the second contact layer 174 on the source diffusion layer 200 in the planar silicon layer 112 and therefore it is easy to form the first contact layer 173. Consequently, a stable contact resistance can be obtained even if the first contact layer 173 is small in size. On the other hand, the second contact layer 174 is deeper than the first contact layer 173 on the columnar silicon layer 113. Therefore, the bottom of the second contact layer 174 becomes small when the second contact layer 174 on the source diffusion layer 200 of the planar silicon layer 112 is formed in a tapered shape. Consequently, inconveniences such as the second contact layer 174 having a high resistance and variance in contact resistance becoming large easily occur. For this reason, a second contact hole 183 on the planar silicon layer 112 is preferably formed to have a side surface nearly perpendicular to the substrate 110, and thereby the bottom surface area of the second contact hole 183 is maintained. In addition, a first contact hole 181 on the columnar silicon layer 113 is formed to have a smaller bottom surface than that of the second contact hole 183. According to such a structure, it is possible to prevent short circuits between the first contact layer 173 on the columnar silicon layer 113 and the gate electrode 141a and gate wire 141b and to obtain stable resistance of the second contact layer 174 on the source diffusion layer 200 of the planar silicon layer 112.

When the first insulating film sidewall 134 is composed of an oxide film, not only short circuit between the first contact layer 173 on the columnar silicon layer 113 and the gate electrode 141a but also etching of the sidewall of the columnar silicon layer 113 can be prevented. When the first insulating film sidewall 134 is composed of a nitride film, excess etching may occur in the upper sidewall of the columnar silicon layer 113. On the other hand, when the first insulating film sidewall 134 is composed of an oxide film, excess etching on the upper sidewall of the columnar silicon 113 can be prevented by using conditions yielding a high selectivity ratio between nitride films and oxide films during etching the contact stopper film 135, which is a nitride film.

In the above embodiments, the contact inter layer film 126 is an oxide film and the contact stopper film 135 is a nitride film. It is also possible that the contact interlayer film 126 is another insulating film such as a low-k film. In this case, the contact stopper film 135 may be another insulating film for which a high selectivity ratio is available against the insulating film comprising the contact stopper film 135 such as a low-k film.

In the above embodiment, a planar semiconductor layer 112 is formed on the substrate 110. It is obvious to a person of ordinary skill in the field that it is possible to form a planar semiconductor layer above a substrate via one or more layers formed on the substrate. The planar semiconductor layer, for example, may be formed on an insulating layer arranged on the substrate, such as an SOI substrate which has an insulating film on a substrate.

In the above embodiments, the materials and shape of parts are arbitrary, and the specific detailed structure and the like can be modified as appropriate.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

EXPLANATION OF REFERENCE NUMERALS

110 silicon substrate
112 planar silicon layer
113 columnar silicon layer
120 filler oxide film
121 pad oxide film
123 sacrificial oxide film 124 gate insulating film
125 first oxide film
126 contact interlayer film
130 first nitride film
131a second nitride film
131 third insulating film sidewall
132 third insulating film
133 second insulating film sidewall
134 first insulating film sidewall (oxide film)
135 contact stopper film
135a circumference of projected profile of contact stopper film on substrate
140 first amorphous silicon film
141 second amorphous silicon film (gate insulating film)
141a gate electrode
141b gate wire
150, 160, 301 resist pattern
151-153 metal-silicon compound layer
161 antireflection coating (BARC) layer
170 metal film
171 barrier metal layer
172 third contact layer
173 first contact layer
174 second contact layer
175 barrier metal layer
176 metal layer
177, 178, 179 first layer wire
180 first pattern
181 first contact hole
181a projection of bottom surface of first contact hole onto substrate
182 second pattern
183 second contact hole
184 third contact hole
200 source diffusion layer
201 drain diffusion layer
303 first insulating film
303a, 303b, 306 insulating film
305 fourth oxide film
307 offset spacer
309 body

What is claimed is:

1. A method for producing a semiconductor device comprising:
   a step of preparing a structure provided with a substrate, a planar semiconductor layer formed above the substrate and a columnar semiconductor layer formed on the planar semiconductor layer;
   a step of forming a first source or drain region in a lower part of the columnar semiconductor layer and in the planar semiconductor layer,
   a step of forming a gate insulating film around the columnar semiconductor layer;
   a step of forming a gate electrode on the gate insulating film so as to surround the columnar semiconductor layer;
   a second drain or source region formation step of forming a second drain or source region in an upper part of the columnar semiconductor layer;
   a contact stopper film formation step of forming a contact stopper film on a resultant structure of the second drain or source region formation step;
   a step of forming a contact interlayer film on the contact stopper film so as to embed a resultant structure of the contact stopper film formation step; and
   a contact layer formation step of forming a first contact layer on the second drain or source region,
   wherein the contact layer formation step comprises:
   a pattern formation step of forming a first pattern on the contact interlayer film, the first pattern corresponding to a region where the first contact layer is to be formed;
   a contact hole formation step of etching the contact interlayer film to the contact stopper film using the first pattern so as to form a first contact hole for the first contact layer; and
   a contact stopper film removal step of removing the contact stopper film remaining at a bottom of the first contact hole by etching, and a projection of a bottom surface of the first contact hole onto the substrate is within a circumference of a projected profile of the contact stopper film formed on a top surface and an upper sidewall of the columnar semiconductor layer onto the substrate.

2. The method according to claim 1, wherein the contact layer formation step further comprises a second contact layer formation step of forming a second contact layer on the first source or drain region, the second contact layer formation step comprises:
   a step of forming a second pattern on the contact interlayer film, the second pattern corresponding to a region where the second contact layer is to be formed;
   a step of etching the contact interlayer film to the contact stopper film using the second pattern to form a second contact hole for the second contact layer, and
   a step of removing the contact stopper film remaining at a bottom of the second contact hole by etching, the second contact hole is formed so that a side surface of the second contact hole is nearly perpendicular to the substrate, and the first contact hole is formed so that an average inclination of a side surface of the first contact hole is larger than an average inclination of a side surface of the second contact hole.

3. The method according to claim 1, wherein the contact layer formation step further comprises a second contact layer formation step of forming a second contact layer on the first source or drain region and a third contact layer formation step of forming a third contact layer on a gate wire extending from the gate electrode, the second contact layer formation step comprises:
   a step of forming a second pattern on the contact interlayer film, the second pattern corresponding to a region where the second contact layer is to be formed;
   a step of etching the contact interlayer film to the contact stopper film using the second pattern so as to form a second contact hole for the second contact layer; and
   a step of removing the contact stopper film remaining at a bottom of the second contact hole by etching, the third contact layer formation step comprises: a step of forming a third pattern on the contact interlayer film, the third pattern corresponding to a region where the third contact layer is to be formed; a step of etching the contact interlayer film to the contact stopper film using the third pattern so as to form a third contact hole for the third contact layer; and a step of removing the contact stopper film remaining at a bottom of the third contact hole by etching, the second contact hole is formed so that a side surface of the second contact hole is nearly perpendicular to the substrate, the third contact hole is formed so that a side surface of the third contact hole is nearly perpendicular to the substrate, and the first contact hole is formed so that an average inclination of a side surface of the first contact hole is larger than an average inclination of a side surface of the second contact hole.

4. The method according to claim 1, wherein the contact layer formation step further comprises:

a second contact layer formation step of forming a second contact layer on the first source or drain region; and a third contact layer formation step of forming a third contact layer on a gate wire extending from the gate electrode, the second contact layer formation step comprises:

a step of forming a second pattern on the contact interlayer film, the second pattern corresponding to a region where the second contact layer is to be formed;

a step of etching the contact interlayer film to the contact stopper film using the second pattern so as to form a second contact hole for the second contact layer; and a step of removing the contact stopper film remaining at a bottom of the second contact hole by etching, the third contact layer formation step comprises:

a step of forming a third pattern on the contact interlayer film, the third pattern corresponding to a region where the third contact layer is to be formed;

a step of etching the contact interlayer film to the contact stopper film using the third pattern so as to form a third contact hole for the third contact layer; and a step of removing the contact stopper film remaining at a bottom of the third contact hole by etching, the second contact hole is formed so that a side surface of the second contact hole is nearly perpendicular to the substrate, the first contact hole is formed so that an average inclination of a side surface of the first contact hole is larger than an average inclination of a side surface of the second contact hole, and the third contact hole is formed so that an average inclination of a side surface of the third contact hole is larger than the average inclination of the side surface of the second contact hole.

5. The method according to claim 1, wherein the contact layer formation step further comprises a second contact layer formation step of forming a second contact layer on the first source or drain region, the second contact layer formation step comprises:

a step of applying a second resist on the contact interlayer film and patterning the second resist using lithography to form a second pattern, the second pattern corresponding to a region where the second contact layer is to be formed; and a step of etching the contact interlayer film to the contact stopper film using the second pattern so as to form a second contact hole for the second contact layer, in the contact layer formation step, a third contact layer is further formed on a gate wire extending from the gate electrode, in the pattern formation step, the first patter is formed so as to correspond to the region where the first contact layer is to be formed and a region where the third contact layer is to be formed, by applying a first resist on the contact interlayer film and patterning the first resist using lithography, in the contact hole formation step, the first contact hole and a third contact hole for the third contact layer are formed by etching the contact interlayer film to the contact stopper film using the first pattern, the contact stopper film removal step is performed after the first contact hole, the second contact hole and the third contact hole have been formed, in the contact stopper film removal step, the contact stopper film remaining at bottoms of the first contact hole, the second contact hole and the third contact hole are removed by etching, the second contact hole is formed so that a side surface of the second contact hole is nearly perpendicular to the substrate, the first contact hole is formed so that an average inclination of a side surface of the first contact hole is larger than an average inclination of a side surface of the second contact hole, and the third contact hole is formed so that an average inclination of a side surface of the third contact hole is larger than an average inclination of a side surface of the second contact hole.

6. The method according to claim 1, wherein the contact layer formation step further comprises a second and third contact layers formation step of forming a second contact layer on the first source or drain region and forming a third contact layer on a gate wire extending from the gate electrode, the second and third contact layers formation step comprises:

a step of applying a second resist on the contact interlayer film and patterning the second resist using lithography to form a second pattern, the second pattern corresponding to a region where the second contact layer is to be formed and a region where the third contact layer is to be formed; and a step of etching the contact interlayer film to the contact stopper film using the second pattern so as to form a second contact hole for the second contact layer and a third contact hole for the third contact layer, in the pattern formation step, the first patter is formed so as to correspond to the region where the first contact layer is to be formed by applying a first resist on the contact interlayer film and patterning the first resist using lithography, the contact stopper film removal step is performed after the first contact hole, the second contact hole and the third contact hole have been formed, in the contact stopper film removal step, the contact stopper film remaining at bottoms of the first contact hole, the second contact hole and the third contact hole are removed by etching, the second contact hole is formed so that a side surface of the second contact hole is nearly perpendicular to the substrate, the third contact hole is formed so that a side surface of the third contact hole is nearly perpendicular to the substrate, the first contact hole is formed so that an average inclination of a side surface of the first contact hole is larger than an average inclination of a side surface of the second contact hole, and the first contact hole is formed so that the average inclination of the side surface of the first contact hole is larger than an average inclination of a side surface of the third contact hole.

7. The method according to claim 1, further comprising an oxide film formation step of forming an oxide film in a form of a sidewall on an upper sidewall of the columnar semiconductor layer, wherein in the contact stopper film formation step, the contact stopper film is formed after the oxide film formation step, and the contact stopper film is a silicon nitride film.

* * * * *

UNITED STATES PATENT AND TRADEMARK OFFICE
CERTIFICATE OF CORRECTION

| | | |
|---|---|---|
| PATENT NO. | : 8,563,379 B2 | Page 1 of 1 |
| APPLICATION NO. | : 13/709839 | |
| DATED | : October 22, 2013 | |
| INVENTOR(S) | : Fujio Masuoka et al. | |

It is certified that error appears in the above-identified patent and that said Letters Patent is hereby corrected as shown below:

<u>In the Claims</u>

In column 21, claim 5, line 48, after "step, the first" replace "patter" with --pattern--.

In column 22, claim 6, line 30, after "step, the first" replace "patter" with --pattern--.

Signed and Sealed this
Fourth Day of March, 2014

Michelle K. Lee
*Deputy Director of the United States Patent and Trademark Office*